(12) United States Patent
Yamazaki et al.

(10) Patent No.: US 8,921,858 B2
(45) Date of Patent: Dec. 30, 2014

(54) LIGHT-EMITTING DEVICE

(75) Inventors: Shunpei Yamazaki, Setagaya (JP);
Yukie Suzuki, Atsugi (JP); Hideaki Kuwabara, Isehara (JP); Hidekazu Miyairi, Isehara (JP)

(73) Assignee: Semiconductor Energy Laboratory Co., Ltd., Atusgi-shi, Kanagawa-ken (JP)

( * ) Notice: Subject to any disclaimer, the term of this patent is extended or adjusted under 35 U.S.C. 154(b) by 153 days.

(21) Appl. No.: 12/213,733

(22) Filed: Jun. 24, 2008

(65) Prior Publication Data

US 2009/0001375 A1 Jan. 1, 2009

(30) Foreign Application Priority Data

Jun. 29, 2007 (JP) ................................. 2007-173539
Jul. 13, 2007 (JP) ................................. 2007-185057

(51) Int. Cl.
| | |
|---|---|
| H01L 29/04 | (2006.01) |
| H01L 29/786 | (2006.01) |
| H01L 29/66 | (2006.01) |
| H01L 29/49 | (2006.01) |
| H01L 29/417 | (2006.01) |

(52) U.S. Cl.
CPC .......... *H01L 29/78696* (2013.01); *H01L 29/04* (2013.01); *H01L 29/66765* (2013.01); *H01L 29/4908* (2013.01); *H01L 29/41733* (2013.01)
USPC ............... 257/59; 257/E29.003; 257/E29.004

(58) Field of Classification Search
CPC .............. H01L 29/78696; H01L 29/04; H01L 29/66765; H01L 29/41733
USPC ............. 257/149–166, E29.003, 59, E29.004
See application file for complete search history.

(56) References Cited

U.S. PATENT DOCUMENTS

| | | |
|---|---|---|
| 4,409,134 A | 10/1983 | Yamazaki |
| 4,723,838 A | 2/1988 | Aoki et al. |

(Continued)

FOREIGN PATENT DOCUMENTS

| | | |
|---|---|---|
| EP | 0 473 988 | 3/1992 |
| JP | 60-098680 | 6/1985 |

(Continued)

OTHER PUBLICATIONS

Document titled "JP 2007035964 A machine translation", Published 2007, translated Dec. 2009.*

(Continued)

*Primary Examiner* — Colleen A Matthews
*Assistant Examiner* — Colleen E Snow
(74) *Attorney, Agent, or Firm* — Eric J. Robinson; Robinson Intellectual Property Law Office, P.C.

(57) ABSTRACT

In a light-emitting device having an inverted staggered thin film transistor, the inverted staggered thin film transistor is formed as follows: a gate insulating film is formed over a gate electrode; a microcrystalline semiconductor film which functions as a channel formation region is formed over the gate insulating film; a buffer layer is formed over the microcrystalline semiconductor film; a pair of source and drain regions are formed over the buffer layer; and a pair of source and drain electrodes are formed in contact with the source and drain regions so as to expose a part of the source and drain regions.

27 Claims, 25 Drawing Sheets

(56) References Cited

U.S. PATENT DOCUMENTS

| | | | |
|---|---|---|---|
| 5,084,777 A | 1/1992 | Slobodin et al. | |
| 5,200,846 A | 4/1993 | Hiroki et al. | |
| 5,453,858 A | 9/1995 | Yamazaki | |
| 5,648,662 A | 7/1997 | Zhang et al. | |
| 5,701,167 A | 12/1997 | Yamazaki | |
| 5,766,989 A | 6/1998 | Maegawa et al. | |
| 5,811,328 A | 9/1998 | Zhang et al. | |
| 5,825,050 A | 10/1998 | Hirakawa | |
| 5,849,601 A | 12/1998 | Yamazaki | |
| 5,894,151 A | 4/1999 | Yamazaki et al. | |
| 6,023,075 A | 2/2000 | Yamazaki | |
| 6,124,155 A | 9/2000 | Zhang et al. | |
| 6,166,399 A | 12/2000 | Zhang et al. | |
| 6,252,249 B1 | 6/2001 | Yamazaki | |
| 6,306,213 B1 | 10/2001 | Yamazaki | |
| 6,335,213 B1 | 1/2002 | Zhang et al. | |
| 6,525,341 B1 | 2/2003 | Tsujimura et al. | |
| 6,750,087 B2 | 6/2004 | Morita et al. | |
| 6,756,258 B2 | 6/2004 | Zhang et al. | |
| 6,797,548 B2 | 9/2004 | Zhang et al. | |
| 6,847,064 B2 | 1/2005 | Zhang et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,477,216 B2 | 1/2009 | Koyama et al. | |
| 7,507,991 B2 | 3/2009 | Zhang et al. | |
| 7,595,143 B2 | 9/2009 | Park et al. | |
| 7,738,050 B2 | 6/2010 | Yamazaki et al. | |
| 7,897,971 B2 | 3/2011 | Kurokawa et al. | |
| 7,923,311 B2 | 4/2011 | Zhang et al. | |
| 7,998,800 B2 | 8/2011 | Yamazaki | |
| 8,093,112 B2 | 1/2012 | Miyairi et al. | |
| 8,212,953 B2 | 7/2012 | Hosoya | |
| 2002/0008819 A1 | 1/2002 | Yoshida | |
| 2003/0186478 A1 | 10/2003 | Morita et al. | |
| 2004/0188685 A1 | 9/2004 | Lin et al. | |
| 2005/0012097 A1 | 1/2005 | Yamazaki | |
| 2005/0012732 A1 | 1/2005 | Koyama et al. | |
| 2005/0017243 A1* | 1/2005 | Zhang et al. | 257/59 |
| 2006/0148216 A1* | 7/2006 | Takayama et al. | 438/482 |
| 2007/0004109 A1* | 1/2007 | Ichijo et al. | 438/162 |
| 2007/0018165 A1 | 1/2007 | Yamazaki | |
| 2007/0146566 A1 | 6/2007 | Hosoya | |
| 2008/0044962 A1 | 2/2008 | Zhang et al. | |
| 2008/0099826 A1 | 5/2008 | Lai et al. | |
| 2008/0182368 A1* | 7/2008 | Kunii | 438/158 |
| 2008/0284709 A1 | 11/2008 | Yamazaki | |
| 2008/0299689 A1 | 12/2008 | Yamazaki | |
| 2008/0308807 A1 | 12/2008 | Yamazaki et al. | |
| 2009/0002591 A1 | 1/2009 | Yamazaki et al. | |
| 2009/0008645 A1 | 1/2009 | Yamazaki et al. | |
| 2009/0020759 A1 | 1/2009 | Yamazaki | |
| 2009/0021664 A1 | 1/2009 | Yamazaki | |
| 2009/0023236 A1 | 1/2009 | Miyairi et al. | |
| 2009/0278121 A1* | 11/2009 | Kakkad et al. | 257/43 |
| 2011/0101362 A1 | 5/2011 | Zhang et al. | |
| 2011/0287592 A1 | 11/2011 | Yamazaki | |

FOREIGN PATENT DOCUMENTS

| | | |
|---|---|---|
| JP | 61-087371 | 5/1986 |
| JP | 01-309378 A | 12/1989 |
| JP | 04-242724 | 8/1992 |
| JP | 05-175503 A | 7/1993 |
| JP | 06-045354 | 2/1994 |
| JP | 08-195492 | 7/1996 |
| JP | 11016835 A * | 1/1999 |
| JP | 11-121761 | 4/1999 |
| JP | 11121761 A * | 4/1999 |
| JP | 2001-127296 | 5/2001 |
| JP | 2002-246605 | 8/2002 |
| JP | 2003-297850 A | 10/2003 |
| JP | 2004-304140 A | 10/2004 |
| JP | 2005-037849 A | 2/2005 |
| JP | 2005-049832 | 2/2005 |
| JP | 2005-167051 | 6/2005 |
| JP | 2005167051 A * | 6/2005 |
| JP | 2005-322845 A | 11/2005 |
| JP | 2007-005508 | 1/2007 |
| JP | 2007-035964 | 2/2007 |
| JP | 2007035964 A * | 2/2007 |
| JP | 2007-058216 A | 3/2007 |
| KR | 2005-0109086 A | 11/2005 |
| KR | 2007-0023103 A | 2/2007 |

OTHER PUBLICATIONS

Document titled "JP 11016835 A JPO translation", Published 1999, translated Dec. 2009.*

Document titled "JP 2005167051 A machine translation", Published 2005, translated Dec. 2009.*

Document titled "JP 11121761 A machine translation", Published 1999, translated Dec. 2009.*

Arai et al., "Micro Silicon Technology for Active Matrix OLED Display," SID 07 Digest, 2007, vol. 38, pp. 1370-1373.

Lee et al., "Top-Gate TFTs Using 13.56 MHz PECVD Microcrystalline Silicon," IEEE, 2005, vol. 26, No. 9, pp. 637-639.

Arai et al., "Micro Silicon Technology for Active Matrix OLED Display," SID 07 Digest, 2007, pp. 1370-1373.

Lee et al., "High-Mobility Nanocrystalline Silicon Thin-Film Transistors Fabricated by Plasma-Enhanced Chemical Vapor Deposition," Applied Physics Letters, 2005, vol. 86, pp. 222106-1~222106-3.

Lee et al., "High Mobility N-Channel and P-Channel Nanocrystalline Silicon Thin-Film Transistors," IEEE IEDM, 2005, pp. 937-940.

Lee et al., "Directly Deposited Nanocrystalline Silicon Thin-Film Transistors with Ultra High Mobilities," Applied Physics Letters, 2006, vol. 89, 252101-1-252101-3.

Lee et al., "How to Achieve High Mobility Thin Film Transistors by Direct Deposition of Silicon Using 13.56 MHz RF PECVD?" IEEE IEDM, 2006, pp. 295-298.

Esmaeili-Rad et al., "High Stability, Low Leakage Nanocrystalline Silicon Bottom Gate Thin Film Transistors for AMOLED Displays," IEEE IEDM, 2006, pp. 303-306.

Lee et al., "Leakage Current Mechanisms in Top-Gate Nanocrystalline Silicon Thin-Film Transistors," Applied Physics Letters, 2008, vol. 92, 083509-1-083509-3.

Esmaeili-Rad et al., "Absence of Defect State Creation in Nanocrystalline Silicon Thin-Film Transistors Deduced from Constant Current Stress Measurements," Applied Physics Letters, 2007, vol. 91, 113511-1-113511-3.

Lee et al., "Stability of nc-Si:H TFTs with Silicon Nitride Gate Dielectric," IEEE Transactions on Electron Devices, Jan. 2007, vol. 54, No. 1, pp. 45-51.

Sazonov et al., "Low-Temperature Materials and Thin Film Transistors for Flexible Electronics," Proceedings of the IEEE, Aug. 2005, vol. 93, No. 8 pp. 1420-1428.

Esmaeili-Rad et al., "Stability of Nanocrystalline Silicon Bottom-Gate Thin-Film Transistors with Silicon Nitride Gate Dielectric," American Institute of Physics, 2007, vol. 102, 064512-1-064512-7.

Lee et al., "Top-Gate TFTs Using 13.56 MHz PECVD Microcrystalline Silicon," IEEE, 2005, pp. 637-639.

Lee et al., "Postdeposition Thermal Annealing and Material Stability of 75° C. Hydrogenated Nanocrystalline Silicon Plasma-Enhanced Chemical Vapor Deposition Films," American Institute of Physics, 2005, vol. 98, 034305-1-034305-7.

Lee et al., "Top-Gate TFTs Using 13.56 MHz PECVD Microcrystalline Silicon," IEEE Electron Device Letters, 2005, pp. 637-639.

Taiwanese Office Action (Application No. 97123744; TW10755/10781) Dated Jul. 29, 2013.

Korean Office Action (Application No. 2008-0061671) Dated Feb. 17, 2014.

* cited by examiner

LIGHT-EMITTING DEVICE

BACKGROUND OF THE INVENTION

1. Field of the Invention

The present invention relates to a light-emitting device using a thin film transistor at least in a pixel portion.

2. Description of the Related Art

In recent years, techniques to form thin film transistors using a semiconductor thin film (with a thickness of approximately several tens to several hundreds of nanometers) which is formed over a substrate having an insulating surface have attracted attention. Thin film transistors are widely used in electronic devices such as ICs and electro-optical devices, and their development especially as switching elements for image display devices has been accelerated.

As a switching element of an image display device, a thin film transistor using an amorphous semiconductor film, a thin film transistor using a polycrystalline semiconductor film, or the like is used. As a method of forming a polycrystalline semiconductor film, there is known a technique in which a pulsed excimer laser beam is shaped into a linear laser beam by an optical system and an amorphous silicon film is crystallized by being irradiated while being scanned with the linear laser beam.

As a switching element of an image display device, a thin film transistor using a microcrystalline semiconductor film is also used (see References 1 and 2).

A known conventional method for manufacturing a thin film transistor is that in which an amorphous silicon film is formed over a gate insulating film; a metal film is formed thereover; and the metal film is irradiated with a diode laser beam to modify the amorphous silicon film into a microcrystalline silicon film. (see Reference 3) According to this method, the metal film formed over the amorphous silicon film is provided to convert optical energy of the diode laser beam into thermal energy and should be removed in a later step to complete a thin film transistor. That is, the method is that in which the amorphous silicon film is heated only by conduction heating from the metal film, thereby forming a microcrystalline silicon film.

[Reference 1] Japanese Published Patent Application No. H4-242724

[Reference 2] Japanese Published Patent Application No. 2005-49832

[Reference 3] Toshiaki Arai et al., SID 07 DIGEST, 2007, pp. 1370-1373

SUMMARY OF THE INVENTION

A thin film transistor using a polycrystalline semiconductor film has advantages in that its field-effect mobility is two or more orders of magnitude greater than that of a thin film transistor using an amorphous semiconductor film and a pixel portion of a display device and peripheral driver circuits thereof can be formed over the same substrate. However, the process for crystallization of an amorphous semiconductor film provided over a glass substrate is more complex than that in the case of using an amorphous semiconductor film; accordingly, there are problems in that yield is decreased and cost is increased.

There is also a problem in that a surface of a microcrystalline semiconductor film where crystal grains are exposed is likely to be oxidized. Therefore, when crystal grains in a channel formation region are oxidized, an oxide film is formed on the surfaces of the crystal grains and the oxide film becomes an obstacle to carrier transfer, which causes a problem in that electric characteristics of a thin film transistor are impaired.

In view of the above-mentioned problems, it is an object of the present invention to propose a method for manufacturing, with high mass productivity, light-emitting devices having thin film transistors with highly reliable electric characteristics.

In a light-emitting device having an inverted staggered thin film transistor, the inverted staggered thin film transistor is formed as follows: a gate insulating film is formed over a gate electrode; a microcrystalline semiconductor film (also referred to as a semi-amorphous semiconductor film) which functions as a channel formation region is formed over the gate insulating film; a buffer layer is formed over the microcrystalline semiconductor film; a pair of source and drain regions are formed over the buffer layer; and a pair of source and drain electrodes are formed in contact with the source and drain regions so as to expose parts of the source and drain regions. Thus, an upper surface of the source and drain regions include regions that are in contact with the source and drain electrodes and regions that are not in contact with the source and drain electrodes. In a region where the source and drain electrodes face each other, parts of the source and drain regions and a part of the buffer layer are exposed. Outside of edge portions of the source and drain electrodes, edge portions of the source and drain regions are formed. That is, the source and drain regions extend beyond edges of the source and drain electrodes. In addition, a distance between edges of the source and drain regions facing each other is shorter than a distance between the edges of the source and drain electrodes facing each other.

Due to misalignment of the edge portions of the source and drain electrodes with the edge portions of the source and drain regions, and due to formation of the edge portions of the source and drain regions outside of the edge portions of the source and drain electrodes, the edge portions of the source and drain electrodes are apart from each other; accordingly, leakage current and short circuit between the source and drain electrodes can be prevented. In addition, an electric field can be prevented from being concentrated on the edge portions of the source and drain electrodes and the source and drain regions, and leakage current between the gate electrode and the source and drain electrodes can be prevented.

The buffer layer has a depression in its part, and the side of the depression is aligned with the edge portions of the source and drain regions. Because the buffer layer has a depression in its part and a path on the surface of the buffer layer, along which leakage current flows, is lengthened, leakage current between the source and drain regions can be reduced.

Between the microcrystalline semiconductor film and the source and drain regions, the buffer layer is formed. The microcrystalline semiconductor film functions as a channel formation region. The buffer layer functions as a high-resistance region as well as preventing the microcrystalline semiconductor film from being oxidized. Because the buffer layer is formed between the microcrystalline semiconductor film and the source and drain regions, field-effect mobility of a transistor is high, leakage current is low, and drain withstand voltage is high.

The buffer layer can be formed by a plasma CVD method, a sputtering method, or the like. As the buffer layer, an amorphous semiconductor film can be used, and moreover, it is preferable that the buffer layer be an amorphous semiconductor film containing at least any one of nitrogen, hydrogen, and halogen. When an amorphous semiconductor film is made to contain any one of nitrogen, hydrogen, and halogen, crystal grains contained in the microcrystalline semiconductor film can be further prevented from being oxidized.

For example, the film can be made to contain any one of nitrogen, hydrogen, and halogen by formation of an amorphous semiconductor film and then by nitridation, hydrogenation, or halogenation of the surface of the amorphous semiconductor film through processing of the surface of the amorphous semiconductor film with nitrogen plasma, hydrogen plasma, or halogen plasma.

By provision of the buffer layer in contact with the surface of the microcrystalline semiconductor film, oxidation of crystal grains contained in the microcrystalline semiconductor film can be reduced. Accordingly, the degree of degradation of electric characteristics of a thin film transistor can be lowered.

Unlike a polycrystalline semiconductor film, a microcrystalline semiconductor film can be directly formed over a glass substrate as a microcrystalline semiconductor film. Specifically, a microcrystalline semiconductor film can be formed using silicon hydride as a source gas and using a plasma CVD apparatus. The microcrystalline semiconductor film manufactured by the above method includes a microcrystalline semiconductor film which contains crystal grains of 0.5 nm to 20 nm in an amorphous semiconductor. Thus, unlike in the case of using a polycrystalline semiconductor film, there is no need to provide a crystallization process where heat treatment is performed for a long period of time after formation of a semiconductor film. The number of steps in manufacture of a thin film transistor can be reduced; yield of a light-emitting device can be increased; and cost can be lowered. In this specification, a film obtained by formation is referred to as a semi-amorphous semiconductor film, and a film obtained by crystal growth, after the formation, through irradiation with a laser beam having such an energy density that does not cause melting is referred to as a semi-crystalline semiconductor film. Plasma using a microwave with a frequency of 1 GHz or more has high electron density, which facilitates dissociation of silicon hydride that is a source gas. Therefore, by a microwave plasma CVD method with a frequency of 1 GHz or more, compared to a microwave plasma CVD method with a frequency of several tens to several hundreds of megahertz, the microcrystalline semiconductor film can be formed more easily and film formation rate can be increased. Thus, the mass productivity of light-emitting devices can be increased.

In addition, thin film transistors (TFTs) are formed using a microcrystalline semiconductor film, and a light-emitting device is manufactured using the thin film transistors in a pixel portion and also in driver circuits. Because thin film transistors using a microcrystalline semiconductor film each have a field-effect mobility of 1 $cm^2/V \cdot sec$ to 20 $cm^2/V \cdot sec$, which is 2 to 20 times greater than that of a thin film transistor using an amorphous semiconductor film, some of or all of the driver circuits can be formed over the same substrate as the pixel portion to form a system-on-panel display.

A light-emitting device includes a light-emitting element. A light-emitting element includes, in its scope, an element whose luminance is controlled by a current or a voltage, and specifically includes an inorganic electroluminescent (EL) element, an organic EL element, and the like.

In addition, a light-emitting device includes a panel in a state where a display element is sealed and a module in a state where the panel is mounted with an IC including a controller, and the like. Furthermore, the present invention relates to an element substrate corresponding to one mode before a display element is completed in the process of manufacturing the light-emitting device. An element substrate may be specifically in a state where only a pixel electrode of a display element is formed or in a state after a conductive film to be a pixel electrode is formed and before the conductive film is etched into a pixel electrode, and any mode is possible.

Note that light-emitting devices in this specification refer to image display devices, light-emitting devices, and light sources (including lighting devices). In addition, light-emitting devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on a display element by a chip-on-glass (COG) method.

According to the present invention, it is possible to manufacture, with high mass productivity, light-emitting devices having thin film transistors with highly reliable electric characteristics.

DETAILED DESCRIPTION OF THE INVENTION

Embodiment modes and embodiments of the present invention will be hereinafter described with reference to the drawings. However, the present invention can be carried out in many different modes, and it is easily understood by those skilled in the art that the mode and detail of the present invention can be modified in various ways without departing from the spirit and scope thereof. Therefore, the present invention should not be interpreted as being limited to the description in the following embodiment modes and embodiments.

Embodiment Mode 1

In this embodiment mode, manufacturing processes of thin film transistors used for a light-emitting device are described with reference to FIGS. 1A to 8D. FIGS. 1A to 3 and FIGS. 5A to 7 are cross-sectional views showing manufacturing processes of thin film transistors, and FIGS. 4A to 4C and FIGS. 8A to 8D are top views each showing a connection region of a thin film transistor and a pixel electrode in a single pixel.

A thin film transistor having a microcrystalline semiconductor film, which is of an n type, is more suitable for use in a driver circuit than that of a p type because it has a higher field-effect mobility. It is desired that all thin film transistors formed over the same substrate have the same polarity, in order to reduce the number of steps. Here, description is made using an n-channel thin film transistor.

Figure 1A:
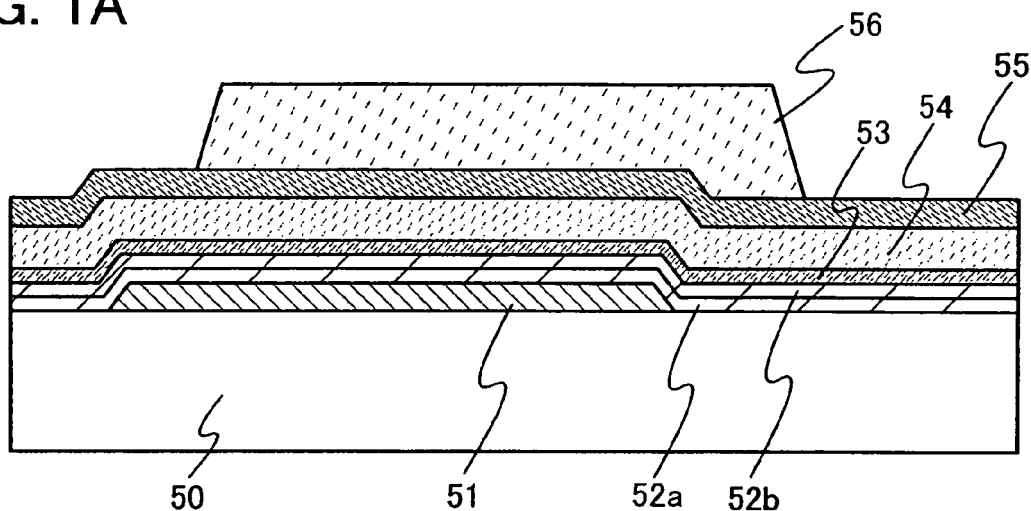
FIGS. 1A to 1C are cross-sectional views showing a method for manufacturing a light-emitting device of the present invention.

As shown in FIG. 1A, a gate electrode 51 is formed over a substrate 50. As the substrate 50, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, metal substrates of a stainless alloy and the like with the surface provided with an insulating film may be employed. When the substrate 50 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode 51 is formed using a metal material such as titanium, molybdenum, chromium, tantalum, tungsten, or aluminum or an alloy material thereof. The gate electrode 51 can be formed in such a manner that a conductive film is formed over the substrate 50 by a sputtering method or a vacuum evaporation method; a mask is formed over the conductive film by a photolithography technique or an inkjet method; and the conductive film is etched using the mask. Alternatively, the gate electrode 51 can be formed by discharge of a conductive nanopaste of silver, gold, copper, or the like by an inkjet method and by baking the conductive nanopaste. Note that, as barrier metal which increases adhesion of the gate electrode 51 and prevents diffusion to a base, a nitride film of the above-mentioned metal material may be provided between the substrate 50 and the gate electrode 51. Here, the gate electrode is formed by etching of the conductive film formed over the substrate 50 with the use of a resist mask formed using a photomask.

Note that, because a semiconductor film and a wiring are to be formed over the gate electrode 51, it is desired that the gate electrode 51 be processed so that its edge portions are tapered in order to prevent disconnection. In addition, although not shown, in this step, a wiring connected to the gate electrode can also be formed at the same time.

Next, over the gate electrode 51, gate insulating films 52a and 52b, a microcrystalline semiconductor film 53, a buffer layer 54, and a semiconductor film 55 to which an impurity imparting one conductivity type is added are formed in this order. Then, a mask 56 is formed over the semiconductor film 55 to which an impurity imparting one conductivity type is added. Note that it is preferable that at least the gate insulating films 52a and 52b, the microcrystalline semiconductor film 53, and the buffer layer 54 be formed successively. It is further preferable that the gate insulating films 52a and 52b, the microcrystalline semiconductor film 53, the buffer layer 54, and the semiconductor film 55 to which an impurity imparting one conductivity type is added be formed successively. By successive formation of at least the gate insulating films 52a and 52b, the microcrystalline semiconductor film 53, and the buffer layer 54 without any exposure to the atmosphere, each interface between stacked layers can be formed without being contaminated by an atmospheric constituent or a contaminant impurity element floating in the atmosphere. Thus, variations in characteristics of thin film transistors can be reduced.

The gate insulating films 52a and 52b can each be formed by a CVD method, a sputtering method, or the like using a silicon oxide film, a silicon nitride film, a silicon oxynitride film, or a silicon nitride oxide film. Here, a mode is described in which a silicon oxide film or a silicon oxynitride film, and a silicon nitride film or a silicon nitride oxide film are stacked in this order as the gate insulating films 52a and 52b. Note that the gate insulating film can be formed by stacking not two layers but three layers of a silicon nitride film or a silicon nitride oxide film, a silicon oxide film or a silicon oxynitride film, and a silicon nitride film or a silicon nitride oxide film in this order from the substrate side. Alternatively, the gate insulating film can be formed of a single layer of a silicon oxide film, a silicon nitride film, a silicon oxynitride film, or a silicon nitride oxide film. Furthermore, it is preferable that the gate insulating film be formed using a microwave plasma CVD apparatus with a frequency of 1 GHz or more. A silicon oxynitride film or a silicon nitride oxide film, which is formed using a microwave plasma CVD apparatus, has high withstand voltage and can increase reliability of a thin film transistor to be formed later.

Here, a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The microcrystalline semiconductor film 53 is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and its grains with a size of 0.5 nm to 20 nm can be dispersed in a non-single-crystal semiconductor. Microcrystalline silicon, which is a typical example of a microcrystalline semiconductor, has a Raman spectrum which is shifted to a lower wave number side than 520.6 cm$^{-1}$ which represents single-crystal silicon. That is, the peak of a Raman spectrum of microcrystalline silicon is within the range from 481 cm$^{-1}$, which represents single-crystal silicon, to 520.6 cm$^{-1}$, which represents amorphous silicon. In addition, microcrystalline silicon is made to contain hydrogen or halogen of at least 1 at. % or more for termination of dangling bonds. Moreover, microcrystalline silicon is made to contain a rare gas element such as helium, argon, krypton, or neon to further enhance lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using a dilution of silicon hydride such as $SiH_4$ or $Si_2H_6$ with hydrogen. With a dilution with one or plural kinds of rare gas elements selected from helium, argon, krypton, and neon in addition to silicon hydride and hydrogen, the microcrystalline semiconductor film can be formed. In that case, the flow rate ratio of hydrogen to silicon hydride is set to be 5:1 to 200:1, preferably, 50:1 to 150:1, more preferably, 100:1. Note that, in place of silicon hydride, $SiH_2Cl_2$, $SiHCl_3$, $SiCl_4$, $SiF_4$, or the like can be used.

A microcrystalline semiconductor film exhibits weak n-type conductivity when an impurity element for valence control is not intentionally added. Thus, threshold control of a microcrystalline semiconductor film which functions as a channel formation region of a thin film transistor can be achieved by addition of an impurity element which imparts p-type conductivity at the same time as or after the film formation. A typical example of an impurity element which imparts p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron may be set to be, for example, $1\times10^{14}$ atoms/cm$^3$ to $6\times10^{16}$ atoms/cm$^3$.

In addition, the oxygen concentration of the microcrystalline semiconductor film is preferably $1\times10^{19}$ cm$^{-3}$ or less, more preferably, $5\times10^{18}$ cm$^{-3}$ or less and each of the nitrogen concentration and the carbon concentration is preferably $5\times10^{18}$ cm$^{-3}$ or less, more preferably, $1\times10^{18}$ cm$^{-3}$ or less. By decreases in concentrations of oxygen, nitrogen, and carbon to be mixed into the microcrystalline semiconductor film, the microcrystalline semiconductor film can be prevented from being changed into an n type.

The microcrystalline semiconductor film 53 is formed to a thickness of greater than 0 nm and less than or equal to 200 nm, preferably, 1 nm to 100 nm, more preferably, 5 nm to 50 nm. The microcrystalline semiconductor film 53 functions as a channel formation region of a thin film transistor to be formed later. When the thickness of the microcrystalline semiconductor film 53 is within the range from 5 nm to 50 nm, a thin film transistor to be formed later is to be a fully depleted type. In addition, because the formation rate of the microcrystalline semiconductor film 53 is low, i.e., a tenth to a thousandth of the formation rate of an amorphous semiconductor film, a decrease of thickness leads to an increase of throughput. Furthermore, because the microcrystalline semiconductor film contains microcrystals, it has a lower resistance than an amorphous semiconductor film. Therefore, a thin film transistor using the microcrystalline semiconductor film has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold voltage of a thin film transistor can be suppressed. Therefore, a light-emitting device with less variation of electrical characteristics can be manufactured.

The microcrystalline semiconductor film has a higher field-effect mobility than an amorphous semiconductor film. Thus, with the use of a thin film transistor, a channel formation region of which is formed of the microcrystalline semiconductor film, for switching of a display element, the area of the channel formation region, that is, the area of the thin film transistor can be decreased. Accordingly, the area occupied by the thin film transistor in a single pixel is decreased, and an aperture ratio of the pixel can be increased in the case of a bottom emission light-emitting device where light is extracted from a substrate side. As a result of this, a light-emitting device with high resolution can be manufactured.

The buffer layer 54 can be formed by a plasma CVD method using silicon hydride such as $SiH_4$ or $Si_2H_6$. Alternatively, with a dilution of silicon hydride mentioned above with one or plural kinds of rare gas elements selected from helium, argon, krypton, and neon, an amorphous semiconductor film can be formed. With the use of hydrogen at a flow rate which is 1 to 20 times, preferably, 1 to 10 times, more preferably, 1 to 5 times higher than that of silicon hydride, a hydrogen-containing amorphous semiconductor film can be formed. With the use of silicon hydride mentioned above and nitrogen or ammonia, a nitrogen-containing amorphous semiconductor film can be formed. With the use of silicon hydride mentioned above and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed. Note that, in place of silicon hydride, $SiH_2Cl_2$, $SiHCl_3$, $SiCl_4$, $SiF_4$, or the like can be used.

Alternatively, as the buffer layer 54, an amorphous semiconductor film can be formed by sputtering with hydrogen or a rare gas using an amorphous semiconductor as a target. In this case, by inclusion of ammonia, nitrogen, or $N_2O$ in an atmosphere, a nitrogen-containing amorphous semiconductor film can be formed. Alternatively, by inclusion of a gas including fluorine, chlorine, bromine, or iodine ($F_2$, $Cl_2$, $Br_2$, $I_2$, HF, HCl, HBr, HI, or the like) in an atmosphere, an amorphous semiconductor film containing fluorine, chlorine, bromine, or iodine can be formed.

Still alternatively, the buffer layer 54 may be formed by formation of an amorphous semiconductor film on the surface of the microcrystalline semiconductor film 53 by a plasma CVD method or a sputtering method and then by hydrogenation, nitridation, or halogenation of the surface of the amorphous semiconductor film through processing of the surface of the amorphous semiconductor film with hydrogen plasma, nitrogen plasma, or halogen plasma. Yet alternatively, the surface of the amorphous semiconductor film may be processed with helium plasma, neon plasma, argon plasma, krypton plasma, or the like.

The buffer layer 54 is preferably formed using an amorphous semiconductor film which does not contain crystal grains. Therefore, when the buffer layer 54 is formed by a microwave plasma CVD method or a high-frequency plasma method with a frequency of several tens to several hundreds of megahertz, formation conditions are preferably controlled so that an amorphous semiconductor film does not contain crystal grains.

In some cases, the buffer layer 54 is partly etched in a later step of formation of source and drain regions. The buffer layer 54 is preferably formed at a thickness such that a part of the buffer layer 54 is left remaining after the etching. It is preferable that the thickness of a remaining portion after etching be typically 10 nm to 100 nm. In the case of adding an impurity imparting one conductivity type, which is used for control of threshold voltage of the microcrystalline semiconductor film, by provision of the buffer layer, an impurity imparting one conductivity type, which is contained in the source and drain regions, and the impurity imparting one conductivity type, which is used for control of threshold voltage of the microcrystalline semiconductor film, can be prevented from being mixed with each other.

Note that it is preferable that an impurity imparting one conductivity type such as phosphorus or boron be not added to the buffer layer 54. In particular, it is preferable that boron contained in the microcrystalline semiconductor film for threshold control or phosphorus contained in the semiconductor film to which an impurity imparting one conductivity type is added be not mixed into the buffer layer 54. As a result of this, by elimination of a region where leakage current is generated due to a PN junction, leakage current can be decreased. By formation of an amorphous semiconductor film, to which an impurity imparting one conductivity type such as phosphorus or boron is not added, between the semiconductor film to which an impurity imparting one conductivity type is added and the microcrystalline semiconductor film, the diffusion of the impurity contained in each of the microcrystalline semiconductor film and source and drain regions can be prevented.

By formation of an amorphous semiconductor film, moreover, an amorphous semiconductor film containing hydrogen, nitrogen, or halogen on the surface of the microcrystalline semiconductor film 53, surfaces of crystal grains contained in the microcrystalline semiconductor film 53 can be prevented from being oxidized naturally. In particular, in a region where an amorphous semiconductor is in contact with microcrystal grains, a crack is likely to be caused due to distortion of crystal lattice. When this crack is exposed to oxygen, the crystal grains are oxidized, whereby silicon oxide is formed. However, by formation of the buffer layer on the surface of the microcrystalline semiconductor film 53, the microcrystal grains can be prevented from being oxidized. Furthermore, by formation of the buffer layer, the microcrystalline semiconductor film can be prevented from being mixed with an etching residue which is generated in forming source and drain regions later.

The buffer layer 54 is formed using an amorphous semiconductor film or an amorphous semiconductor film containing hydrogen, nitrogen, or halogen. An amorphous semiconductor film has a larger energy gap than the microcrystalline semiconductor film (the energy gap of the amorphous semiconductor film is 1.1 eV to 1.5 eV and the energy gap of the microcrystalline semiconductor film is 1.6 eV to 1.8 eV) and has a higher resistance, and has a lower field-effect mobility, i.e., a fifth to a tenth of that of the microcrystalline semiconductor film. Therefore, in a thin film transistor to be formed later, the buffer layer formed between source and drain regions and the microcrystalline semiconductor film functions as a high-resistance region and the microcrystalline semiconductor film functions as a channel formation region. Accordingly, the off current of the thin film transistor can be reduced. When the thin film transistor is used as a switching element of a light-emitting device, the contrast of the light-emitting device can be improved.

In the case where an n-channel thin film transistor is to be formed, to the semiconductor film 55 to which an impurity imparting one conductivity type is added, phosphorus may be added as a typical impurity element, and an impurity gas such as $PH_3$ may be added to silicon hydride. For example, the semiconductor film 55 to which an impurity imparting one conductivity type is added may be formed using a phosphorus-containing amorphous silicon film (also referred to as an a-Si(n$^+$)). In the case where a p-channel thin film transistor is to be formed, boron may be added as a typical impurity element, and an impurity gas such as $B_2H_6$ may be added to silicon hydride. The semiconductor film 55 to which an impurity imparting one conductivity type is added can be formed of a microcrystalline semiconductor or an amorphous semiconductor. The semiconductor film 55 to which an impurity imparting one conductivity type is added is formed to a thickness of 2 nm to 50 nm. By formation of the semiconductor film to which an impurity imparting one conductivity type is added to a small thickness, throughput can be improved.

Figure 9:
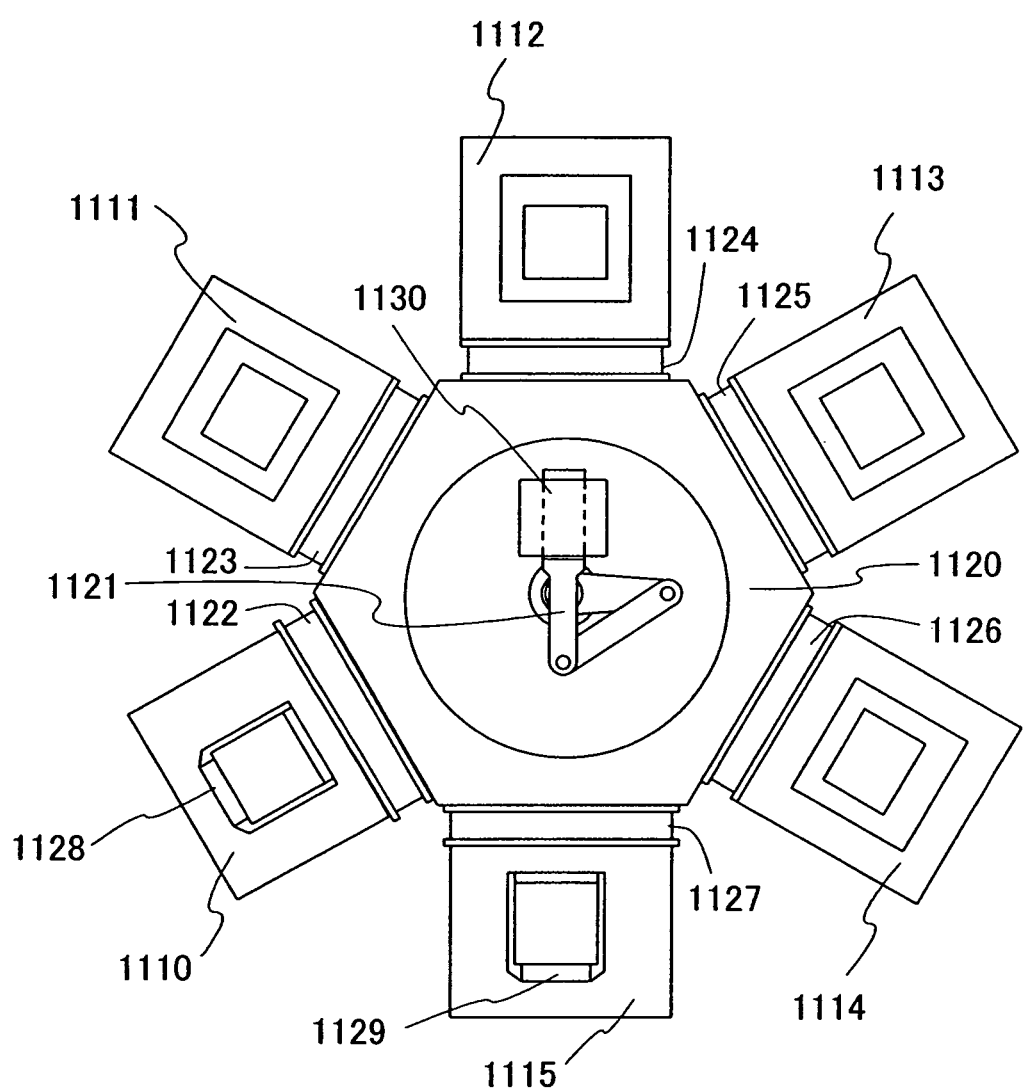
FIG. 9 is an upper cross-sectional view showing a microwave plasma CVD apparatus of the present invention.

Here, a microwave plasma CVD apparatus, with which the gate insulating films 52a and 52b to the semiconductor film 55 to which an impurity imparting one conductivity type is added can be formed successively, is described with reference to FIG. 9. FIG. 9 is a schematic diagram showing an upper cross-sectional view of a microwave plasma CVD apparatus, which has a structure where a loading chamber 1110, an unloading chamber 1115, and reaction chambers (1) 1111 to (4) 1114 are provided around a common chamber 1120. Between the common chamber 1200 and the other chambers, gate valves 1122 to 1127 are provided so that processes performed in the chambers do not interface with each other. Substrates are loaded into a cassette 1128 in the loading chamber 1110 and a cassette 1129 in the unloading chamber 1115 and carried to the reaction chambers (1) 1111 to (4) 1114 with a transport means 1121 of the common chamber 1120. In this apparatus, each reaction chamber can be allocated for different kinds of deposition films, and a plurality of different films can be formed successively without any exposure to the atmosphere.

In each of the reaction chambers (1) to (4), the gate insulating films 52a and 52b, the microcrystalline semiconductor film 53, the buffer layer 54, and the semiconductor film 55 to which an impurity imparting one conductivity type is added are stacked. In this case, a plurality of films of different kinds can be stacked successively by change of source gases. In this case, after the gate insulating films are formed, silicon hydride such as silane is introduced into the reaction chamber, residual oxygen and silicon hydride are reacted with each other, and the reactant is exhausted from the reaction chamber, whereby the concentration of residual oxygen in the reaction chamber can be decreased. Accordingly, the concentration of oxygen to be contained in the microcrystalline semiconductor film can be decreased. In addition, crystal grains contained in the microcrystalline semiconductor film can be prevented from being oxidized.

Alternatively, the gate insulating films 52a and 52b, the microcrystalline semiconductor film 53, and the buffer layer 54 are formed in each of the reaction chambers (1) and (3), and the semiconductor film 55 to which an impurity imparting one conductivity type is added is formed in each of the reaction chambers (2) and (4). By separate formation of a film with an impurity imparting one conductivity type alone, the impurity imparting one conductivity type which remains in the chamber can be prevented from being mixed into another film.

In this manner, with a microwave plasma CVD apparatus where a plurality of chambers is connected, the gate insulating films 52a and 52b, the microcrystalline semiconductor film 53, the buffer layer 54, and the semiconductor film 55 to which an impurity imparting one conductivity type is added can be formed at the same time. Thus, mass productivity can be improved. In addition, even when maintenance or cleaning is performed in one of reaction chambers, film formation processes can be performed in the other reaction chambers, whereby cycle time for film formation can be shortened. Furthermore, each interface between stacked layers can be formed without being contaminated by an atmospheric constituent or a contaminant impurity element floating in the atmosphere. Thus, variations in characteristics of thin film transistors can be reduced.

Alternatively, it is possible that the gate insulating films 52a and 52b are formed in the reaction chamber (1), the microcrystalline semiconductor film 53 and the buffer layer 54 are formed in the reaction chamber (2), and the semiconductor film 55 to which an impurity imparting one conductivity type is added is formed in the reaction chamber (3). Still alternatively, in the case where the gate insulating film 52a is to be formed of a silicon oxide film or a silicon oxynitride film and the gate insulating film 52b is to be formed of a silicon nitride film or a silicon nitride oxide film, five reaction chambers may be provided. A silicon oxide film or a silicon oxynitride film may be formed as the gate insulating film 52a in a reaction chamber (1); a silicon nitride film or a silicon nitride oxide film may be formed as the gate insulating film 52b in a reaction chamber (2); a microcrystalline semiconductor film may be formed in a reaction chamber (3); a buffer layer may be formed in a reaction chamber (4); and a semiconductor film to which an impurity imparting one conductivity type is added may be formed in a reaction chamber (5). The film formation rate of a microcrystalline semiconductor film is low; thus, microcrystalline semiconductor films may be formed in a plurality of reaction chambers. For example, the gate insulating films 52a and 52b may be formed in a reaction chamber (1); the microcrystalline semiconductor films 53 may be formed in reaction chambers (2) and (3); the buffer layer 54 may be formed in a reaction chamber (4); and the semiconductor film 55 to which an impurity imparting one conductivity type is added may be formed in a reaction chamber (5). In this manner, by formation of the microcrystalline semiconductor films 53 in a plurality of reaction chambers at the same time, throughput can be improved. In this case, it is preferable that the inner wall of each reaction chamber be coated with a film of the same kind as a film to be formed therein.

With the use of a microwave plasma CVD apparatus having such a structure as described above, films of similar kinds or a film of one kind can be formed in each reaction chamber and can be formed successively without any exposure to the atmosphere. Therefore, each interface between stacked layers can be formed without being contaminated by a residue of the previously formed film or an impurity element floating in the atmosphere.

Note that the microwave plasma CVD apparatus shown in FIG. 9 is provided with the loading chamber and the unloading chamber separately, which may be a single loading/unloading chamber. In addition, the microwave plasma CVD apparatus may be provided with a spare chamber. By preheating of a substrate in the spare chamber, heating time needed before film formation in each reaction chamber can be shortened; thus, throughput can be improved.

Film formation processes are described below. In each film formation process, a gas to be supplied from a gas supply portion may be selected depending on the purpose.

Here, a method is given as an example, in which a silicon oxynitride film is formed as the gate insulating film 52a and a silicon nitride oxide film is formed as the gate insulating film 52b.

First, inside of a processing container in a reaction chamber of the microwave plasma CVD apparatus is cleaned with fluorine radicals. Note that the inside of the reaction chamber can be cleaned by introduction of fluorine radicals into the reaction chamber, which are generated by introduction of carbon fluoride, nitrogen fluoride, or fluorine into a plasma generator provided outside of the reaction chamber and by dissociation thereof.

After cleaning with fluorine radicals, a large amount of hydrogen is introduced into the reaction chamber, whereby residual fluorine inside the reaction chamber can be reacted with hydrogen, so that the concentration of residual fluorine can be decreased. Accordingly, the amount of fluorine to be mixed into a protective film that is to be formed later on the inner wall of the reaction chamber can be decreased, and the thickness of the protective film can be decreased.

Next, on the surface of the inner wall of the processing container in the reaction chamber, or the like, an oxynitride film is deposited as the protection film. Here, the pressure in the processing container is set to be 1 Pa to 200 Pa, preferably, 1 Pa to 100 Pa, and one or more kinds of rare gases such as helium, argon, xenon, and krypton is introduced as a plasma ignition gas. Furthermore, hydrogen and any one kind of rare gases are introduced. In particular, it is preferable that helium, moreover, helium and hydrogen be used as a plasma ignition gas.

Although helium has a high ionization energy of 24.5 eV, it has a metastable state at about 20 eV. Therefore, helium can be ionized at about 4 eV during discharge. Thus, discharge starting voltage is low and discharge can be maintained easily. Accordingly, plasma can be maintained uniformly, and power saving can be achieved.

Alternatively, as the plasma ignition gas, an oxygen gas and one or more kinds of rare gases such as helium, argon, xenon, and krypton may be introduced. By introduction of an oxygen gas as well as a rare gas into the processing container, plasma ignition can be facilitated.

Next, a microwave generating apparatus is turned on and the output of the microwave generating apparatus is set to be 500 W to 6000 W, preferably, 4000 W to 6000 W to generate plasma. Then, a source gas is introduced into the processing container through a gas pipe. Specifically, by introduction of dinitrogen monoxide, a rare gas, and silane as a source gas, a silicon oxynitride film is formed as the protective film on the inner wall of the processing container and on the surface of the gas pipe, a dielectric plate, and a support base. The flow rate of silicon hydride at this time is set to be 50 sccm to 300 sccm and that of dinitrogen monoxide is set to be 500 sccm to 6000 sccm, and the thickness of the protective film is set to be 500 nm to 2000 nm.

Then, the supply of the source gas is stopped, the pressure in the processing container is decreased, and the microwave generating apparatus is turned off. After that, a substrate is introduced onto the supporting base in the processing container.

Next, through a similar process to that of the protective film, a silicon oxynitride film is deposited over the substrate as the gate insulating film 52a.

After the silicon oxynitride film is deposited to a predetermined thickness, the supply of the source gas is stopped, the pressure in the processing container is decreased, and the microwave generating apparatus is turned off.

Next, the pressure in the processing container is set to be 1 Pa to 200 Pa, preferably, 1 Pa to 100 Pa, and one or more kinds of rare gases such as helium, argon, xenon, and krypton which is a plasma ignition gas and silane, dinitrogen monoxide, and ammonia which are a source gas are introduced. Note that, as the source gas, nitrogen may be introduced instead of ammonia. Then, the microwave generating apparatus is turned on, and the output of the microwave generating apparatus is set to be 500 W to 6000 W, preferably, 4000 W to 6000 W to generate plasma. Next, the source gas is introduced into the processing container through the gas pipe, and a silicon nitride oxide film is formed as the gate insulating film 52b over the silicon oxynitride film over the substrate. Then, the supply of the source gas is stopped, the pressure in the processing container is decreased, the microwave generating apparatus is turned off, and the film formation process is completed.

Through the above-described process, the silicon oxynitride film is formed as the protective film on the inner wall of the reaction chamber, and the silicon oxynitride film and the silicon nitride oxide film are successively formed over the substrate, whereby mixture of an impurity such as silicon oxide into the silicon nitride oxide film on the upper layer side can be suppressed. By formation of the above-mentioned films by a microwave plasma CVD method using a power supply apparatus which can generate a microwave as a power supply apparatus, plasma density can be made to be high and the films can be formed to have high withstand voltage. With the use of the films as a gate insulating film, variations in threshold voltages of transistors can be suppressed. In addition, BT characteristics can be improved. Moreover, resistance to static electricity is increased, and a transistor which is not easily destroyed even when high voltage is applied can be manufactured. Furthermore, a transistor which is less destroyed over time can be manufactured. In addition, a transistor with less hot carrier damage can be manufactured.

In the case where a gate insulating film is a single layer of a silicon oxynitride film which is formed using the microwave plasma CVD apparatus, the above-described formation method of the protective film and the formation method of the silicon oxynitride film are used. In particular, when the flow rate ratio of dinitrogen monoxide to silane is set to be 100:1 to 300:1, preferably, 150:1 to 250:1, the silicon oxynitride film can be formed to have high withstand voltage.

Next, a film formation process is described, in which a microcrystalline semiconductor film and an amorphous semiconductor film as a buffer layer are successively formed by a microwave plasma CVD method. First, in a similar manner to the gate insulating films, the inside of the reaction chamber is cleaned. Next, a silicon film is deposited as a protective film inside the processing container. Here, the pressure in the processing container is set to be 1 Pa to 200 Pa, preferably, 1 Pa to 100 Pa, and one or more kinds of rare gases such as helium, argon, xenon, and krypton is introduced as a plasma ignition gas. Note that hydrogen may be introduced together with the rare gas.

Then, the microwave generating apparatus is turned on, and the output of the microwave generating apparatus is set to be 500 W to 6000 W, preferably, 4000 W to 6000 W to generate plasma. Next, a source gas is introduced into the processing container through the gas pipe. Specifically, by introduction of a silicon hydride gas and a hydrogen gas as a source gas, a microcrystalline silicon film is formed as a protective film on the inner wall of the processing container and on the surface of the gas pipe, the dielectric plate, and the support base. Alternatively, a microcrystalline semiconductor film can be formed from a dilution of a silicon hydride gas and a hydrogen gas with one or more kinds of rare gas elements selected from helium, argon, krypton, and neon. The flow rate ratio of hydrogen to silicon hydride at this time is set to be 5:1 to 200:1, preferably, 50:1 to 150:1, more preferably, 100:1. In addition, the thickness of the protective film at this time is set to be 500 nm to 2000 nm. Note that, before the microwave generating apparatus is turned on, a silicon hydride gas and a hydrogen gas in addition to the above-mentioned rare gas may be introduced into the processing container.

Alternatively, an amorphous semiconductor film can be formed as the protective film from a dilution of a silicon hydride gas and a hydrogen gas with one or more kinds of rare gas elements selected from helium, argon, krypton, and neon.

Then, the supply of the source gas is stopped, the pressure in the processing container is decreased, and the microwave generating apparatus is turned off. After that, the substrate is introduced onto the support base in the processing container.

Next, the surface of the gate insulating film 52b formed over the substrate is processed with hydrogen plasma. By processing with hydrogen plasma before the microcrystalline semiconductor film is formed, lattice distortion at the interface between the gate insulating film and the microcrystalline semiconductor film can be decreased, and interface characteristics of the gate insulating film and the microcrystalline semiconductor film can be improved. Accordingly, electric characteristics of a thin film transistor to be formed later can be improved.

In the hydrogen plasma processing, the amorphous semiconductor film or the microcrystalline semiconductor film which is formed as the protective film inside the processing container is also processed with hydrogen plasma, whereby the protective film is etched and a slight amount of semiconductor is deposited on the surface of the gate insulating film 52b. The semiconductor serves as a nucleus of crystal growth, and with the nucleus, a microcrystalline semiconductor film is deposited. As a result, lattice distortion at the interface between the gate insulating film and the microcrystalline semiconductor film can be decreased, and interface characteristics of the gate insulating film and the microcrystalline semiconductor film can be improved. Accordingly, electric characteristics of a thin film transistor to be formed later can be improved.

Next, in a similar manner to the protective film, a microcrystalline silicon film is deposited over the substrate. The thickness of the microcrystalline silicon film is set to be greater than 0 nm and less than or equal to 50 nm, preferably, greater than 0 nm and less than or equal to 20 nm.

After the microcrystalline silicon film is deposited to a predetermined thickness, the supply of the source gas is stopped, the pressure in the processing container is decreased, the microwave generating apparatus is turned off, and the film formation process for the microcrystalline semiconductor film is completed.

Next, the pressure in the processing container is decreased, and the flow rate of the source gas is adjusted. Specifically, the flow rate of a hydrogen gas is significantly decreased compared to that under film formation conditions for the microcrystalline semiconductor film. Typically, a hydrogen gas is introduced at a flow rate which is 1 to 20 times, preferably, 1 to 10 times, more preferably, 1 to 5 times higher than the flow rate of silicon hydride. Alternatively, a silicon hydride gas is introduced without any hydrogen gas being introduced into the processing container. By such a decrease in flow rate ratio of hydrogen to silicon hydride, the film formation rate of an amorphous semiconductor film as the buffer layer can be increased. Alternatively, a silicon hydride gas is diluted with one or more kinds of rare gas elements selected from helium, argon, krypton, and neon. Next, the microwave generating apparatus is turned on and the output of the microwave generating apparatus is set to be 500 W to 6000 W, preferably, 4000 W to 6000 W to generate plasma, whereby an amorphous semiconductor film can be formed. Because the film formation rate of an amorphous semiconductor film is higher than that of a microcrystalline semiconductor film, the pressure in the processing container can be set to be low. The thickness of the amorphous semiconductor film at this time is set to be 100 nm to 400 nm.

After the amorphous semiconductor film is deposited to a predetermined thickness, the supply of the source gas is stopped, the pressure in the processing container is decreased, the microwave generating apparatus is turned off, and the film formation process for the amorphous semiconductor film is completed.

Note that the microcrystalline semiconductor film 53 and the amorphous semiconductor film which is the buffer layer 54 may be formed while plasma is ignited. Specifically, while the flow rate ratio of hydrogen to silicon hydride which are the source gas used to form the microcrystalline semiconductor film 53 is gradually decreased, the microcrystalline semiconductor film 53 and the amorphous semiconductor film which is the buffer layer 54 are stacked. By such a method, an impurity is not deposited at the interface between the microcrystalline semiconductor film 53 and the buffer layer 54; interface with less distortion can be formed; and electric characteristics of a thin film transistor to be formed later can be improved.

Plasma which is generated by a microwave plasma CVD apparatus with a frequency of 1 GHz or more has high electron density, and a large number of radicals are formed from a source gas and supplied to a substrate 1130. Thus, reaction of radicals at the surface of the substrate is accelerated, and the film formation rate of microcrystalline silicon can be increased. Furthermore, a microwave plasma CVD apparatus having a plurality of microwave generating apparatuses and a plurality of dielectric plates can generate stable plasma over large area. Therefore, a film with highly uniform film quality can be formed even over a large-area substrate, and mass productivity can be increased.

Moreover, by successive formation of the microcrystalline semiconductor film and the amorphous semiconductor film in the same processing container, interface with less distortion can be formed.

Note that, in each of the manufacturing processes of the gate insulating film and the semiconductor film, in the case where a protective film of 500 nm to 2000 nm is formed on the inner wall of the reaction chamber, the cleaning process and the formation process of the protective film can be omitted.

The mask 56 is formed by a photolithography technique or an inkjet method.

Figure 1B:
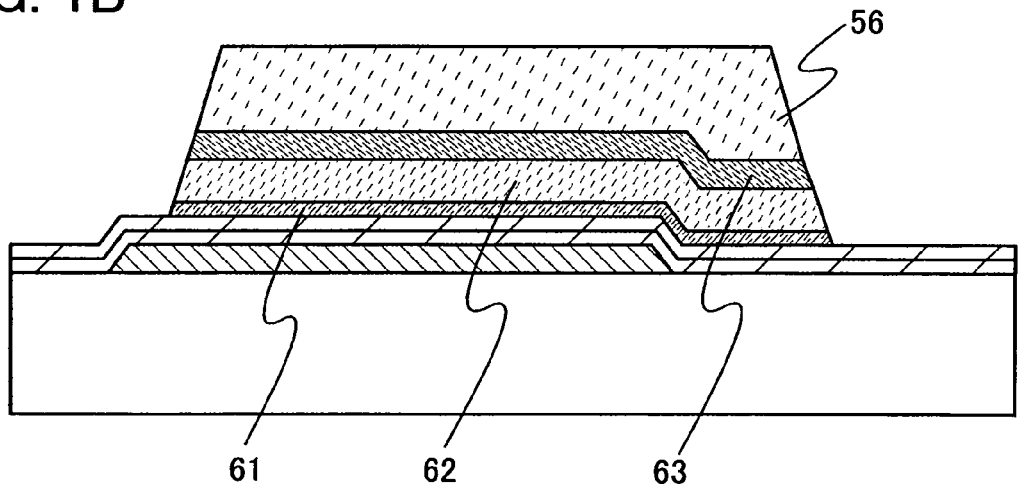

Next, the microcrystalline semiconductor film 53, the buffer layer 54, and the semiconductor film 55 to which an impurity imparting one conductivity type is added are divided by etching using the mask to form a microcrystalline semiconductor film 61, a buffer layer 62, and a semiconductor film 63 to which an impurity imparting one conductivity type is added, as shown in FIG. 1B. After that, the mask 56 is removed. Note that FIG. 1B corresponds to a cross-sectional view taken along a line A-B of FIG. 4A.

Figure 1C:
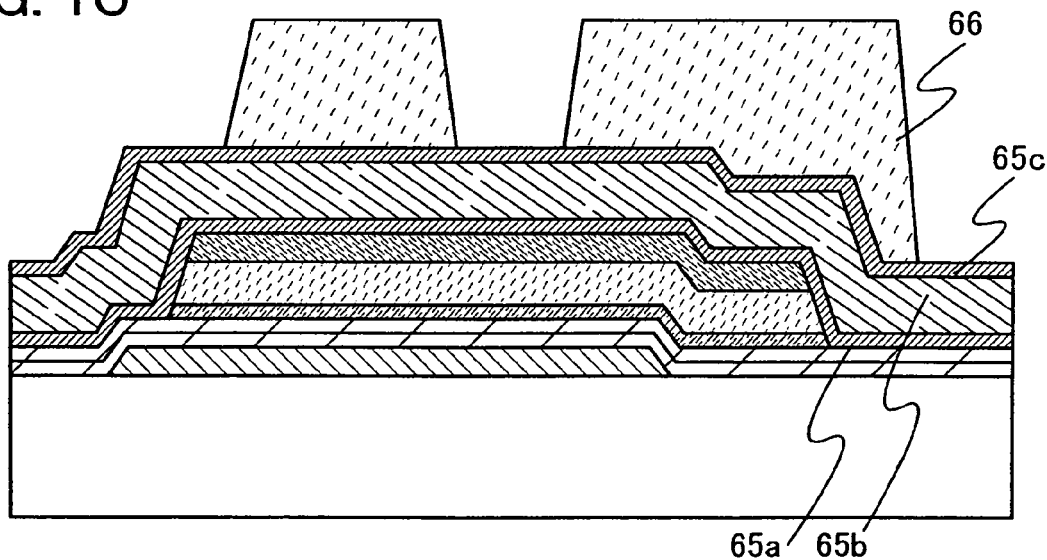

Next, as shown in FIG. 1C, a conductive film is formed over the semiconductor film 63 to which an impurity imparting one conductivity type is added and the gate insulating film 52b, and a mask 66 is formed over the conductive film.

It is preferable that the conductive film be formed using a single layer or a stacked layer of aluminum, copper, or an aluminum alloy to which an element to improve heat resistance or an element to prevent a hillock such as silicon, titanium, neodymium, scandium, or molybdenum is added. Alternatively, the conductive film may have a stacked-layer structure where a film on the side in contact with the semiconductor film to which an impurity imparting one conductivity type is added is formed of titanium, tantalum, molybdenum, tungsten, or nitride of any of these elements and an aluminum film or an aluminum alloy film is formed thereover. Still alternatively, the conductive film may have a stacked-layer structure where an aluminum film or an aluminum alloy film is sandwiched between upper and lower films of titanium, tantalum, molybdenum, tungsten, or nitride of any of these elements. Here, as the conductive film, a conductive film with a three-layer structure where conductive films 65a to 65c are stacked is described. A stacked-layer conductive film where molybdenum films are used as the conductive films 65a and 65c and an aluminum film is used as the conductive film 65b or a stacked-layer conductive film where titanium films are used as the conductive films 65a and 65c and an aluminum film is used as the conductive film 65b can be given.

The conductive films 65a to 65c are formed by a sputtering method or a vacuum evaporation method. Alternatively, the conductive films 65a to 65c may be formed by discharge of a conductive nanopaste of silver, gold, copper, or the like using a screen printing method, an inkjet method, or the like and by baking thereof.

The mask 66 can be formed in a similar manner to the mask 56.

Figure 2A:
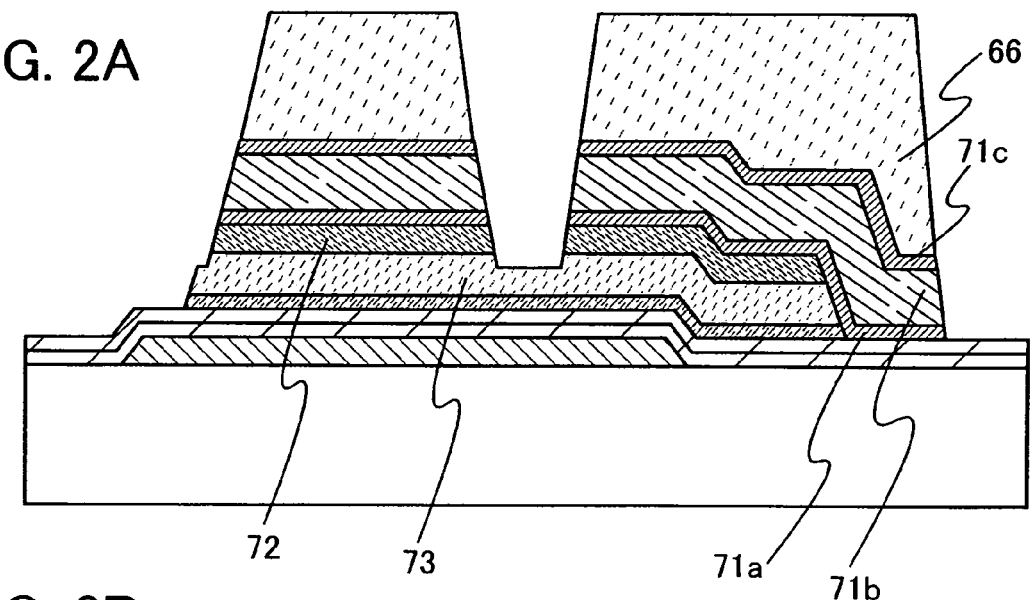
FIGS. 2A to 2C are cross-sectional views showing a method for manufacturing a light-emitting device of the present invention.

Next, the conductive films 65a to 65c are divided by etching using the mask 66 to form conductive films 71a to 71c as shown in FIG. 2A. Then, the semiconductor film 63 to which an impurity imparting one conductivity type is added and the buffer layer 62 are etched using the mask 66 to form source and drain regions 72 and a buffer layer 73. Note that the buffer layer 73 is etched only partly and covers the surface of the microcrystalline semiconductor film 61. At this time, the edge portions of the source and drain regions 72 are roughly aligned with the edge portions of the conductive films 71a to 71c.

Figure 2B:
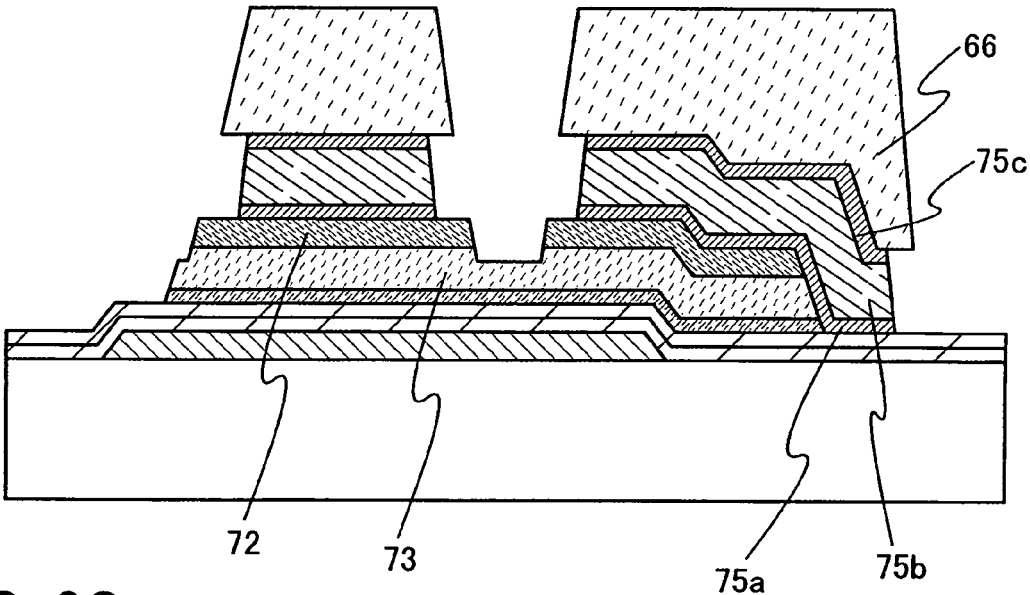
Figure 4A:
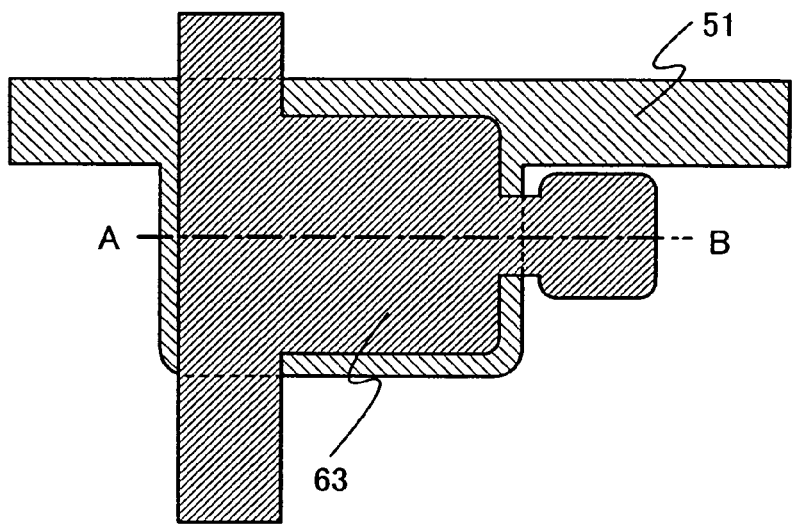
FIGS. 4A to 4C are top views showing a method for manufacturing a light-emitting device of the present invention.
Figure 4B:
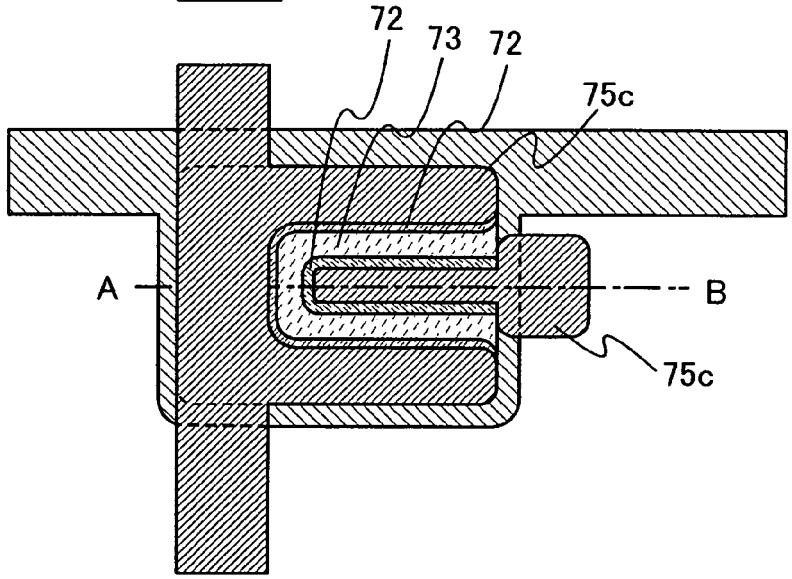
Figure 4C:
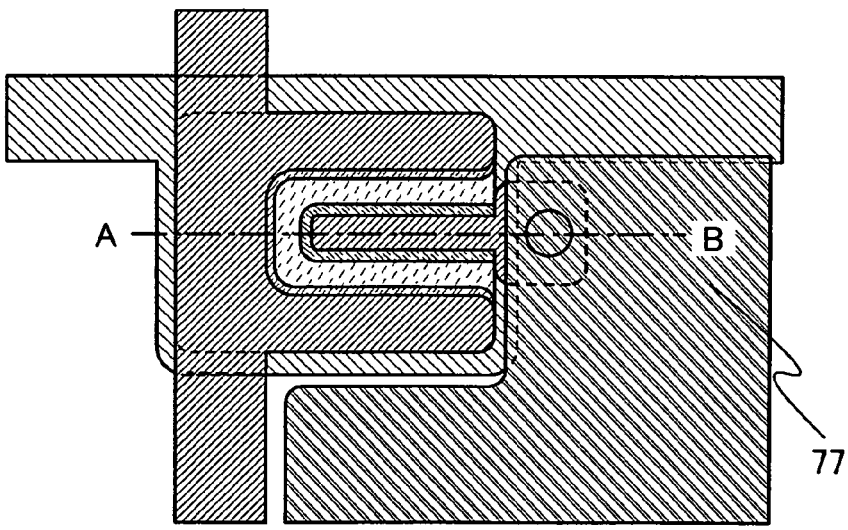

Next, as shown in FIG. 2B, the conductive films 71a to 71c are partly etched to form source and drain electrodes 75a to 75c. Here, by wet etching of the conductive films 71a to 71c with the use of the mask 66, the edge portions of the conductive films 71a to 71c are selectively etched. As a result, the source and drain electrodes 75a to 75c having smaller areas than the conductive films 71a to 71c can be formed. The edge portions of the source and drain electrodes 75a to 75c are not aligned with the edge portions of the source and drain regions 72, and the edge portions of the source and drain regions 72 are formed outside of the edge portions of the source and drain electrodes 75a to 75c. After that, the mask 66 is removed. Note that FIG. 2B corresponds to a cross-sectional view taken along a line A-B of FIG. 4B. As shown in FIG. 4B, it can be seen that the edge portions of the source and drain regions 72 are located outside of the edge portions of the source and drain electrodes 75c. One of the source and drain electrodes also functions as a source or drain wiring.

With such a structure as shown in FIG. 2B in which the edge portions of the source and drain electrodes 75a to 75c are not aligned with the edge portions of the source and drain regions 72, the edge portions of the source and drain electrodes 75a to 75c are apart from each other; therefore, leakage current and short circuit between the source and drain electrodes can be prevented. In addition, because of the structure where the edge portions of the source and drain electrodes 75a to 75c are not aligned with the edge portions of the source and drain regions 72, an electric field can be prevented from being concentrated on the edge portions of the source and drain electrodes 75a to 75c and the source and drain regions 72, and leakage current between the gate electrode 51 and the source and drain electrodes 75a to 75c can be prevented. Accordingly, a thin film transistor with high reliability and high withstand voltage can be manufactured.

Through the above-described process, a channel-etch thin film transistor 74 can be formed.

In the thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel formation region. In addition, a depression (a groove) is formed in a part of the buffer layer, and regions other than the depression are covered with the source and drain regions. That is, due to the depression formed in the buffer layer, the source and drain regions are apart from each other; thus, leakage current between the source and drain regions can be reduced. In addition, because the depression is formed by etching of a part of the buffer layer, an etching residue which is generated in the formation step of the source and drain regions can be removed. Accordingly, leakage current (parasitic channel) can be prevented from being generated between the source and drain regions through the residue.

The buffer layer is formed between the microcrystalline semiconductor film which functions as a channel formation region and the source and drain regions. In addition, the buffer layer covers the surface of the microcrystalline semiconductor film. Because the buffer layer, which is formed to have high resistance, is extended to regions between the microcrystalline semiconductor film and the source and drain regions, leakage current generated in the thin film transistor can be reduced, and deterioration due to application of high voltage can be suppressed. Moreover, because the amorphous semiconductor film, the surface of which is terminated with hydrogen, is formed as the buffer layer on the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film. Accordingly, the thin film transistor has high electric characteristics and excellent withstand voltage.

Because the edge portions of the source and drain electrodes are apart from each other due to the structure where the edge portions of the source and drain electrodes are not aligned with the edge portions of the source and drain regions, leakage current and short circuit between the source and drain electrodes can be prevented.

FIGS. 2A and 2B described above show an example in which, after the buffer layer 73 having a depression (groove) in its part is formed, etching is performed to increase the distance between the edge portions of the source and drain electrodes facing each other; however, the present invention is not particularly limited thereto. For example, the process may be performed in the following order: the conductive films 65a to 65c are divided by etching to expose the semiconductor film 63 to which an impurity imparting one conductivity type is added; etching is performed to increase the distance between the edge portions of the source and drain electrodes facing each other; the semiconductor film 63 is etched using the mask 66 to separate the source and drain regions 72; and the depression (groove) is formed in a part of the buffer layer.

Figure 2C:
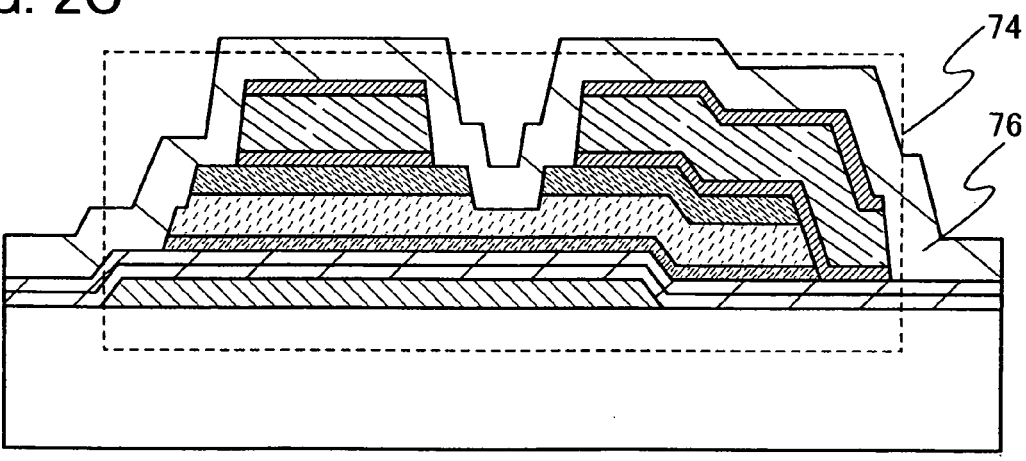
Figure 3:
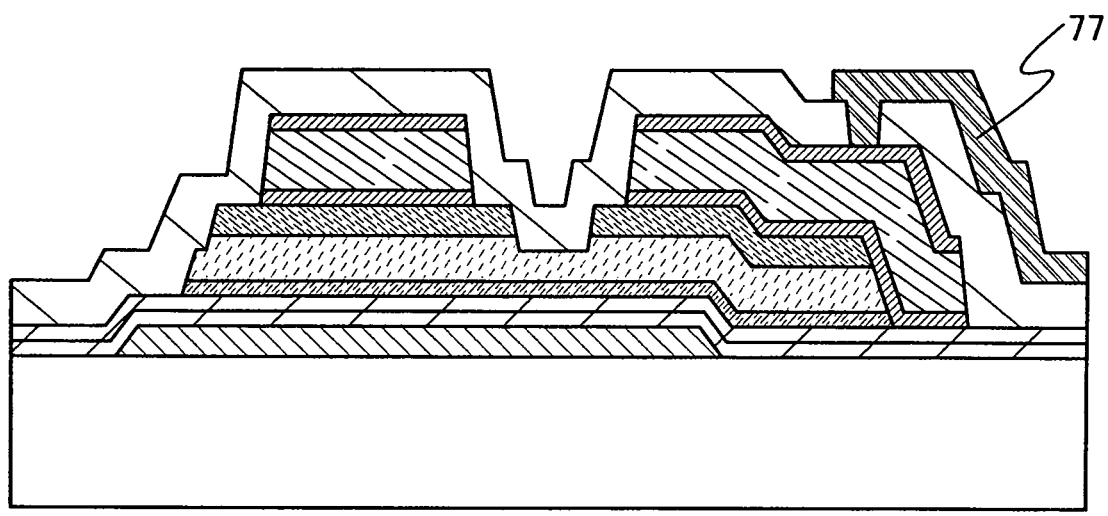
FIG. 3 is a cross-sectional view showing a method for manufacturing a light-emitting device of the present invention.

Next, as shown in FIG. 2C, an insulating film 76 is formed over the source and drain electrodes 75a to 75c, the source and drain regions 72, the microcrystalline semiconductor film 61, and the gate insulating film 52b. The insulating film 76 can be formed in a similar manner to the gate insulating films 52a and 52b. Note that the insulating film 76 is provided to prevent entry of a contaminant impurity such as an organic substance, a metal substance, or moisture floating in the atmosphere and is preferably a dense film. By use of a silicon nitride film as the insulating film 76, the oxygen concentration in the buffer layer 73 can be made to be $1 \times 10^{19}$ atoms/cm$^3$ or less, preferably, $5 \times 10^{18}$ atoms/cm$^3$ or less.

Next, a contact hole is formed in the insulating film 76, and a pixel electrode 77 is formed in the contact hole to be in contact with the source or drain electrode 75c. Note that FIG. 3 corresponds to a cross-sectional view taken along a line A-B of FIG. 4C.

The pixel electrode 77 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 77 can be formed using a conductive composition containing a conductive high-molecular compound (also referred to as a conductive polymer). It is preferable that the pixel electrode formed using the conductive composition have a sheet resistance of 10000 Ω/square or less and a light transmittance of 70% or more at a wavelength of 550 nm. In addition, it is preferable that the resistivity of the conductive high-molecular compound contained in the conductive composition be 0.1 Ω·cm or less.

As the conductive high-molecular compound, a so-called π electron conjugated conductive high-molecular compound can be used. Examples include polyaniline and its derivatives, polypyrrole and its derivatives, polythiophene and its derivatives, copolymers of two or more kinds of them, and the like.

Next, a method for manufacturing a thin film transistor, which is different from that in the above mode, is described with reference to FIGS. 5A to 8D. Here, a structure is described, in which a source or drain electrode is separated from a source or drain wiring.

Figure 5A:
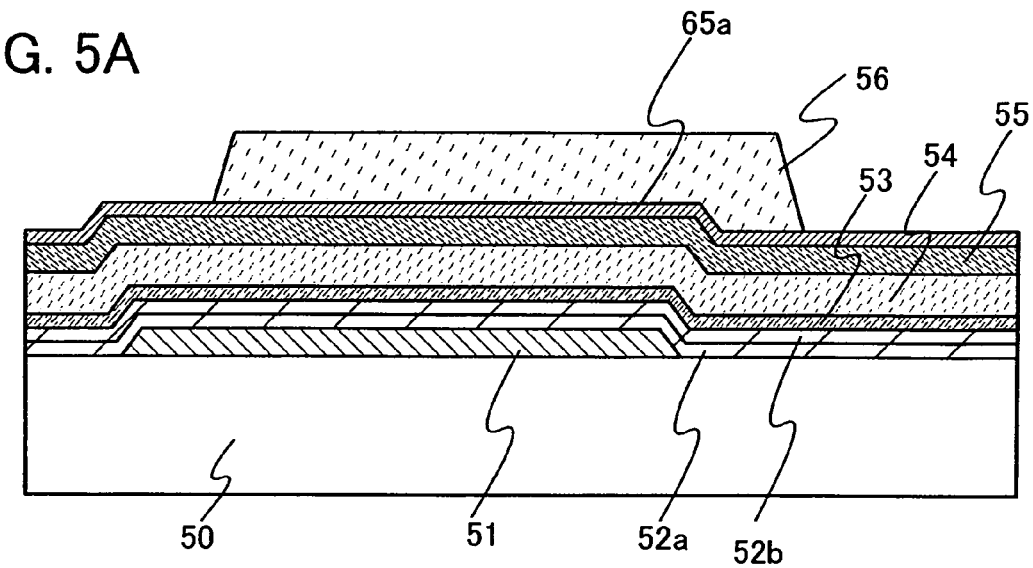
FIGS. 5A to 5C are cross-sectional views showing a method for manufacturing a light-emitting device of the present invention.

As shown in FIG. 5A, a gate electrode 51 is formed over a substrate 50. Next, over the gate electrode 51, gate insulating films 52a and 52b, a microcrystalline semiconductor film 53, a buffer layer 54, a semiconductor film 55 to which an impurity imparting one conductivity type is added, and a conductive film 65a are sequentially formed. Then, over the conductive film 65a, a mask 56 is formed.

Figure 5B:
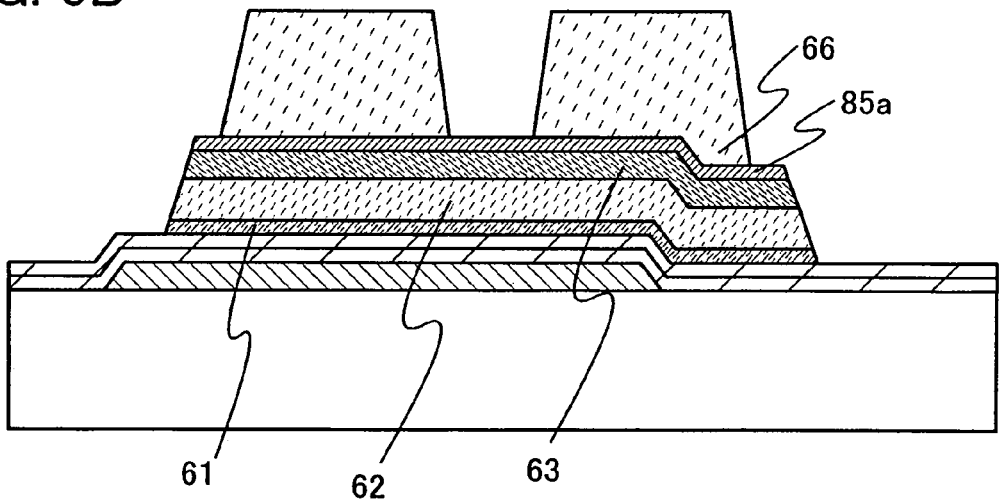
Figure 5C:
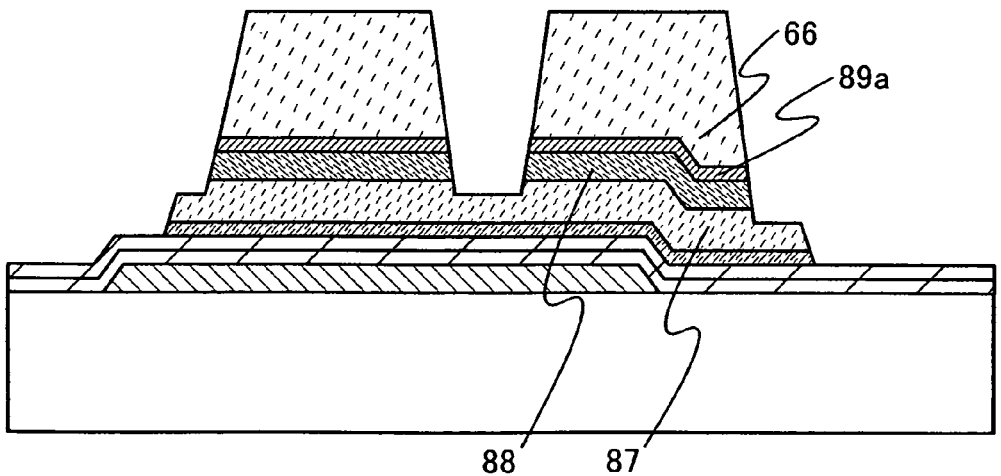

Next, the microcrystalline semiconductor film 53, the buffer layer 54, the semiconductor film 55 to which an impurity imparting one conductivity type is added, and the conductive film 65a are divided by etching using the mask 56. As a result, as shown in FIG. 5B, a microcrystalline semiconductor film 61, a buffer layer 62, a semiconductor film 63 to which an impurity imparting one conductivity type is added, and a conductive film 85a can be formed. After that, the mask 56 is removed. Note that FIG. 5B corresponds to a cross-sectional view taken along a line A-B of FIG. 8A.

Figure 8A:
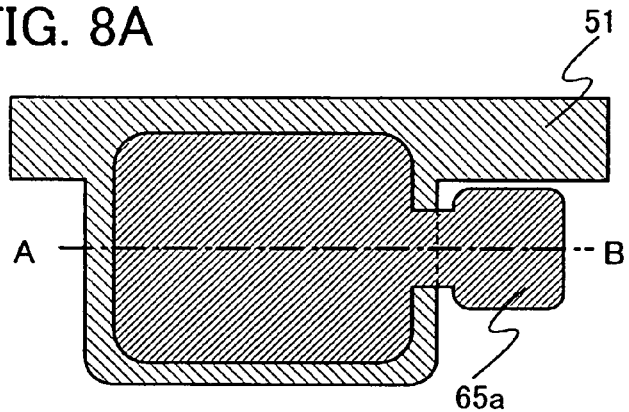
FIGS. 8A to 8D are top views showing a method for manufacturing a light-emitting device of the present invention.
Figure 8B:
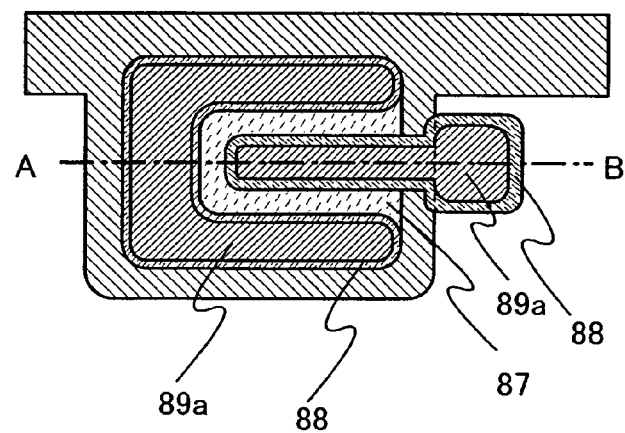
Figure 8C:
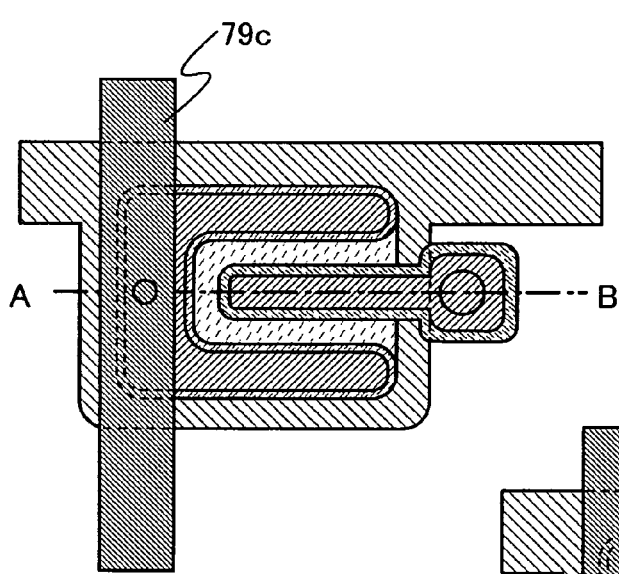
Figure 8D:
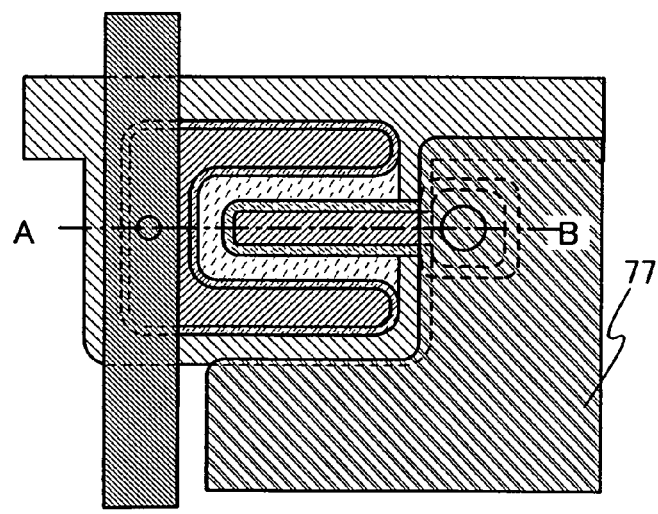

Next, as shown in FIG. 5B, a resist mask 66 is formed over the conductive film 85a. Then, the semiconductor film 63 to which an impurity imparting one conductivity type is added and the conductive film 85a are divided by etching using the resist mask 66. As a result, as shown in FIG. 8C, a pair of conductive films 89a and a pair of source and drain regions 88 can be formed. Note that, in this etching step, a part of the buffer layer 62 is also etched. The partly etched buffer layer is referred to as a buffer layer 87. Here, because a part of the buffer layer 62 is etched using the resist mask 66, the buffer layer 87 has a shape where it extends outside of the pair of conductive films 89a.

Figure 6A:
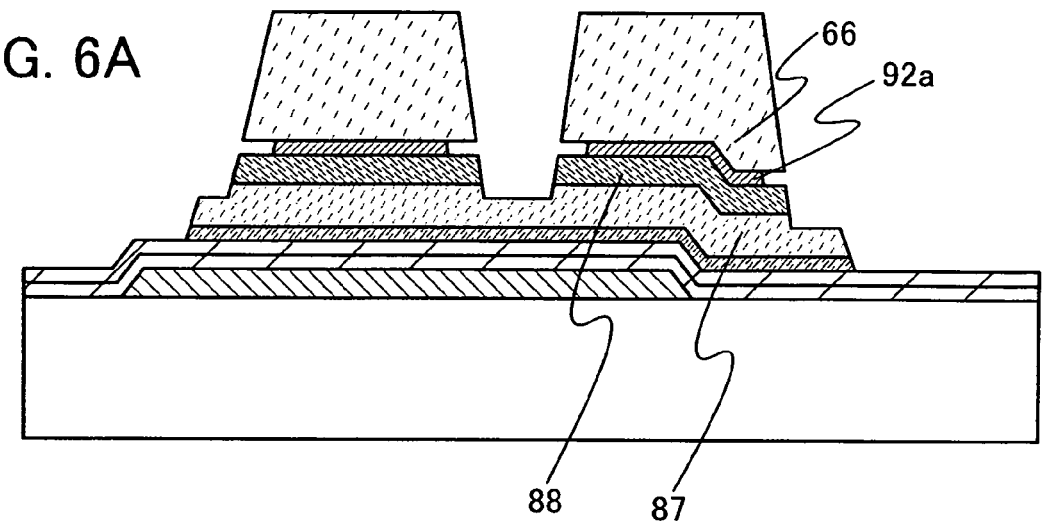
FIGS. 6A to 6C are cross-sectional views showing a method for manufacturing a light-emitting device of the present invention.

Next, as shown in FIG. 6A, the pair of conductive films 89a are partly etched to form source and drain electrodes 92a. Here, when the conductive films 89a are wet-etched using the resist mask 66, the edge portions of the conductive films 89a are selectively etched. As a result, the source and drain electrodes 92a having smaller areas than the conductive films 89a can be formed. The edge portions of the source and drain electrodes 92a are not aligned with the edge portions of the source and drain regions 88. After that, the resist mask 66 is removed. Note that FIG. 6A corresponds to a cross-sectional view taken along a line A-B of FIG. 8B. As shown in FIG. 8B, it can be seen that the edge portions of the source and drain regions 88 are located outside of the edge portions of the source and drain electrodes 92a. In addition, the source and drain electrodes 92a are separated from each other and are not connected to an adjacent pixel. Here, the source and drain electrodes 92a are formed by wet etching; however, the source and drain electrodes 92a can also be formed by ashing of the resist mask 66 and by etching of the conductive films 89a.

Figure 6B:
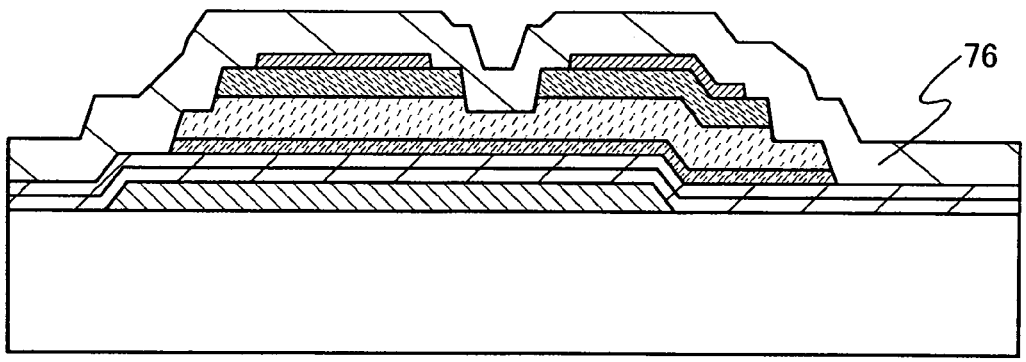
Figure 6C:
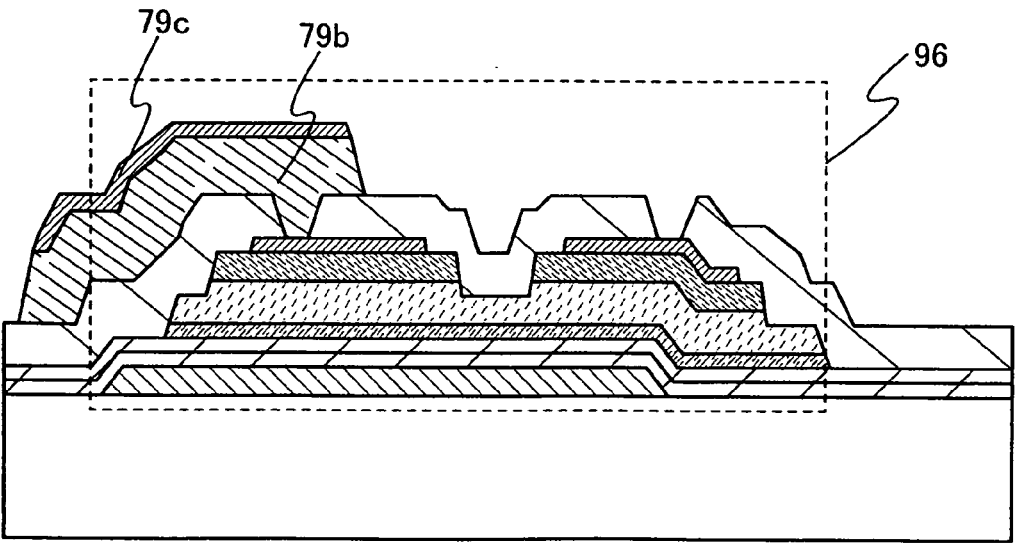

With such a structure as shown in FIG. 6B in which the edge portions of the source and drain electrodes 92a are not aligned with the edge portions of the source and drain regions 88, the edge portions of the source and drain electrodes 92a are apart from each other; therefore, leakage current and short circuit between the source and drain electrodes can be prevented. In addition, because of the structure where the edge portions of the source and drain electrodes 92a are not aligned with the edge portions of the source and drain regions 88, an electric field can be prevented from being concentrated on the edge portions of the source and drain electrodes 92a and the source and drain regions 88, and leakage current between the gate electrode and the source and drain electrodes 92a can be prevented. Accordingly, a thin film transistor with high reliability and high withstand voltage can be manufactured.

Next, as shown in FIG. 6B, an insulating film 76 is formed over the source and drain electrodes 92a, the source and drain regions 88, the buffer layer 87, and the gate insulating film 52b. The insulating film 76 can be formed in a similar manner to the gate insulating films 52a and 52b. Next, a contact hole is formed in the insulating film 76; stacked wirings 79b and 79c are formed in the contact hole to be in contact with one of the source and drain electrodes 92a. Note that FIG. 6C corresponds to a cross-sectional view taken along a line A-B of FIG. 8C. The wirings 79b and 79c are wirings to be connected to a source or drain electrode formed in an adjacent pixel.

Figure 7:
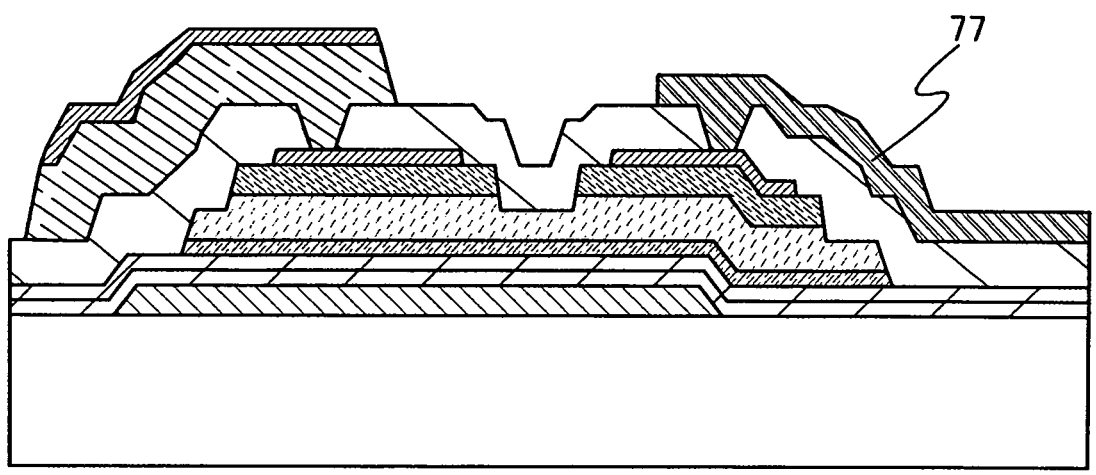
FIG. 7 is a cross-sectional view showing a method for manufacturing a light-emitting device of the present invention.

Next, a contact hole is formed in the insulating film 76, and a pixel electrode 77 is formed in the contact hole to be in contact with the other of the source and drain electrodes 92a, as shown in FIG. 7. Note that FIG. 7 corresponds to a cross-sectional view taken along a line A-B of FIG. 8D.

Through the above-described process, a channel-etch thin film transistor 74 can be formed. This channel-etch thin film transistor requires a smaller number of manufacturing steps and can achieve cost reduction. By formation of a channel formation region with a microcrystalline semiconductor film, a field-effect mobility of 1 $cm^2/V \cdot sec$ to 20 $cm^2/V \cdot sec$ can be achieved. Accordingly, this thin film transistor can be used as a switching element of a pixel in a pixel portion and as an element included in a scan line (gate line) side driver circuit.

In accordance with this embodiment mode, a thin film transistor with highly reliable electric characteristics can be manufactured.

Embodiment Mode 2

Next, a manufacturing process of a light-emitting device is described with reference to FIGS. 13A to 14C. A light-emitting device, in which a light-emitting element utilizing electroluminescence is used, is described here. Light-emitting elements utilizing electroluminescence are classified according to whether a light-emitting material is an organic compound or an inorganic compound. In general, the former is referred to as organic EL elements and the latter as inorganic EL elements. The manufacturing process of a thin film transistor, which is shown in FIGS. 5A to 8D, is used here, but the manufacturing process shown in FIGS. 1A to 3 can also be used appropriately.

In an organic EL element, by application of a voltage to a light-emitting element, electrons and holes are separately injected from a pair of electrodes into a layer containing a light-emitting organic compound, and a current flows. Then, recombination of these carriers (the electrons and holes) causes the light-emitting organic compound to form an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element, depending on their element structures. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, description is made using the channel-etch thin film transistor shown in FIG. 2C as a thin film transistor which controls driving of a light-emitting element, but a channel-protective thin film transistor can also be used appropriately.

Figure 13A:
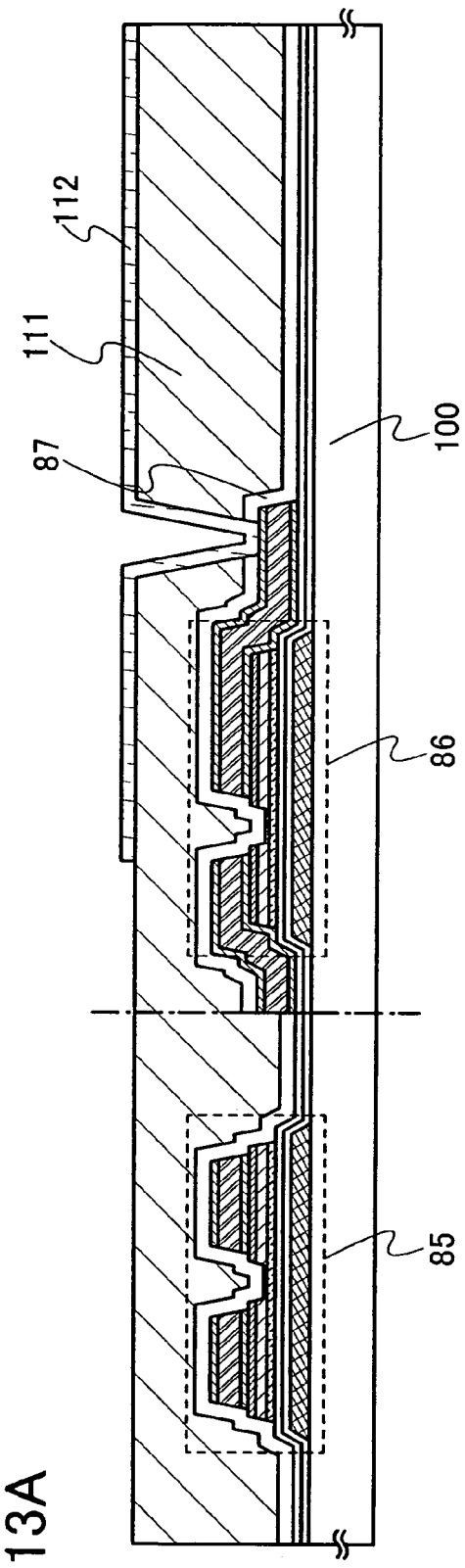
FIGS. 13A and 13B are cross-sectional views showing a method for manufacturing a light-emitting device of the present invention.

Through the process of FIGS. 5A to 6C, as shown in FIG. 13A, a thin film transistor 86 is formed over a substrate 100, and an insulating film 87 functioning as a protective film is formed over the thin film transistor 86. Next, a planarization film 111 is formed over the insulating film 87, and a pixel electrode 112 connected to a source or drain electrode of the thin film transistor 86 is formed over the planarization film 111.

It is preferable that the planarizing film 111 be formed using an organic resin such as acrylic, polyimide, or polyamide or using siloxane.

Figure 13B:
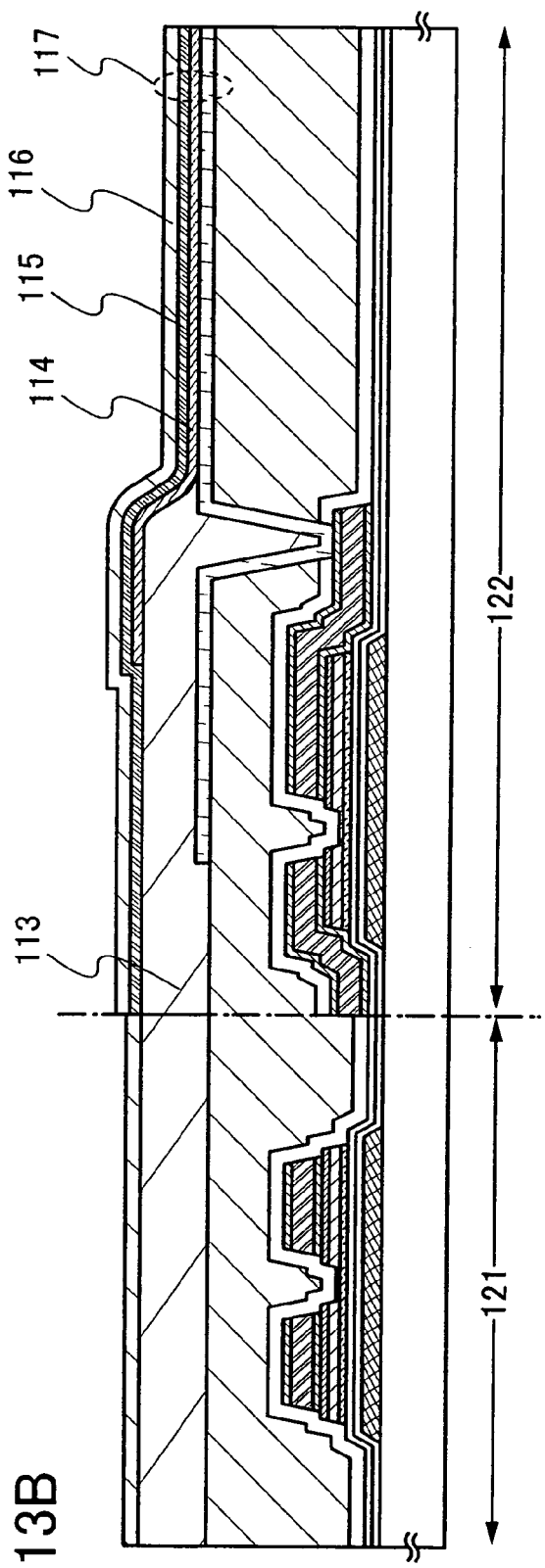

In FIG. 13B, the thin film transistor of a pixel is an n-type transistor; thus, it is desired that the pixel electrode 112 be a cathode. In contrast, when the thin film transistor is a p-type transistor, it is desired that the pixel electrode 112 be an anode. Specifically, as a cathode, a known material with low work function, such as Ca, Al, CaF, MgAg, or AlLi, can be used.

Next, as shown in FIG. 13B, a partition 113 is formed over the planarizing film 111 and an edge portion of the pixel electrode 112. The partition 113 has an opening, through which the pixel electrode 112 is exposed. The partition 113 is formed using an organic resin film, an inorganic insulating film, or organic polysiloxane. It is particularly preferable that the partition be formed using a photosensitive material to have an opening over the pixel electrode so that a sidewall of the opening is formed as a tilted surface with continuous curvature.

Next, a light-emitting layer 114 is formed in contact with the pixel electrode 112 in the opening of the partition 113. The light-emitting layer 114 may be formed using either a single layer or a stacked layer of a plurality of layers.

Then, a common electrode 115 serving as an anode is formed to cover the light-emitting layer 114. The common electrode 115 can be formed of a light-transmitting conductive film using any of the light-transmitting conductive materials listed in Embodiment Mode 1 for the pixel electrode 77. As the pixel electrode 115, a titanium nitride film or a titanium film may be used in place of the above-mentioned light-transmitting conductive film. In FIG. 13B, ITO is used for the common electrode 115. In the opening of the partition 113, a light-emitting element 117 is formed by overlapping of the pixel electrode 112, the light-emitting layer 114, and the common electrode 115. After this, it is preferable that a protective film 116 be formed over the common electrode 115 and the partition 113 so that oxygen, hydrogen, moisture, carbon dioxide, or the like does not enter the light-emitting element 117. As the protective film 116, a silicon nitride film, a silicon nitride oxide film, a DLC film, or the like can be formed. Note that reference numeral 121 is a driver circuit, and reference numeral 122 is a pixel portion.

Furthermore, practically, after the steps to the step of FIG. 13B are completed, it is preferable that packaging (encapsulation) be performed using a protective film (a laminate film, an ultraviolet curable resin film, or the like), which has high airtightness and causes less degasification, in order to prevent further exposure to external air.

Next, structures of light-emitting elements are described with reference to FIGS. 14A to 14C. Here, the case where a driving TFT is of an n type is given as an example, and cross-sectional structures of pixels are described.

In a light-emitting element, it is acceptable as long as at least one of an anode and a cathode has a light-transmitting property in order to extract light emission. There are light-emitting elements having the following structures: a top emission structure where a thin film transistor and a light-emitting element is formed over a substrate and light is extracted from a side opposite to the substrate; a bottom emission structure where light is extracted from the substrate side; and a dual emission structure where light is extracted from both the substrate side and the side opposite to the substrate. The pixel structure of the present invention can be applied to a light-emitting element with any of the emission structures.

A light-emitting element having a top emission structure is described with reference to FIG. 14A.

Figure 14A:
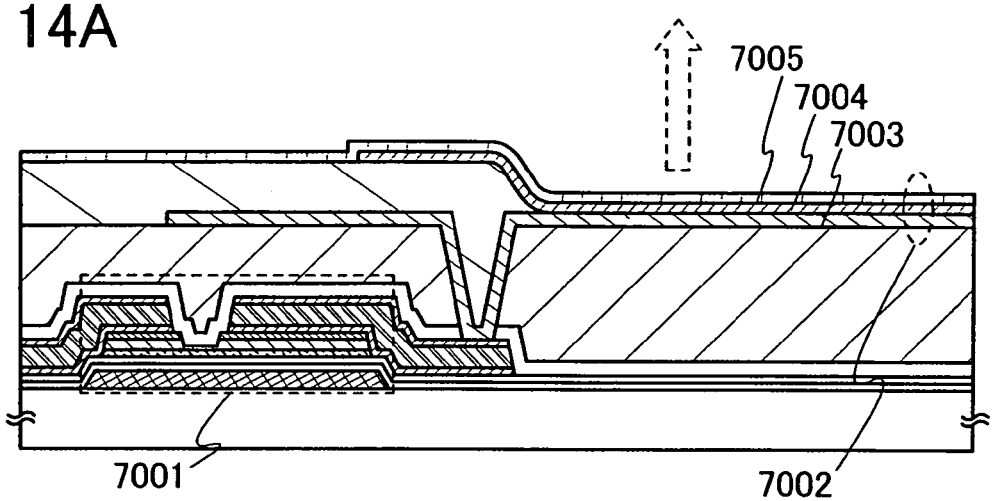
FIG. 14A to 14C are cross-sectional views each showing a pixel in a light-emitting device which is applicable to the present invention.

FIG. 14A is a cross-sectional view of a pixel in the case where a driving TFT 7001 is of an n type and light is emitted from a light-emitting element 7002 to an anode 7005 side. In FIG. 14A, a cathode 7003 of the light-emitting element 7002 is electrically connected to the driving TFT 7001, and a light-emitting layer 7004 and the anode 7005 are sequentially stacked over the cathode 7003. The cathode 7003 can be formed using any known conductive material that has a low work function and reflects light. For example, calcium, aluminum, calcium fluoride, a silver magnesium alloy, a lithium aluminum alloy, or the like is preferable. The light-emitting layer 7004 may be formed using either a single layer or a stacked layer of a plurality of layers. In the case of using a plurality of layers, an electron injection layer, an electron transport layer, a light-emitting layer, a hole transport layer, and a hole injection layer are stacked in this order over the cathode 7003. Note that all of these layers does not necessarily need to be provided. The anode 7005 is formed using a light-transmitting conductive material that transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used.

A region where the light-emitting layer 7004 is sandwiched between the cathode 7003 and the anode 7005 corresponds to the light-emitting element 7002. In the case of the pixel shown in FIG. 14A, light is emitted from the light-emitting element 7002 to the anode 7005 side as indicated by an outlined arrow.

Next, a light-emitting element having a bottom emission structure is described with reference to FIG. 14B. FIG. 14B is a cross-sectional view of a pixel in the case where a driving TFT 7011 is of an n type and light is emitted from a light-emitting element 7012 to a cathode 7013 side. In FIG. 14B, the cathode 7013 of the light-emitting element 7012 is formed over a light-transmitting conductive material 7017 which is electrically connected to the driving TFT 7011, and a light-emitting layer 7014 and an anode 7015 are sequentially stacked over the cathode 7013. Note that, in the case where the anode 7015 has a light-transmitting property, a blocking film 7016 for reflecting or blocking light may be formed to cover the anode. Similar to the case of FIG. 14A, the cathode 7013 can be formed using any known conductive material that has a low work function. Note that the thickness is set so that light is transmitted therethrough (preferably, about 5 nm to 30 nm). For example, an Al film with a thickness of 20 nm can be used as the cathode 7013. Similar to the case of FIG. 14A, the light-emitting layer 7014 may be formed using either a single layer or a stacked layer of a plurality of layers. Although the anode 7015 does not need to be able to transmit light, similar to FIG. 14A, it can be formed using a light-transmitting conductive material. The blocking film 7016 can be formed using, for example, a metal which reflects light, or the like; however, the present invention is not limited to a metal film. For example, a resin to which black colorant is added can also be used.

A region where the light-emitting layer 7014 is sandwiched between the cathode 7013 and the anode 7015 corresponds to the light-emitting element 7012. In the case of the pixel shown in FIG. 14B, light is emitted from the light-emitting element 7012 to the cathode 7013 side as indicated by an outlined arrow.

Next, a light-emitting element having a dual emission structure is described with reference to FIG. 14C. In FIG. 14C, a cathode 7023 of a light-emitting element 7022 is formed over a light-transmitting conductive material 7027 which is electrically connected to a driving TFT 7021, and a light-emitting layer 7024 and an anode 7025 are sequentially stacked over the cathode 7023. Similar to the case of FIG. 14A, the cathode 7023 can be formed using any known conductive material that has a low work function. Note that the thickness is set so that light is transmitted therethrough. For example, an Al film with a thickness of 20 nm can be used as the cathode 7023. Similar to FIG. 14A, the light-emitting layer 7024 may be formed using either a single layer or a stacked layer of a plurality of layers. Similar to FIG. 14A, the anode 7025 can be formed using a light-transmitting conductive material which transmits light.

A region where the cathode 7023, the light-emitting layer 7024, and the anode 7025 overlap with each other corresponds to the light-emitting element 7022. In the case of the pixel shown in FIG. 14C, light is emitted from the light-emitting element 7022 to both the anode 7025 side and the cathode 7023 side as indicated by outlined arrows.

Note that, although an organic EL element is described here as a light-emitting element, an inorganic EL element can also be provided as a light-emitting element.

Note that, in this embodiment mode, the example is described in which a thin film transistor (a driving TFT) which controls the driving of a light-emitting element is electrically connected to the light-emitting element, but a structure may be employed in which a TFT for current control is connected between the driving TFT and the light-emitting element.

Figure 14B:
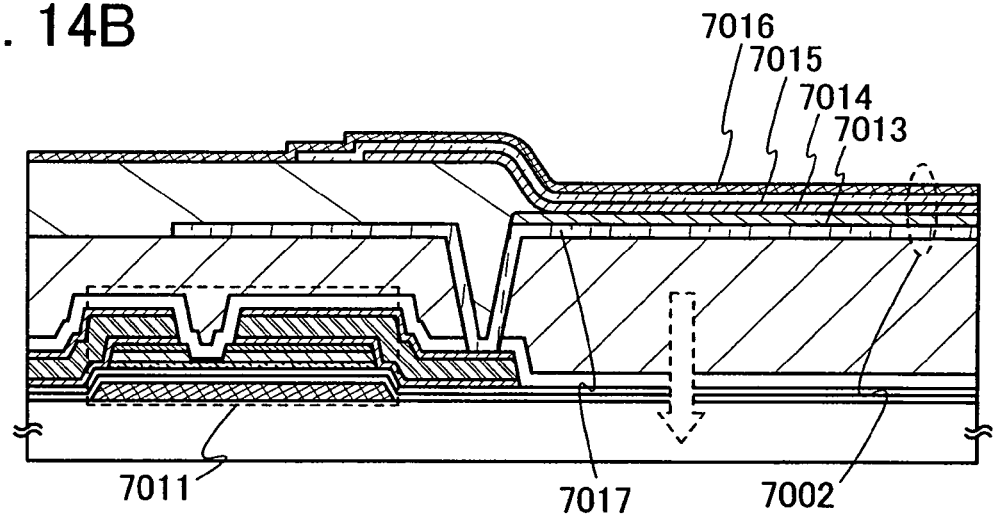
Figure 14C:
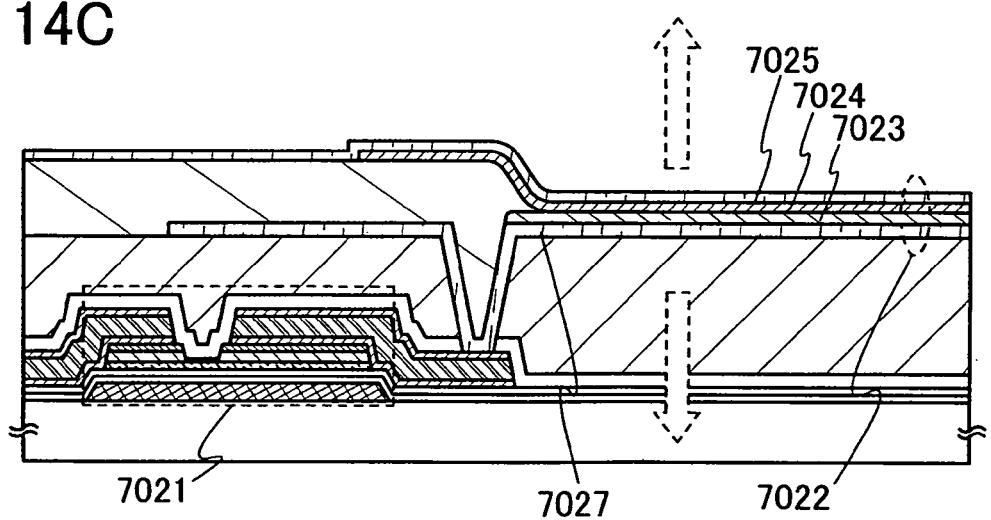

Note that the light-emitting device described in this embodiment mode is not limited to the structures shown in FIGS. 14A to 14C and can be modified in various ways based on the technical idea of the present invention.

Through the above-described process, a light-emitting device can be manufactured. Since a thin film transistor with small off current and highly-reliable electric properties is used in the light-emitting device of this embodiment mode, the light-emitting device has high contrast and high visibility. Further, since a thin film transistor including a microcrystalline silicon film which is formed without any laser crystallization step is used, a light-emitting device with high visibility can be formed with high mass productivity.

Embodiment Mode 3

Next, a structure of a light-emitting panel, which is one mode of a light-emitting device of the present invention, is described below.

Figure 10A:
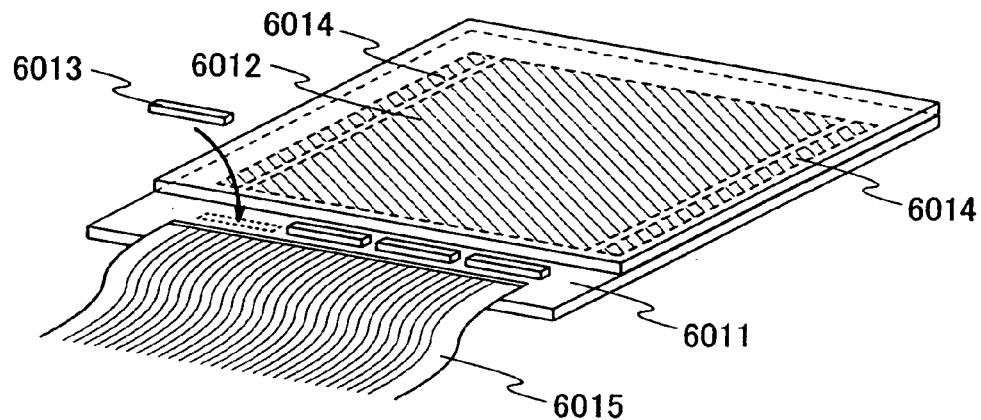
FIGS. 10A to 10C are perspective views showing display panels of the present invention.

FIG. 10A shows a mode of a light-emitting panel in which a signal line driver circuit 6013 which is separately formed is connected to a pixel portion 6012 formed over a substrate 6011. The pixel portion 6012 and a scan line driver circuit 6014 are each formed using a thin film transistor in which a microcrystalline semiconductor film is used. When the signal line driver circuit is formed using a transistor in which higher field-effect mobility can be obtained compared with the thin film transistor in which the microcrystalline semiconductor film is used, an operation of the signal line driver circuit which demands higher driving frequency than that of the scan line driver circuit can be stabilized. Note that the signal line driver circuit 6013 may be formed using a transistor using a single crystalline semiconductor, a thin film transistor using a polycrystalline semiconductor, or a transistor using SOI. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

Figure 10B:
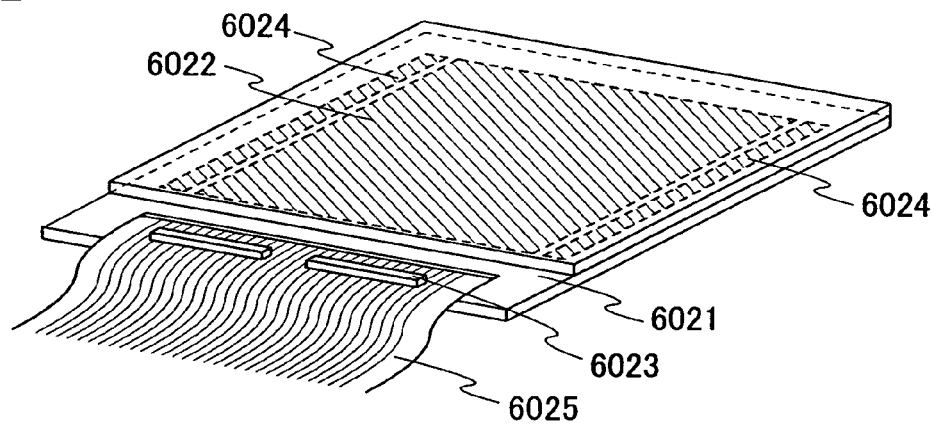

When a driver circuit is separately formed, a substrate over which the driver circuit is formed is not necessarily attached to a substrate over which a pixel portion is formed, and may be attached over an FPC, for example. FIG. 10B shows a mode of a light-emitting device panel in which a signal line driver circuit 6023 which is separately formed is connected to a pixel portion 6022 and a scan line driver circuit 6024 formed over a substrate 6021. The pixel portion 6022 and the scan line driver circuit 6024 are each formed using a thin film transistor in which a microcrystalline semiconductor film is used. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Figure 10C:
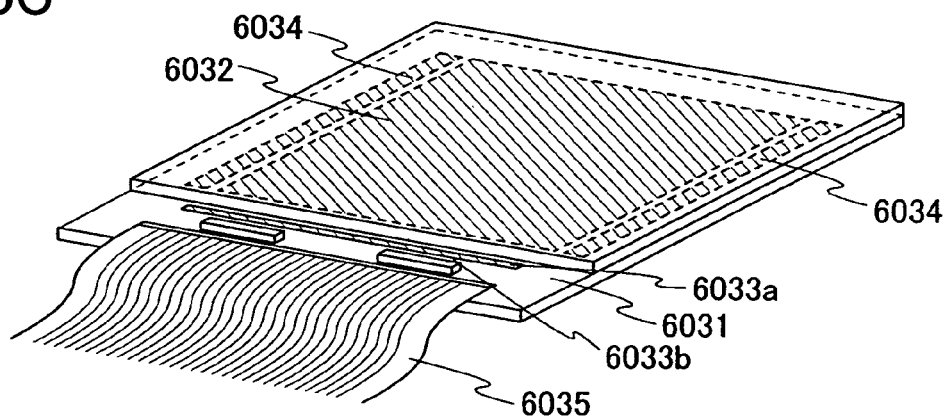

Alternatively, only part of a signal line driver circuit or part of a scan line driver circuit may be formed over the same substrate as a pixel portion by using a thin film transistor in which a microcrystalline semiconductor film is used, and the other part of the driver circuit may be separately formed and electrically connected to the pixel portion. FIG. 10C shows a mode of a light-emitting device panel in which an analog switch 6033a included in a signal line driver circuit is formed over a substrate 6031, which is the same substrate as a pixel portion 6032 and a scan line driver circuit 6034, and a shift register 6033b included in the signal line driver circuit is separately formed over a different substrate and attached to the substrate 6031. The pixel portion 6032 and the scan line driver circuit 6034 are each formed using a thin film transistor in which a microcrystalline semiconductor film is used. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As shown in FIGS. 10A to 10C, in a light-emitting device of the present invention, all or a part of the driver circuit can be formed over the same substrate as the pixel portion, using the thin film transistor in which the microcrystalline semiconductor film is used.

Note that a connection method of a substrate which is separately formed is not particularly limited, and a known COG method, wire bonding method, TAB method, or the like can be used. Further, a connection position is not limited to the positions shown in FIGS. 10A to 10C as long as electrical connection is possible. Moreover, a controller, a CPU, a memory, or the like may be formed separately and connected.

Note that a signal line driver circuit used in the present invention is not limited to a structure including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 16:
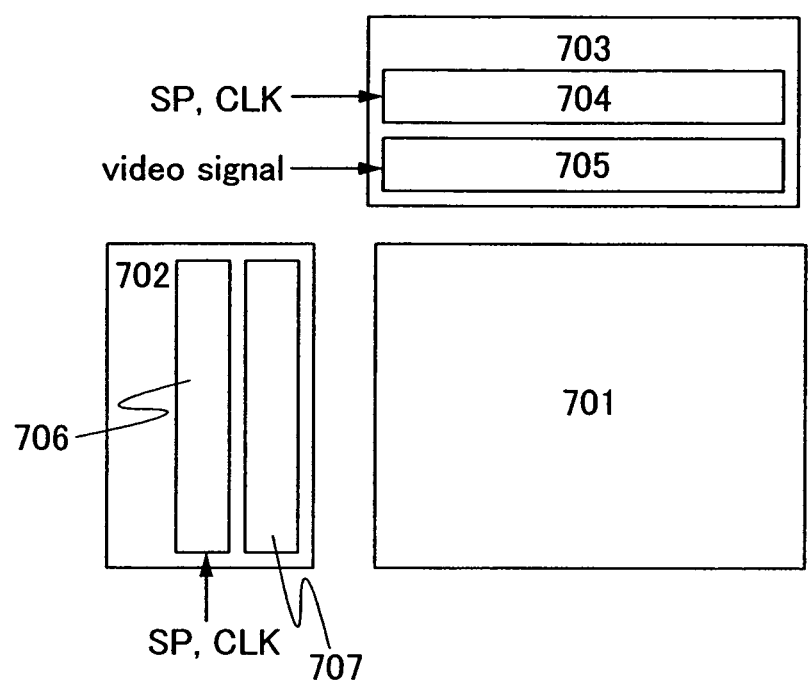
FIG. 16 is a block diagram showing a structure of a light-emitting device which is applicable to the present invention.

FIG. 16 is a block diagram of a light-emitting device of the present invention. The light-emitting device shown in FIG. 16 includes a pixel portion 700 including a plurality of pixels each provided with a light-emitting element, a scan line driver circuit 702 which selects each pixel, and a signal line driver circuit 703 which controls input of a video signal to a selected pixel.

In FIG. 16, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704 and input to the analog switch 705.

A video signal is supplied to the analog switch 705. The analog switch 705 samples the video signal in accordance with the timing signal and supplies the resulting signal to a signal line of the next stage.

Next, a structure of the scan line driver circuit 702 is described. The scan line driver circuit 702 includes a shift register 706 and a buffer 707. The scan line driver circuit 702 may also include a level shifter in some cases. In the scan line driver circuit 702, when the clock signal (CLK) and the start pulse signal (SP) are input to the shift register 706, a selection signal is generated. The generated selection signal is buffered and amplified by the buffer 707, and the resulting signal is supplied to a corresponding scan line. Gates of transistors in pixels of one line are connected to the scan line. Further, since the transistors in the pixels of one line have to be turned on at the same time, a buffer through which large current can flow is used as the buffer 707.

In a full color light-emitting device, when video signals corresponding to R (red), G (green), or B (blue) are sequentially sampled and supplied to a corresponding signal line, the number of terminals for connecting the shift register 704 and the analog switch 705 corresponds to approximately ⅓ of the number of terminals for connecting the analog switch 705 and the signal line in the pixel portion 700. Accordingly, when the analog switch 705 and the pixel portion 700 are formed over the same substrate, the number of terminals used for connecting substrates which are separately formed can be suppressed compared with the case where the analog switch 705 and the pixel portion 700 are formed over different substrates; thus, occurrence probability of bad connection can be suppressed, and yield can be increased.

Note that although the scan line driver circuit 702 shown in FIG. 16 includes the shift register 706 and the buffer 707, the scan line driver circuit 702 may be formed using the shift register 706.

Note that structures of the signal line driver circuit and the scan line driver circuit are not limited to the structures shown in FIG. 16, which are merely one mode of the light-emitting device of the present invention.

Figure 17:
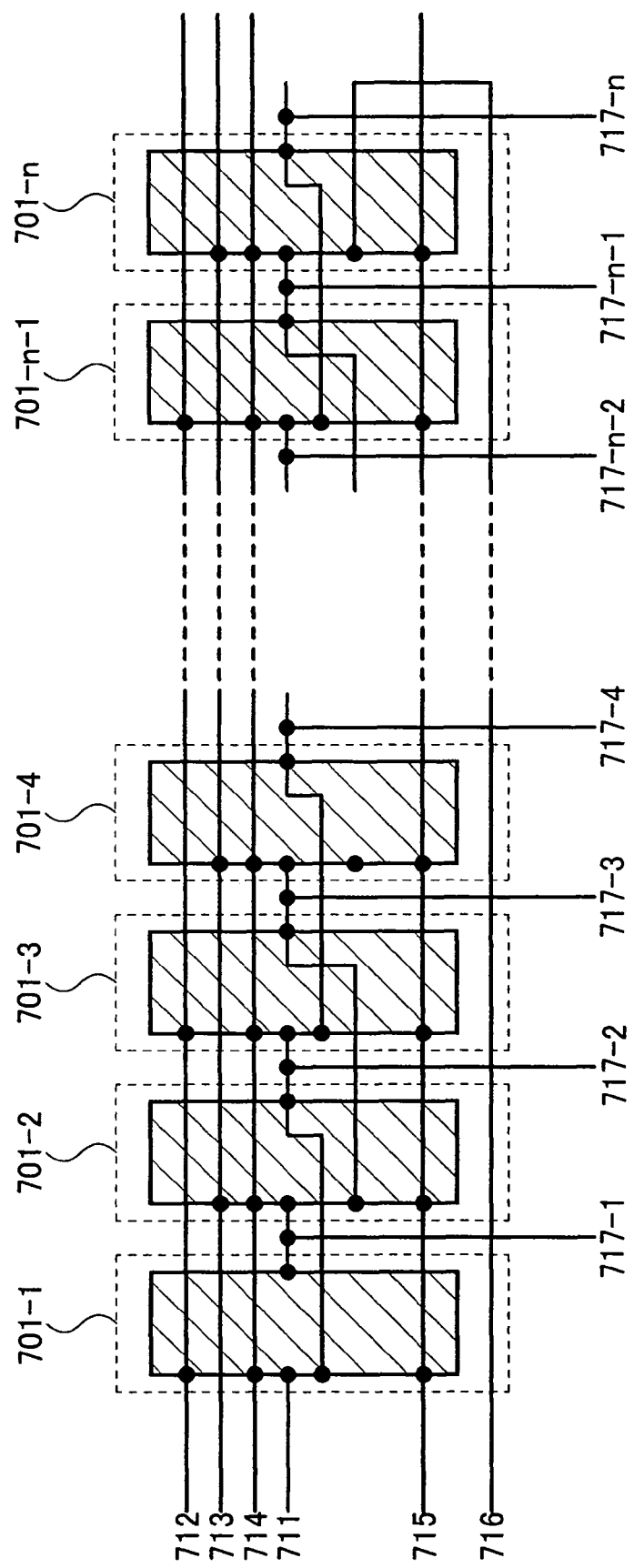
FIG. 17 is an equivalent circuit diagram showing a structure of a driver circuit of a light-emitting device which is applicable to the present invention.

Next, one mode of a shift register including thin film transistors in which microcrystalline semiconductor films with the same polarity are used is described with reference to FIGS. 17 and 18. FIG. 17 illustrates a structure of a shift register in this embodiment mode. The shift register shown in FIG. 17 includes a plurality of flip-flops. The shift register is operated by input of a first clock signal, a second clock signal, a start pulse signal, and a reset signal.

Connection relations of the shift register in FIG. 17 are described. In the i-th stage flip-flop 701-*i* (one of the flip-flops 701-1 to 701-*n*) in the shift register of FIG. 17, a first wiring 501 shown in FIG. 18 is connected to a seventh wiring 717-(*i*−1); a second wiring 502 shown in FIG. 18 is connected to a seventh wiring 717-(*i*+1); a third wiring 503 shown in FIG. 18 is connected to a seventh wiring 717-*i*; and a sixth wiring 506 shown in FIG. 18 is connected to a fifth wiring 715.

Figure 18:
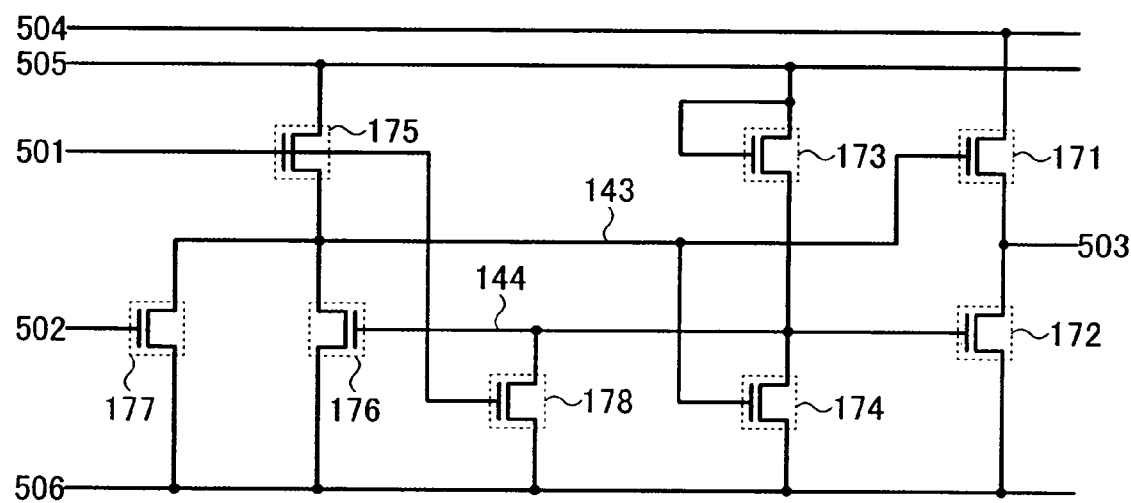
FIG. 18 is an equivalent circuit diagram showing a structure of a driver circuit of a light-emitting device which is applicable to the present invention.

Further, a fourth wiring 504 shown in FIG. 18 is connected to a second wiring 712 in odd-numbered stages, and is connected to a third wiring 713 in even-numbered stages. A fifth wiring 505 shown in FIG. 18 is connected to a fourth wiring 714.

Note that the first wiring 501 of the first stage flip-flop 701-1 shown in FIG. 18 is connected to a first wiring 711. Moreover, the second wiring 502 of the n-th stage flip-flop 701-*n* shown in FIG. 18 is connected to a sixth wiring 716.

Note that the first wiring 711, the second wiring 712, the third wiring 713, and the sixth wiring 716 may be referred to as a first signal line, a second signal line, a third signal line, and a fourth signal line, respectively. The fourth wiring 714 and the fifth wiring 715 may be referred to as a first power supply line and a second power supply line, respectively.

Next, FIG. 18 shows details of the flip-flop shown in FIG. 17. A flip-flop shown in FIG. 18 includes a first thin film transistor 171, a second thin film transistor 172, a third thin film transistor 173, a fourth thin film transistor 174, a fifth thin film transistor 175, a sixth thin film transistor 176, a seventh thin film transistor 177, and an eighth thin film transistor 178. In this embodiment mode, each of the first thin film transistor 171, the second thin film transistor 172, the third thin film transistor 173, the fourth thin film transistor 174, the fifth thin film transistor 175, the sixth thin film transistor 176, the seventh thin film transistor 177, and the eighth thin film transistor 178 is an n-channel transistor and is turned on when the gate-source voltage ($V_{gs}$) exceeds the threshold voltage ($V_{th}$).

Next, connection structures of the flip-flop shown in FIG. 17 are described below.

A first electrode (one of a source electrode and a drain electrode) of the first thin film transistor 171 is connected to the fourth wiring 504. A second electrode (the other of the source electrode and the drain electrode) of the first thin film transistor 171 is connected to the third wiring 503.

A first electrode of the second thin film transistor 172 is connected to the sixth wiring 506. A second electrode of the second thin film transistor 172 is connected to the third wiring 503.

A first electrode of the third thin film transistor 173 is connected to the fifth wiring 505. A second electrode of the third thin film transistor 173 is connected to a gate electrode of the second thin film transistor 172. A gate electrode of the third thin film transistor 173 is connected to the fifth wiring 505.

A first electrode of the fourth thin film transistor 174 is connected to the sixth wiring 506. A second electrode of the fourth thin film transistor 174 is connected to the gate electrode of the second thin film transistor 172. A gate electrode of the fourth thin film transistor 174 is connected to a gate electrode of the first thin film transistor 171.

A first electrode of the fifth thin film transistor 175 is connected to the fifth wiring 505. A second electrode of the fifth thin film transistor 175 is connected to the gate electrode of the first thin film transistor 171. A gate electrode of the fifth thin film transistor 175 is connected to the first wiring 501.

A first electrode of the sixth thin film transistor 176 is connected to the sixth wiring 506. A second electrode of the sixth thin film transistor 176 is connected to the gate electrode of the first thin film transistor 171. A gate electrode of the sixth thin film transistor 176 is connected to the gate electrode of the second thin film transistor 172.

A first electrode of the seventh thin film transistor 177 is connected to the sixth wiring 506. A second electrode of the seventh thin film transistor 177 is connected to the gate electrode of the first thin film transistor 171. A gate electrode of the seventh thin film transistor 177 is connected to the second wiring 502.

A first electrode of the eighth thin film transistor 178 is connected to the sixth wiring 506. A second electrode of the eighth thin film transistor 178 is connected to the gate electrode of the second thin film transistor 172. A gate electrode of the eighth thin film transistor 178 is connected to the first wiring 501.

Note that the point at which the gate electrode of the first thin film transistor 171, the gate electrode of the fourth thin film transistor 174, the second electrode of the fifth thin film transistor 175, the second electrode of the sixth thin film transistor 176, and the second electrode of the seventh thin film transistor 177 are connected is referred to as a node 143. The point at which the gate electrode of the second thin film transistor 172, the second electrode of the third thin film transistor 173, the second electrode of the fourth thin film transistor 174, the gate electrode of the sixth thin film transistor 176, and the second electrode of the eighth thin film transistor 178 are connected is referred to as a node 144.

Note that the first wiring 501, the second wiring 502, the third wiring 503, and the fourth wiring 504 may be referred to as a first signal line, a second signal line, a third signal line, and a fourth signal line, respectively. The fifth wiring 505 and the sixth wiring 506 may be referred to as a first power supply line and a second power supply line, respectively.

Figure 19:
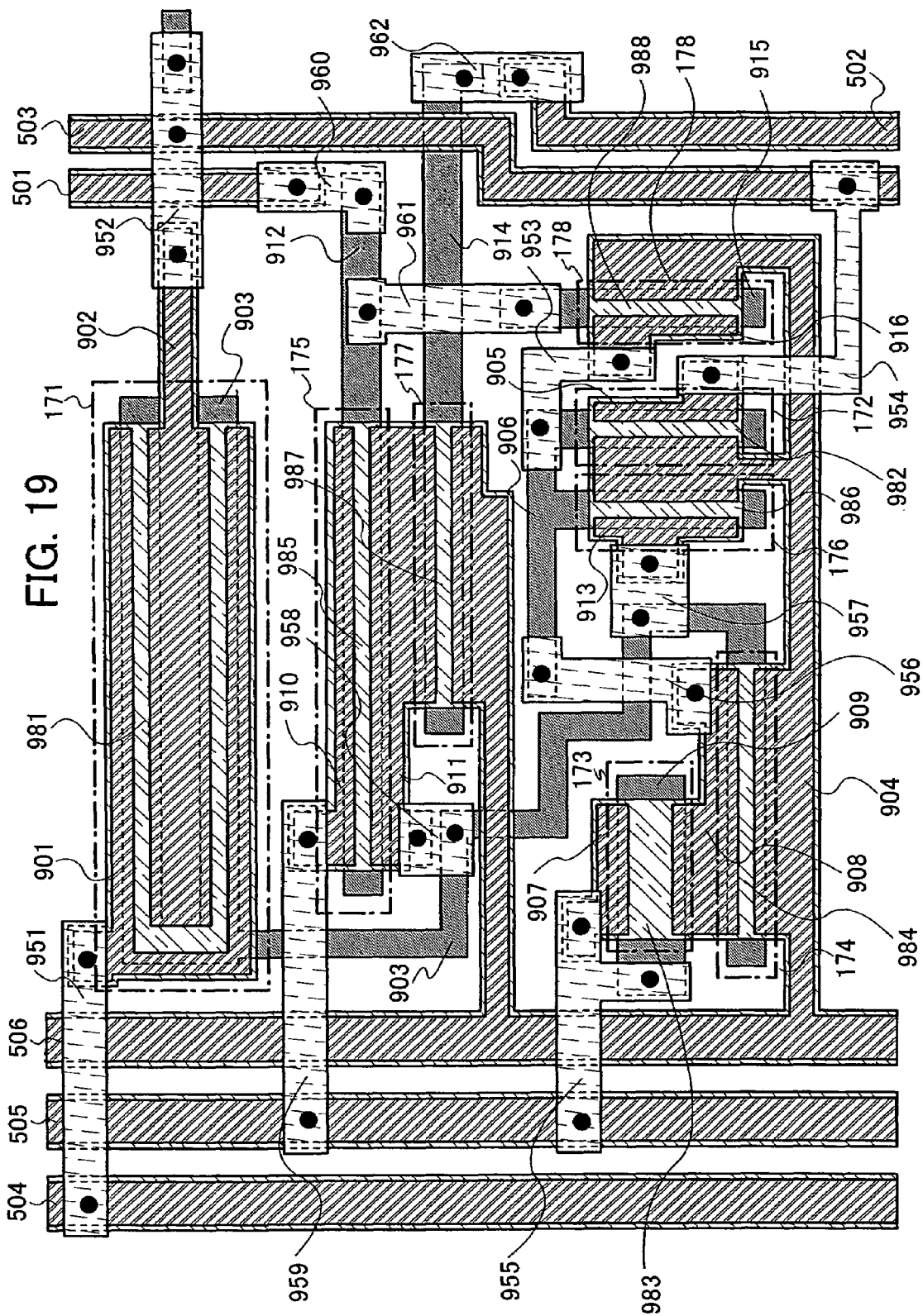
FIG. 19 is a top view showing a layout of a driver circuit of a light-emitting device which is applicable to the present invention.

FIG. 19 shows an example of a top plan view of the flip-flop shown in FIG. 18.

A conductive film 901 includes a portion functioning as the first electrode of the first thin film transistor 171, and is connected to the fourth wiring 504 through a wiring 951 which is formed at the same time as a pixel electrode.

A conductive film 902 includes a portion functioning as the second electrode of the first thin film transistor 171, and is connected to the third wiring 503 through a wiring 952 which is formed at the same time as the pixel electrode.

A conductive film 903 includes portions functioning as the gate electrode of the first thin film transistor 171 and the gate electrode of the fourth thin film transistor 174.

A conductive film 904 includes portions functioning as the first electrode of the second thin film transistor 172, the first electrode of the sixth thin film transistor 176, the first electrode of the fourth thin film transistor 174, and the first electrode of the eighth thin film transistor 178; and is connected to the sixth wiring 506.

A conductive film 905 includes a portion functioning as the second electrode of the second thin film transistor 172, and is connected to the third wiring 503 through a wiring 954 which is formed at the same time as the pixel electrode.

A conductive film 906 includes portions functioning as the gate electrode of the second thin film transistor 172 and the gate electrode of the sixth thin film transistor 176.

A conductive film 907 includes a portion functioning as the first electrode of the third thin film transistor 173, and is connected to the fifth wiring 505 through a wiring 955.

A conductive film 908 includes portions functioning as the second electrode of the third thin film transistor 173 and the second electrode of the fourth thin film transistor 174, and is connected to the conductive film 906 through a wiring 956 which is formed at the same time as the pixel electrode.

A conductive film 909 includes a portion functioning as the gate electrode of the third thin film transistor 173, and is connected to the fifth wiring 505 through the wiring 955.

A conductive film 910 includes a portion functioning as the first electrode of the fifth thin film transistor 175, and is connected to the fifth wiring 505 through a wiring 959 which is formed at the same time as the pixel electrode.

A conductive film 911 includes portions functioning as the second electrode of the fifth thin film transistor 175 and the second electrode of the seventh thin film transistor 177, and is connected to the conductive film 903 through a wiring 958 which is formed at the same time as the pixel electrode.

A conductive film 912 includes a portion functioning as the gate electrode of the fifth thin film transistor 175, and is connected to the first wiring 501 through a wiring 960 which is formed at the same time as the pixel electrode.

A conductive film 913 includes a portion functioning as the second electrode of the sixth thin film transistor 176, and is connected to the conductive film 903 through a wiring 957 which is formed at the same time as the pixel electrode.

A conductive film 914 includes a portion functioning as the gate electrode of the seventh thin film transistor 177, and is connected to the second wiring 502 through a wiring 962 which is formed at the same time as the pixel electrode.

A conductive film 915 includes a portion functioning as the gate electrode of the eighth thin film transistor 178, and is connected to the conductive film 912 through a wiring 961 which is formed at the same time as the pixel electrode.

A conductive film 916 includes a portion functioning as the second electrode of the eighth thin film transistor 178, and is connected to the conductive film 906 through a wiring 953 which is formed at the same time as the pixel electrode. Note that parts of microcrystalline semiconductor layers 981 to 988 function as channel formation regions of the first to eighth thin film transistors, respectively.

When the circuits as shown in FIGS. 17 and 18 include a transistor using a microcrystalline semiconductor, the layout area can be reduced. Accordingly, a frame of the light-emitting device can be reduced. For example, field-effect mobility of a transistor using a microcrystalline semiconductor film is higher than that of a transistor using an amorphous semiconductor film; thus, the channel width of the transistor can be reduced. As a result, a frame of the light-emitting device can be narrowed. As an example, the channel width of the second thin film transistor 172 is preferably 3000 µm or less, and more preferably 2000 µm or less.

Note that in the second thin film transistor 172 of FIG. 18, a period during which a low-level signal is output to the third wiring 503 is long. In this period, the second thin film transistor 172 is kept on. Therefore, extreme stress is applied to the second thin film transistor 172, and characteristics of the transistor are likely to deteriorate. When the characteristics of the transistor deteriorate, the threshold voltage is gradually increased. Thus, a current value is decreased. In order to supply enough current even when the transistor deteriorates, the channel width of the second thin film transistor 172 is preferably large. Alternatively, deterioration of a transistor is preferably compensated for so that a circuit operation is not affected even when the transistor deteriorates. For example, it is preferable that a transistor be provided in parallel with the second thin film transistor 172, and the transistor and the second thin film transistor 172 be made to be alternately turned on, so that switching characteristics are not likely to be affected by deterioration.

Note that a transistor using a microcrystalline semiconductor film is not likely to deteriorate compared with a transistor using an amorphous semiconductor film. Accordingly, when the microcrystalline semiconductor film is used, the channel width of the transistor can be reduced. Alternatively, the transistor can be normally operated without any circuit for compensation for deterioration. Accordingly, the layout area can be reduced.

Figure 15A:
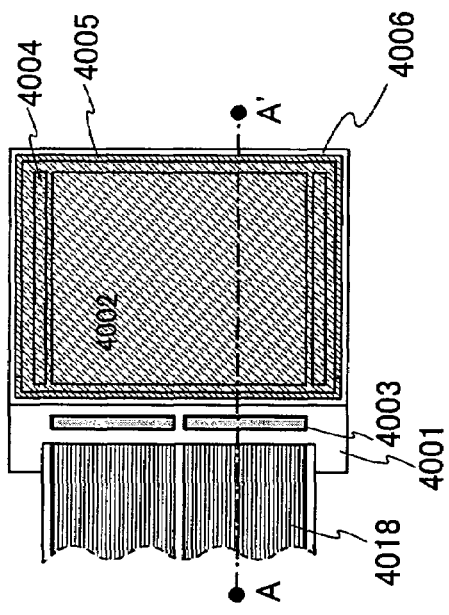
FIGS. 15A and 15B are a top view and a cross-sectional view showing a light-emitting display panel of the present invention, respectively.
Figure 15B:
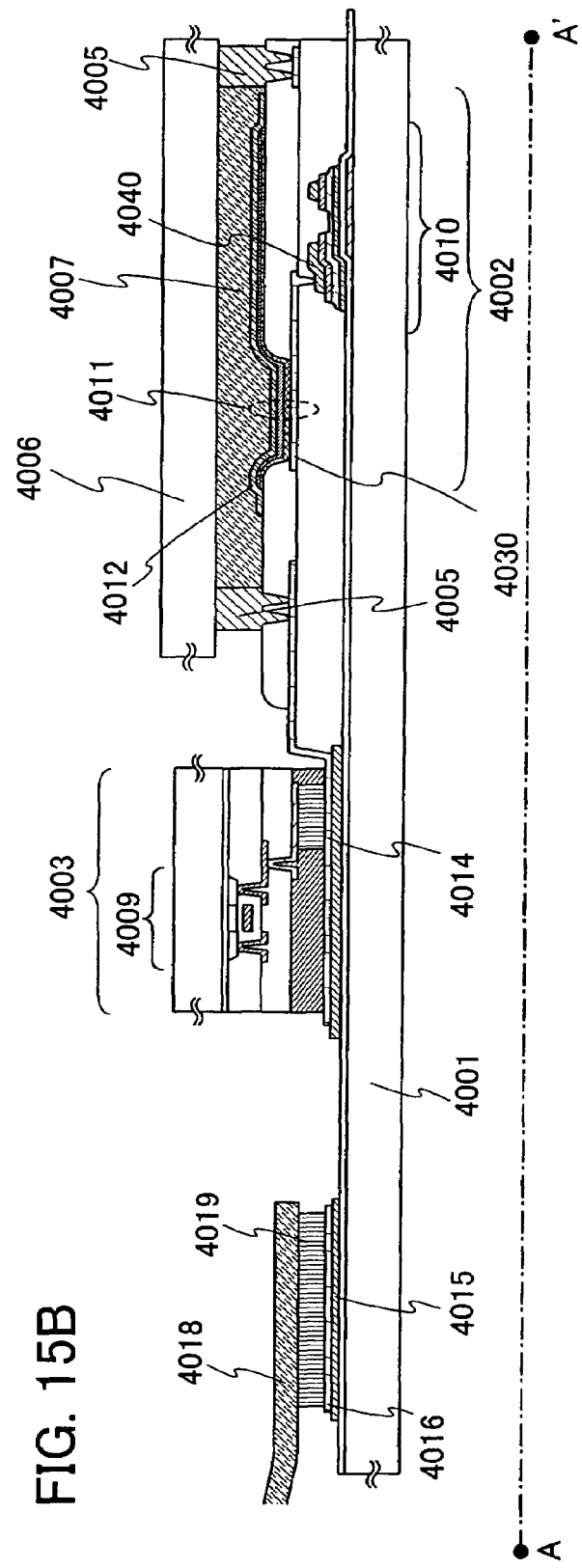

Next, the appearance and a cross section of a light-emitting display panel which is one mode of the light-emitting device of the present invention are described with reference to FIGS. 15A and 15B. FIG. 15A is a top plan view of a panel. In the panel, a thin film transistor in which a microcrystalline semiconductor film is used for a channel formation region and a light-emitting element which are formed over a first substrate are sealed between the first substrate and a second substrate by a sealing material. FIG. 15B is a cross-sectional view along a line A-A' in FIG. 15A.

A sealing material 4005 is provided so as to surround a pixel portion 4002 and a scan line driver circuit 4004 which are provided over a first substrate 4001. A second substrate 4006 is provided over the pixel portion 4002 and the scan line driver circuit 4004. Accordingly, the pixel portion 4002 and the scan line driver circuit 4004 are sealed together with a filler 4007 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIGS. 15A and 15B illustrate a thin film transistor 4009 formed using a polycrystalline semiconductor film, which is included in the signal line driver circuit 4003.

Each of the pixel portion 4002 and the scan line driver circuit 4004 which are provided over the first substrate 4001 includes a plurality of thin film transistors. FIG. 15B illustrates the thin film transistor 4010 included in the pixel portion 4002. Note that in this embodiment mode, description is made on the assumption that the thin film transistor 4010 is a driving TFT; however, the thin film transistor 4010 may be a TFT for current control or a TFT for erasing. The thin film transistor 4010 corresponds to a thin film transistor in which a microcrystalline semiconductor film is used for a channel formation region.

Reference numeral 4011 denotes a light-emitting element. A pixel electrode 4030 included in the light-emitting element 4011 is electrically connected to a source or drain electrode 4040 of the thin film transistor 4010. Moreover, in this embodiment mode, a light-transmitting conductive material 4012 of the light-emitting element 4011 is electrically connected. Note that a structure of the light-emitting element 4011 is not limited to that described in this embodiment mode. The structure of the light-emitting element 4011 can be changed as appropriate depending on a direction in which light is extracted from the light-emitting element 4011, the polarity of the thin film transistor 4010, or the like.

Although not shown in the cross-sectional view of FIG. 15B, a variety of signals and a potential supplied to the separately formed signal line driver circuit 4003, the pixel portion 4002, and the scan line driver circuit 4004 are supplied from an FPC 4018 through lead wirings 4014 and 4015.

In this embodiment mode, a connection terminal 4016 is formed using the same conductive film as the pixel electrode 4030 included in the light-emitting element 4013. Further, the lead wirings 4014 and 4015 are formed using the same conductive film as the wiring 4040 which serves as a source electrode or a drain electrode.

The connection terminal 4016 is electrically connected to a terminal included in the FPC 4018 through an anisotropic conductive film 4019.

The substrate located in the direction in which light is extracted from the light-emitting element 4011 needs to have a light-transmitting property. In this case, a light-transmitting material such as a glass plate, a plastic plate, a polyester film, or an acrylic film is used.

As the filler 4007, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used for the filler 4007.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element as appropriate. Further, the polarizing plate or the circular polarizing plate may be provided with an antireflection film. For example, anti-glare treatment for diffusing reflected light by unevenness of the surface and reducing reflection can be performed.

FIGS. 15A and 15B illustrate an example in which the signal line driver circuit 4003 is separately formed and attached to the first substrate 4001; however, this embodiment mode is not limited to this structure. A scan line driver circuit may be separately formed and attached to a substrate, or only part of a signal line driver circuit or part of a scan line driver circuit may be separately formed and attached to a substrate.

This embodiment mode can be implemented in combination with any of the structures described in the other embodiment modes.

Embodiment Mode 4

The light-emitting device obtained by the present invention, and the like can be used for an active matrix EL module. That is, the present invention can be implemented in any of electronic devices having a display portion into which such an active matrix EL module is incorporated.

Figure 11A:
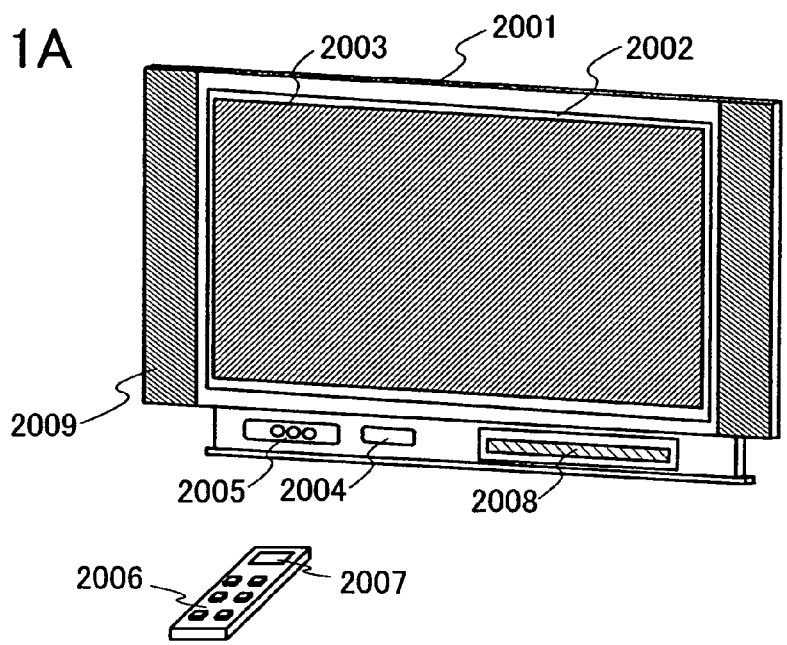
FIGS. 11A to 11D are perspective views showing electronic devices each using a light-emitting device of the present invention.
Figure 11B:
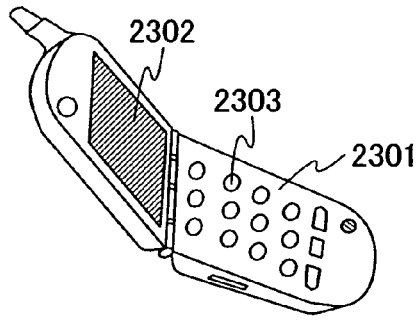
Figure 11C:
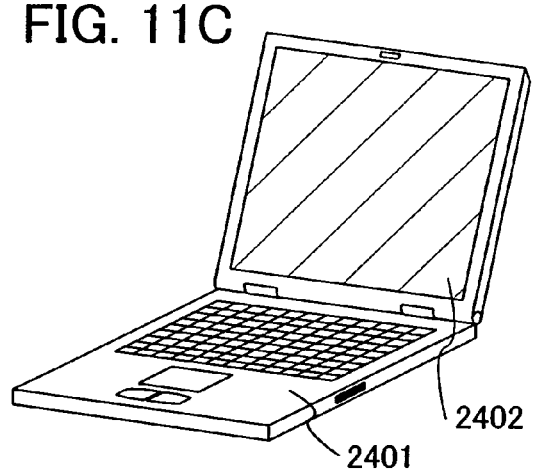

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 11A to 11C show examples of such electronic devices.

FIG. 11A shows a television device. The television device can be completed by incorporating a display module into a housing as shown in FIG. 11A. A display panel at the stage after an FPC is attached is also referred to as a display module. A main screen 2003 is formed using the display module, and other accessories such as a speaker portion 2009 and an operation switch are provided. Thus, the television device can be completed.

As shown in FIG. 11A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a light-emitting display panel with an excellent viewing angle, and the sub screen may be formed using a light-emitting display panel in which display is performed with low power consumption. Alternatively, when reduction in power consumption is prioritized, a structure may be employed in which the main screen 2003 is formed using a light-emitting display panel, the sub screen is formed using a light-emitting display panel, and the sub screen can be turned on and off.

Figure 12:
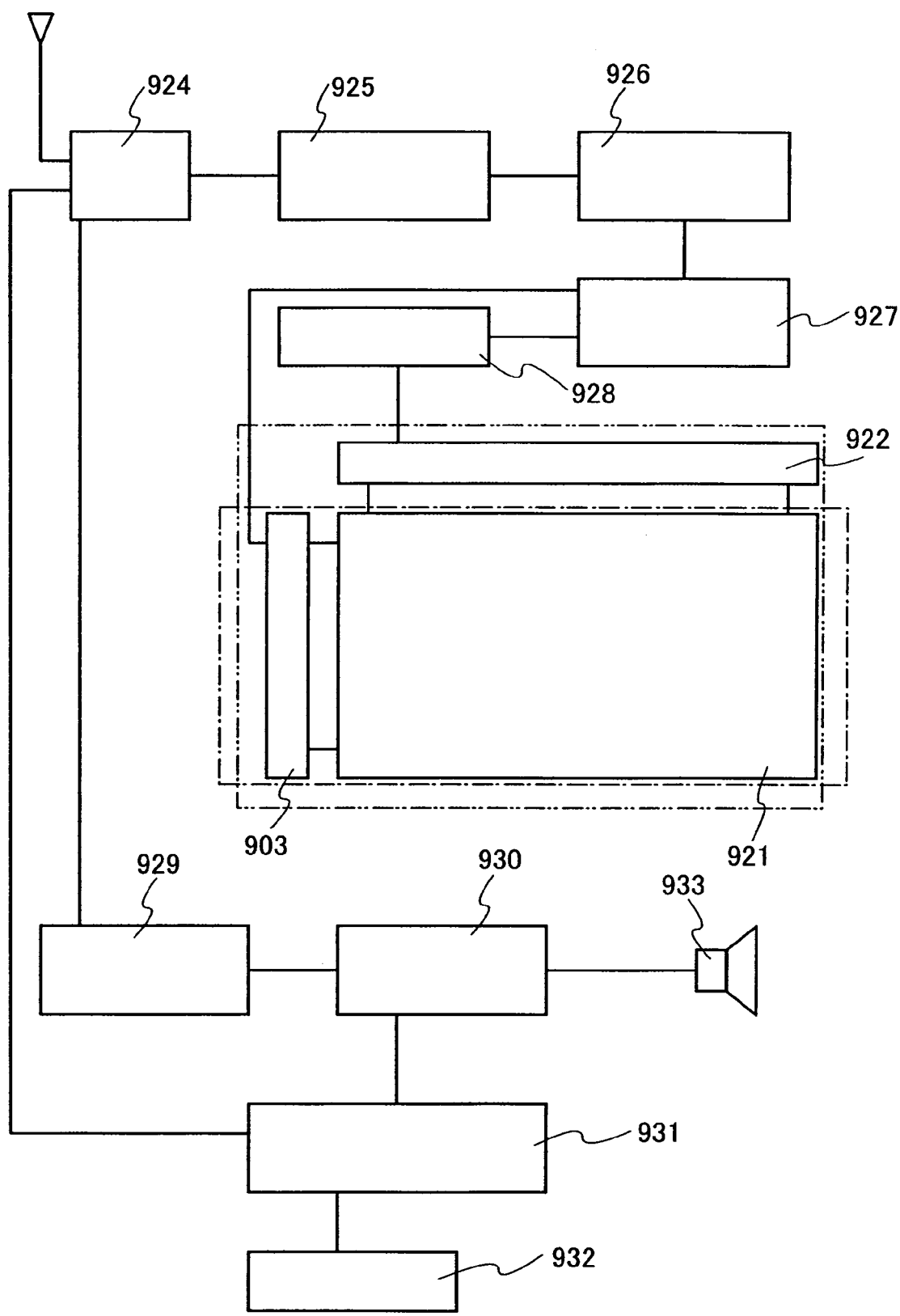
FIG. 12 is a diagram showing an electronic device using a light-emitting device of the present invention.

FIG. 12 is a block diagram of a main structure of a television device. A display panel is provided with a pixel portion 921. A signal line driver circuit 922 and a scan line driver circuit 923 may be mounted on the display panel by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to various uses, e.g., a monitor of a personal computer, a large display medium such as an information display board at the train station, the airport, or the like, or an advertisement display board on the street, and the like.

FIG. 11B shows an example of a cellular phone 2301. The cellular phone 2301 includes a display portion 2302, an operation portion 2303, and the like. When the light-emitting device described in the above-described embodiment mode is used for the display portion 2302, mass productivity can be increased.

A portable computer shown in FIG. 11C includes a main body 2401, a display portion 2402, and the like. When the light-emitting device described in the above-described embodiment mode is used for the display portion 2402, mass productivity can be increased.

Figure 11D:
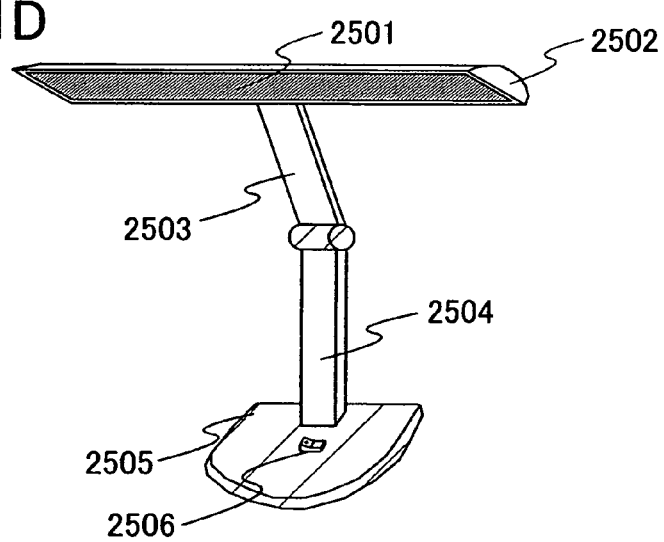

FIG. 11D shows a desk lamp including a lighting portion 2501, a shade 2502, an adjustable arm 2503, a support 2504, a base 2505, and a power supply switch 2506. The desk lamp is formed using the light-emitting device, which is formed using a thin film transistor of the present invention, for the lighting portion 2501. Note that a lamp includes a ceiling light, a wall light, and the like in its category. By a method of manufacturing the thin film transistor of the present invention, manufacturing cost can be significantly reduced, and an inexpensive desk lamp can be provided.

Embodiment 1

Figure 20A:
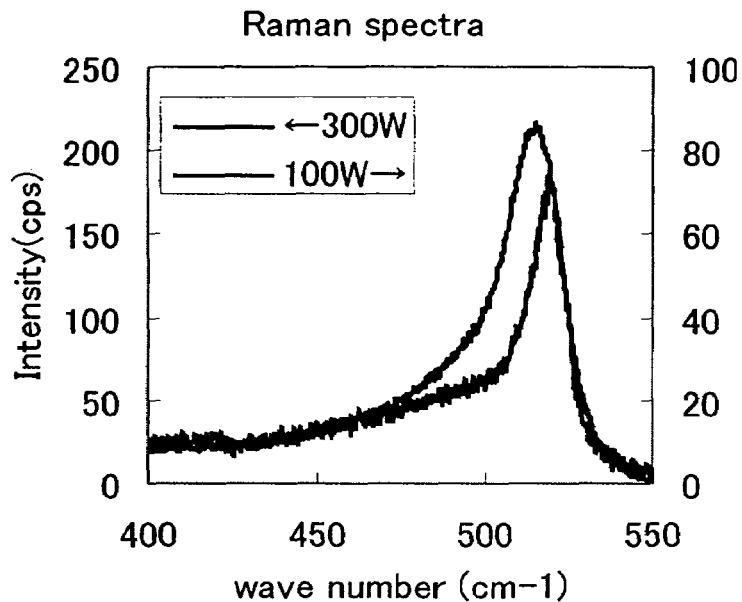
FIGS. 20A and 20B are diagrams showing results of measurement of a microcrystalline semiconductor film by Raman spectroscopy.
Figure 20B:
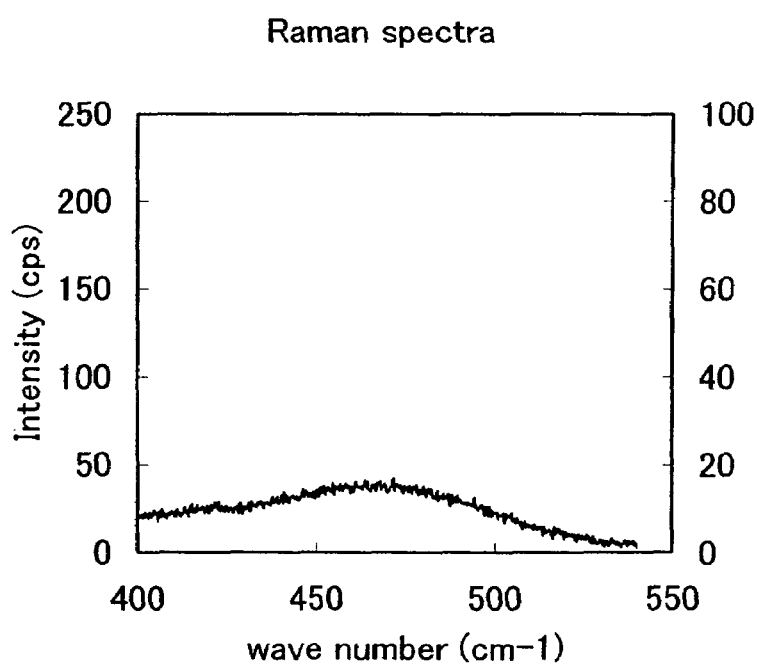

A microcrystalline silicon film was formed, and results of measuring the crystallinity of the film by Raman spectroscopy are shown in FIGS. 20A and 20B.

The microcrystalline silicon film was formed under conditions where the RF power frequency was 13.56 MHz, the film formation temperature was 280° C., the flow rate ratio of hydrogen to a silane gas was 100:1, and the pressure was 280 Pa. FIG. 20A shows Raman scattering spectra and shows a comparison of measurement results of a microcrystalline silicon film that was formed with the amount of power of an RF power source being 100 W and a microcrystalline silicon film with 300 W.

Note that the crystalline peak position of single-crystal silicon is at 520.6 $cm^{-1}$. Note that, needless to say, the crystalline peak of amorphous silicon cannot be measured, and only a broad peak is measured at 480 $cm^{-1}$ as shown in FIG. 20B. The microcrystalline silicon film of this specification refers to one whose crystalline peak position can be observed at greater than or equal to 481 $cm^{-1}$ and less than 520.6 $cm^{-1}$ when measured with a Raman spectrometer.

The crystalline peak position of the microcrystalline silicon film which was formed with the amount of power of an RF power source being 100 W is at 518.6 $cm^{-1}$; the full width at half maximum (FWHM) is 11.9 $cm^{-1}$; and the crystalline/amorphous peak intensity ratio ($I_c/I_a$) is 4.1.

The crystalline peak position of the microcrystalline silicon film that was formed with the amount of power of an RF power source being 300 W is at 514.8 $cm^{-1}$; the full width at half maximum (FWHM) is 18.7 $cm^{-1}$; and the crystalline/amorphous peak intensity ratio ($I_c/I_a$) is 4.4.

As shown in FIG. 20A, there is a peak shift and a large difference in full width at half maximum depending on RF power. It can be considered that this is because the grain size is likely to be small, because ion bombardment becomes significant at high power and the growth of grains is inhibited. In addition, because the power frequency of a CVD apparatus, with which the microcrystalline silicon film used for measurement of FIG. 20A was formed, is 13.56 MHz, the crystalline/amorphous peak intensity ratio ($I_c/I_a$) is 4.1 or 4.4. However, it is also confirmed that the crystalline/amorphous peak intensity ratio ($I_c/I_a$) can be 6 if the RF power frequency is 27 MHz. Accordingly, the crystalline/amorphous peak intensity ratio ($I_c/I_a$) can be further increased when the RF power frequency is higher than 27 MHz, for example, when the RF power frequency is 2.45 GHz.

Embodiment 2

In this embodiment, an example is described, in which an inverted staggered thin film transistor with a channel etch structure is manufactured by a method in which a microcrystalline semiconductor film is formed over a gate insulating film which has been (or which is being) affected by hydrogen plasma so that a microcrystalline nucleus is generated on the surface of the gate insulating film and crystal growth is accelerated.

First, a gate electrode 251 is formed over a substrate 250. The gate electrode 251 is formed using a metal material such as titanium, molybdenum, chromium, tantalum, tungsten, copper, or aluminum or an alloy material thereof. When a large-size display device is to be manufactured, aluminum or an aluminum alloy is used because a low-resistance gate electrode is preferable. Furthermore, in order to prevent formation of a hillock on aluminum, or the like, a stacked layer of an aluminum-containing film and a high-melting-point metal film is preferable. Here, a stacked layer of a neodymium-containing aluminum film and a molybdenum film is used. The total thickness of the gate electrode which is formed of a stacked layer is set to be 300 nm. In addition, for electrical connection to a terminal electrode to be connected to an FPC in a later step, a contact hole reaching the gate electrode 251 is formed. In order to reduce the number of steps, it is preferable that the same mask be used for formation of a contact hole reaching a source or drain electrode which is to be formed later and for formation of the contact hole reaching the gate electrode 251. Furthermore, when both the gate electrode and a source electrode are formed using the same material as their main components, etching margin can be expanded.

Note that, because a semiconductor film and a wiring are to be formed over the gate electrode 251, it is preferable that the gate electrode 251 be processed to have a tapered edge portion for prevention of disconnection.

Figure 21A:
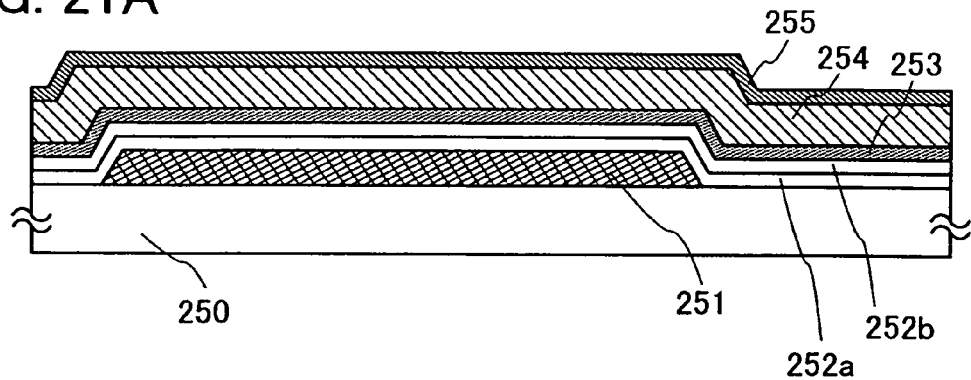
FIGS. 21A to 21C are diagrams showing examples of process cross-sectional views and a pixel top view.

Next, over the gate electrode 251, gate insulating films 252*a* and 252*b*, a microcrystalline semiconductor film 253, a buffer layer 254, and a semiconductor film 255 to which an impurity imparting one conductivity type is added are sequentially formed (see FIG. 21A). The gate insulating films 252*a* and 252*b* can each be formed using a silicon oxide film, a silicon nitride film, a silicon oxynitride film, or a silicon nitride oxide film by a CVD method, a sputtering method, or the like. Here, a mode is described, in which the gate insulating films 252*a* and 252*b* are formed by sequential stacking of a silicon oxide film or a silicon oxynitride film, and a silicon nitride film or a silicon nitride oxide film. In this embodiment, the total thickness of the gate insulating film which is formed using a stacked layer is set to be 300 nm.

In this embodiment, the microcrystalline semiconductor film 253 is formed on the surface of the gate insulating film 252*b* which is being (or which has been) affected by hydrogen plasma.

By formation of a microcrystalline semiconductor film over a gate insulating film which has been affected by hydrogen plasma, crystal growth of microcrystal can be accelerated. This is because, with hydrogen plasma, the surface of the gate insulating film can be terminated with hydrogen and can be inactivated. Therefore, the resulting microcrystalline semiconductor film can be made to have high electric characteristics and high reliability.

The microcrystalline semiconductor film 253 is formed in such a manner that the flow rate of a silicon gas is increased whereas the flow rate of hydrogen is decreased as film formation proceeds so that the flow rate ratio of hydrogen to a silicon gas becomes lower. For example, the microcrystalline semiconductor film 253 may be formed in such a manner that the flow rate ratio of hydrogen to a silicon gas is set to be about 1000:1 at the start of film formation and the flow rate of the silicon gas is gradually increased whereas the flow rate of hydrogen is gradually decreased so that the flow rate ratio becomes about 50:1 at the end of film formation. The flow rates of hydrogen and the silicon gas may be controlled step-by-step so that the flow rates are changed at regular intervals or may be controlled continuously. Immediately after the start of film formation, time may be allocated for hydrogen plasma processing, during which a silicon gas is not supplied as a film formation gas (that is, the flow rate of a silicon gas is set to be 0) and only hydrogen is supplied. For example, silane can be used as a silicon gas.

In this embodiment, the flow rates of hydrogen and the silicon gas are further controlled so that the flow rate of hydrogen is decreased and that of the silicon gas is increased to lower the flow rate ratio of hydrogen to the silicon gas, whereby the buffer layer is successively formed over the microcrystalline semiconductor film. The step of forming the buffer layer may be performed using only the silicon gas (a silicon hydride gas or a silicon halide gas) with the flow rate of hydrogen further decreased. Without any exposure of the growing surface of the microcrystalline semiconductor film 253 to the atmosphere, an amorphous semiconductor film can be formed as the buffer layer over the microcrystalline semiconductor film.

By control of the flow rate ratio of hydrogen to the silicon gas in the film formation gas for the microcrystalline semiconductor film 253, hydrogen plasma processing of the surface of the gate insulating film 252*b*, formation of the microcrystalline semiconductor film 253, and formation of the buffer layer 254 can be performed successively. For example, the flow rates of hydrogen and the silicon gas may be controlled in such a manner that the flow rate ratio of hydrogen to the silicon gas is set to be 1000:1 at the start of formation of the microcrystalline semiconductor film and the flow rate of hydrogen is gradually decreased and that of the silicon gas is gradually increased so that the flow rate ratio becomes about 50:1 at the end of formation of the microcrystalline semiconductor film 53.

In addition, the oxygen concentration of the microcrystalline semiconductor film 253 is preferably $5\times10^{19}$ cm$^{-3}$ or less, more preferably, $1\times10^{19}$ cm$^{-3}$ or less and each of the nitrogen concentration and the carbon concentration is preferably $1\times10^{18}$ cm$^{-3}$ or less. By decreases in concentrations of oxygen, nitrogen, and carbon to be mixed into the microcrystalline semiconductor film, the microcrystalline semiconductor film can be prevented from being changed into an n type.

The microcrystalline semiconductor film 253 obtained in this embodiment has needle-like crystal which has grown longitudinally from the lower side (the substrate 250 side) to the upper side. The microcrystalline semiconductor film has a mixed structure of amorphous and crystalline structures, and it is likely that a crack is generated and a gap is formed between the crystalline region and the amorphous region due to local stress. A new radical may be interposed into this gap and cause crystal growth. Because the upper crystal face is larger, crystal is likely to grow upward into a needle shape. Even if the microcrystalline semiconductor film grows longitudinally as described above, the growth rate is a tenth to a hundredth of the film formation rate of an amorphous semiconductor film.

In this embodiment, the thickness of the microcrystalline semiconductor film 253 is 25 nm; the thickness of the buffer layer 254 is 125 nm; and the thickness of the semiconductor film 255 to which an impurity imparting one conductivity type is added is 50 nm.

Next, a mask is formed over the semiconductor film 255 to which an impurity imparting one conductivity type is added. The mask is formed by a photolithography technique or an inkjet method. Note that at least the gate insulating films 252*a* and 252*b*, the microcrystalline semiconductor film 253, and the buffer layer 254 may be formed successively. By successive formation of at least the gate insulating films 252*a* and 252*b*, the microcrystalline semiconductor film 253, and the buffer layer 254 without any exposure to the atmosphere, each interface between stacked layers can be formed without being contaminated by an atmospheric constituent or a contaminant impurity element floating in the atmosphere. Thus, variations in characteristics of thin film transistors can be reduced.

Next, the microcrystalline semiconductor film 253, the buffer layer 254, and the semiconductor film 255 to which an impurity imparting one conductivity type is added are etched using the mask into a microcrystalline semiconductor film 261, a buffer layer, and a semiconductor film to which an impurity imparting one conductivity type is added, each of which has a desired upper surface shape. Through this processing, it is preferable that each edge portion have a tapered cross-sectional shape. By etching into a tapered shape, the semiconductor film to which an impurity imparting one conductivity type is added and the microcrystalline semiconductor film 261 can be prevented from being in direct contact with each other. The taper angle of the edge portion is 30° to 90°, preferably, 45° to 80°. Accordingly, the distance between the semiconductor film to which an impurity imparting one conductivity type is added and the microcrystalline semiconductor film 261 can be increased and leakage current can be prevented from being generated. In addition, disconnection of a wiring due to a step shape can be prevented.

Then, the mask is removed. Next, over the semiconductor film to which an impurity imparting one conductivity type is added and the gate insulating film 252b, a conductive film is formed. The conductive film is formed using a single layer or a stacked layer of aluminum, copper, or an aluminum alloy to which an element to improve heat resistance or an element to prevent a hillock such as silicon, titanium, neodymium, scandium, or molybdenum is added. In this embodiment, the conductive film is formed by sequentially stacking of three layers of a molybdenum film, an aluminum film, and a molybdenum film to a total thickness of 300 nm. Because a molybdenum film is used for the gate electrode 251 in common with this conductive film, when a sputtering method is employed, the same target can be used and material cost can be reduced. Then, another mask is formed over the conductive film.

Next, the conductive film is divided into respective electrodes or wirings by etching using the mask to form source and drain electrodes 271a to 271c. In this embodiment, the conductive film is etched by wet etching. Because wet etching is isotropic etching, the edge portions of the mask are not aligned with the edge portions of the source and drain electrodes 271a to 271c, and the top shape of the source and drain electrodes 271a to 271c has a smaller size than the top shape of the mask.

Next, with the use of the same mask without change, the semiconductor film to which an impurity imparting one conductivity type is added and the buffer layer are etched to form source and drain regions 272 and a buffer layer 273. Here, by dry etching, the buffer layer 273 is etched only partly. Note that the buffer layer 273 covers the microcrystalline semiconductor film 261 so that the surface of the microcrystalline semiconductor film 261 is not exposed. The buffer layer 273 prevents the generation of a parasitic channel and also functions as a stopper in etching for the source and drain regions. The buffer layer 273 over the microcrystalline semiconductor film 261 blocks external air and an etching residue with hydrogen contained therein and protects the microcrystalline semiconductor film 261. The buffer layer 273 can stop radicals in etching. If a structure is such that the buffer layer 273 is not provided and only the microcrystalline semiconductor film 261 is provided, oxidation occurs in the thickness direction and electric characteristics of a transistor are impaired. For example, a decrease in field-effect mobility and an increase in subthreshold swing (S value) are caused. Of materials that can be used for the buffer layer 273, a particularly effective material as a measure to prevent oxidation is a hydrogen-containing amorphous silicon film. Even if a groove portion is formed by etching, the surface is terminated with hydrogen; thus, oxidation can be prevented.

The buffer layer 273 is etched partly, and a groove portion is formed between the source and drain electrodes 271a to 271c. By formation of the groove portion, a part of the semiconductor film to which an impurity imparting one conductivity type is added, which is above the groove portion, can be removed totally, and a parasitic channel can be prevented from being formed due to a residual impurity imparting one conductivity type such as phosphorus.

In addition, edge portions of the groove portion of the buffer layer 273 are roughly aligned with the edge portions of the source and drain regions 272. This groove portion is formed in the same etching process as etching for forming the source and drain regions 272. Accordingly, the process is a self-aligning process through which the groove portion roughly coincides with an opening portion of the same mask that is a photoresist mask. Formation of the groove portion in the buffer layer 273 is effective in increasing the length of a region where leakage current flows and reducing off current. In addition, the microcrystalline semiconductor film 261 is covered with the buffer layer so that the surface of the microcrystalline semiconductor film 261 is not exposed, and hydrogen and/or fluorine are/is mixed into the buffer layer, which is effective in preventing oxygen from entering and oxidizing the microcrystalline semiconductor film 261.

A portion of the buffer layer 273 below the source and drain regions 272 and a portion of the buffer layer 273 above a channel formation region of the microcrystalline semiconductor film 261 are formed of the same material (with each of the carbon, nitrogen, and oxygen concentrations being $3 \times 10^{19}$ cm$^{-3}$ or less, preferably, $5 \times 10^{18}$ cm$^{-3}$ or less), formed at the same time, and have the groove portion.

The groove portion of the buffer layer 273 is a region which separates the source region and the drain region from each other and is processed into a groove shape to reduce leakage current between the source and drain regions, and has such a remaining thickness as to be able to prevent the microcrystalline semiconductor film located therebelow from being oxidized. On the other hand, regions of the buffer layer 273, which overlap with the microcrystalline semiconductor film and the source and drain regions, have a thickness of 50 nm to 400 nm and form high-resistance regions which can increase withstand voltage. By provision of the buffer layer 273 between the gate electrode 251 and the source and drain electrodes 271a to 271c, an impurity imparting one conductivity type, which is contained in the source and drain regions, and an impurity imparting one conductivity type, which is used for control of threshold voltage of the microcrystalline semiconductor film, can be prevented from being mixed with each other. When different impurities imparting one conductivity type are mixed with each other, a recombination center is generated, which leads to flow of leakage current and loss of the effect of reducing off current.

In this embodiment, it can also be said that high-resistance regions each with a thickness of 125 nm are provided between the gate electrode 251 and the source and drain electrodes 271a to 271c. The buffer layer 273 under the source and drain regions 272 is extended over and overlaps with the microcrystalline semiconductor film 261 where the channel formation region is formed.

In addition, the edge portions of the source and drain electrodes 271a to 271c are not aligned with the edge portions of the source and drain regions 272, and the edge portions of the source and drain regions 272 are located outside of the edge portions of the source and drain electrodes 271a to 271c.

Next, the mask is removed.

Through the above-described process, a channel-etch thin film transistor 279 can be formed.

Next, an insulating film 276 is formed to cover the source and drain electrodes 271a to 271c, the source and drain regions 272, the buffer layer 273, the microcrystalline semiconductor film 261, and the gate insulating film 252b. Note that the insulating film 276 is provided to prevent entry of a contaminant impurity such as an organic substance, a metal substance, or moisture floating in the atmosphere and is preferably a dense film. In this embodiment, as the insulating film 276, a silicon nitride film is formed to a thickness of 300 nm. Note that, by use of a silicon nitride film as the insulating film 276, the oxygen concentration in the buffer layer 273 can be made to be $1 \times 10^{19}$ atoms/cm$^3$ or less, preferably, $5 \times 10^{18}$ atoms/cm$^3$ or less.

Next, a mask is formed over the insulating film 276, and selective etching is performed to form a contact hole. In this embodiment, a first contact hole reaching the source or drain electrode 271c, a second contact hole reaching a source wiring which is electrically connected to the source electrode, and a third contact hole reaching the gate electrode 251 are formed. The first contact hole is formed in each pixel of the pixel portion and the second contact hole and the third contact hole are formed outside of the pixel portion. The second contact hole and the third contact hole are formed for electrical connection to a terminal electrode which is to be connected to an external terminal. In this embodiment, the molybdenum film functions as an etching stopper in each of the source or drain electrode 271c and the gate electrode 251; therefore, the contact holes can be formed using the same mask.

Figure 21B:
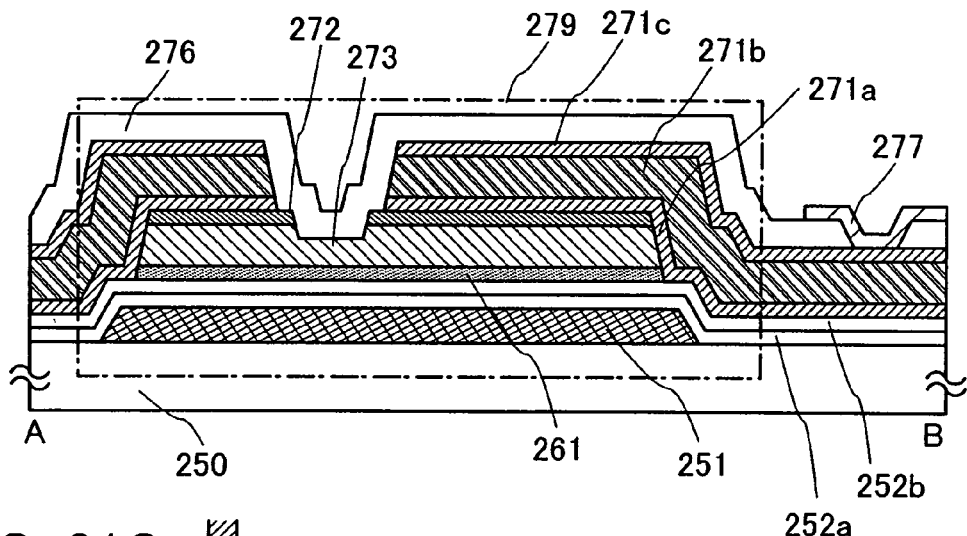
Figure 21C:
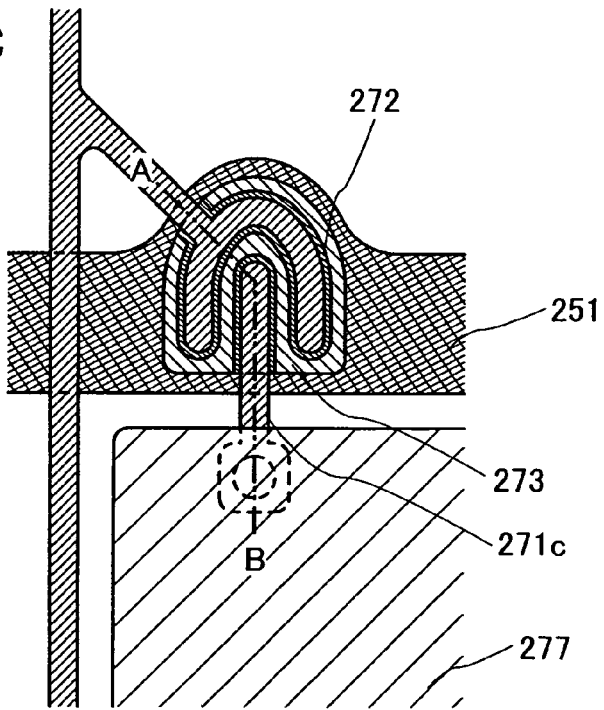

Next, a pixel electrode 277 and a terminal electrode or a connection electrode are formed. A cross-sectional view at this stage corresponds to FIG. 21B, and FIG. 21B corresponds to a cross-sectional view taken along a line A-B of FIG. 21C.

The pixel electrode 277 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 277 can be formed using a conductive composition containing a conductive high-molecular compound (also referred to as a conductive polymer). It is preferable that the pixel electrode formed using the conductive composition have a sheet resistance of 10000 Ω/square or less and a light transmittance of 70% or more at a wavelength of 550 nm. In addition, it is preferable that the resistivity of the conductive high-molecular compound contained in the conductive composition be 0.1 Ω·cm or less.

As the conductive high-molecular compound, a so-called a electron conjugated conductive high-molecular compound can be used. Examples include polyaniline and its derivatives, polypyrrole and its derivatives, polythiophene and its derivatives, copolymers of two or more kinds of them, and the like.

A channel-etch thin film transistor requires a smaller number of manufacturing steps and can achieve cost reduction. By formation of a channel formation region with a microcrystalline semiconductor film, a field-effect mobility of 1 cm$^2$/V·sec to 20 cm$^2$/V·sec can be achieved. Accordingly, this thin film transistor can be used as a switching element of a pixel in a pixel portion and also as an element included in a scan line (gate line) side driver circuit.

In the subsequent steps, according to Embodiment Mode 2, a light-emitting element may be manufactured as follows: a cathode is formed as a pixel electrode; a light-emitting layer containing an organic compound is formed thereover; and an anode is formed thereover.

This embodiment can be freely combined with any one of Embodiment Modes 1 to 4.

Embodiment 3

In this embodiment, an example of a manufacturing process in which a microcrystalline semiconductor film is irradiated with a laser beam is described with reference to FIGS. 22A to 22D.

Although not shown here, a gate electrode is formed over a substrate. Then, a gate insulating film 351 is formed to cover the gate electrode.

Figure 22A:
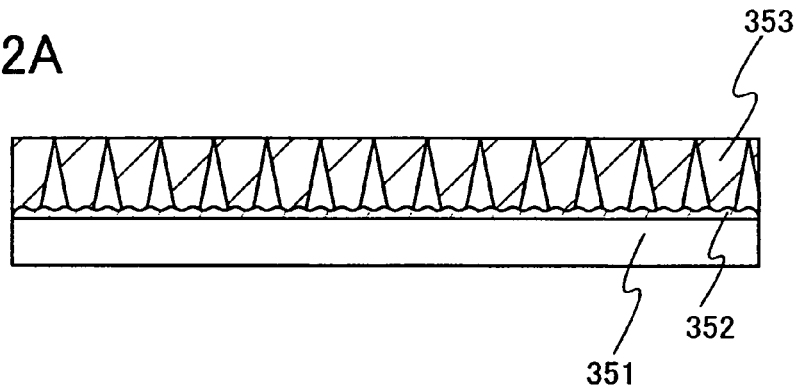
FIGS. 22A to 22D are cross-sectional views showing an example of a manufacturing process.

After that, as shown in FIG. 22A, a microcrystalline semiconductor film is formed over the gate insulating film 351.

In the case where the microcrystalline semiconductor film is formed over the gate insulating film 351 by a PCVD method or the like, a region which contains more amorphous component than a semiconductor film 353 containing crystals (here such a region is referred to as an interface region 352) is formed, in some cases, near the interface between the gate insulating film 351 and the semiconductor film 353. In the case where an ultra-thin microcrystalline semiconductor film with a thickness of about 10 nm or less is formed by a PCVD method or the like, although a semiconductor film containing microcrystalline grains can be formed, it is difficult to obtain a semiconductor film containing microcrystalline grains, which has high quality uniformly throughout the film. In these cases, a laser process for irradiation with a laser beam to be described below is effective.

Figure 22B:
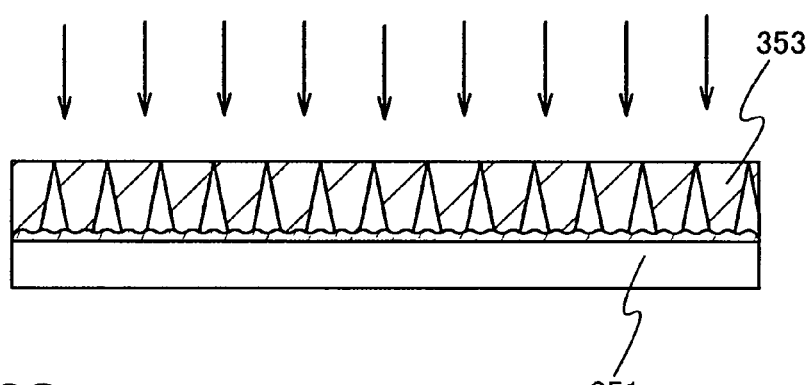

Next, as shown in FIG. 22B, the semiconductor film 353 is irradiated with a laser beam having such an energy density that the semiconductor film 353 is not melted, from the surface side using the crystals contained in the semiconductor film 353 as nuclei. This laser process (hereafter also referred to as "LP") involves solid-phase crystal growth which is performed by radiation heating without a microcrystalline silicon film being melted. That is, the process utilizes a critical region where a deposited microcrystalline silicon film is not brought into a liquid phase, and in that sense, the process can also be referred to as "critical growth".

Figure 22C:
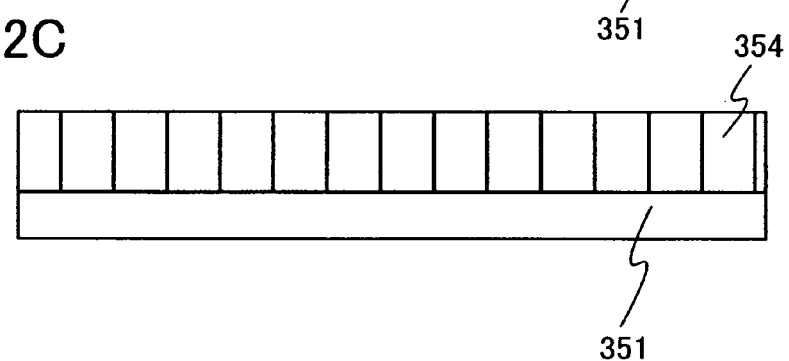
Figure 22D:
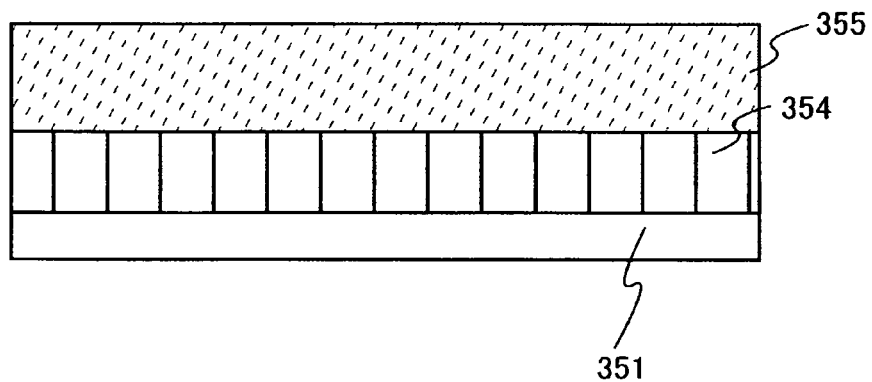

A cross-sectional view immediately after the irradiation with a laser beam is shown in FIG. 22C. For the laser beam, an excimer laser with a wavelength of 400 nm or less or a second harmonic (with a wavelength of 532 nm) to a fourth harmonic (with a wavelength of 266 nm) of a YAG laser or a YVO$_4$ laser is used as a light source. The laser beam is collected into a linear or spot shape with an optical system, and the energy density is adjusted within the range where the semiconductor film 353 is not melted. A predetermined region of the substrate is processed by being scanned with the laser beam collected as described above. Because it is acceptable as long as the laser beam has an energy density which is within the range where the semiconductor film 353 is not melted, the length of the linear laser beam can be increased or the spot area can be increased. As the length of the linear laser beam is increased, a large-size substrate can be processed in a shorter time.

The laser beam can affect a region to the interface between the microcrystalline silicon film and the gate insulating film.

Accordingly, using the crystals on the surface side of the microcrystalline silicon film as nuclei, solid-phase crystal growth advances from the surface toward the interface with the gate insulating film, and roughly columnar crystals grow. The solid-phase crystal growth by the LP process is not to increase the size of crystal grains but rather to improve crystallinity along a film thickness direction.

In the LP process, for example, a microcrystalline silicon film over a glass substrate of 730 mm×920 mm can be processed by a single laser beam scan when laser beam is collected into a long rectangular shape (a linear laser beam). In this case, the proportion of overlap of linear laser beams (the overlap rate) is set to be 0% to 90% (preferably, 0% to 67%). Accordingly, the length of processing time for each substrate can be shortened, and productivity can be increased. The shape of the laser beam is not limited to a linear shape, and similar processing can be achieved using a planar laser beam. In addition, the LP process of this embodiment is not limited by the size of the glass substrate and can be used for substrates of various sizes.

Such critical growth also has a feature in that unevenness (a projecting body called a ridge), which is observed on the surface of conventional low-temperature polysilicon, is not formed and the smoothness of silicon surface is maintained even after the LP process. As in this embodiment, a crystalline silicon film 354 which is obtained by the action of the laser beam directly on the microcrystalline silicon film after the formation is distinctly different in growth mechanism and film quality from a microcrystalline silicon film which is obtained by formation. In addition, it is also distinctly different in growth mechanism and film quality from a microcrystalline silicon film which is modified by conduction heating (the one disclosed in Reference 3).

In this specification, a crystalline semiconductor which is obtained through LP process of a microcrystalline semiconductor film after formation is referred to as a semi-crystalline semiconductor.

Next, a buffer layer 355 is stacked over the crystalline silicon film 354. In the case where a hydrogen-containing amorphous silicon film is used as the buffer layer 355, hydrogen termination of the crystalline silicon film 354 can also be performed at the same time as formation of the hydrogen-containing amorphous silicon film.

The subsequent steps are similar to those described in Embodiment Mode 1, in which a semiconductor film to which an impurity imparting one conductivity type is added is stacked and a mask is formed thereover. Next, using the mask, the microcrystalline semiconductor film, the buffer layer, and the semiconductor film to which an impurity imparting one conductivity type is added are divided by etching. Then, a conductive film is formed, and a mask is formed over the conductive film. Next, using the mask, the conductive film is divided by etching to form source and drain electrodes. Furthermore, using the same mask, etching is performed to form source and drain regions and to form a depression in the buffer layer.

Through the above-mentioned process, a channel-etch thin film transistor can be formed.

The LP process of this embodiment has effects in improving crystallinity of an interface region of the gate insulating film and improving electric characteristics of a transistor having a bottom gate structure.

This embodiment can be freely combined with any one of Embodiment Modes 1 to 4.

Embodiment 4

In this embodiment, results of device simulation of transistor characteristics and electron density distribution of the thin film transistor of the present invention are described. For device simulation, the device simulator "ATLAS" made by Silvaco is used.

Figure 23:
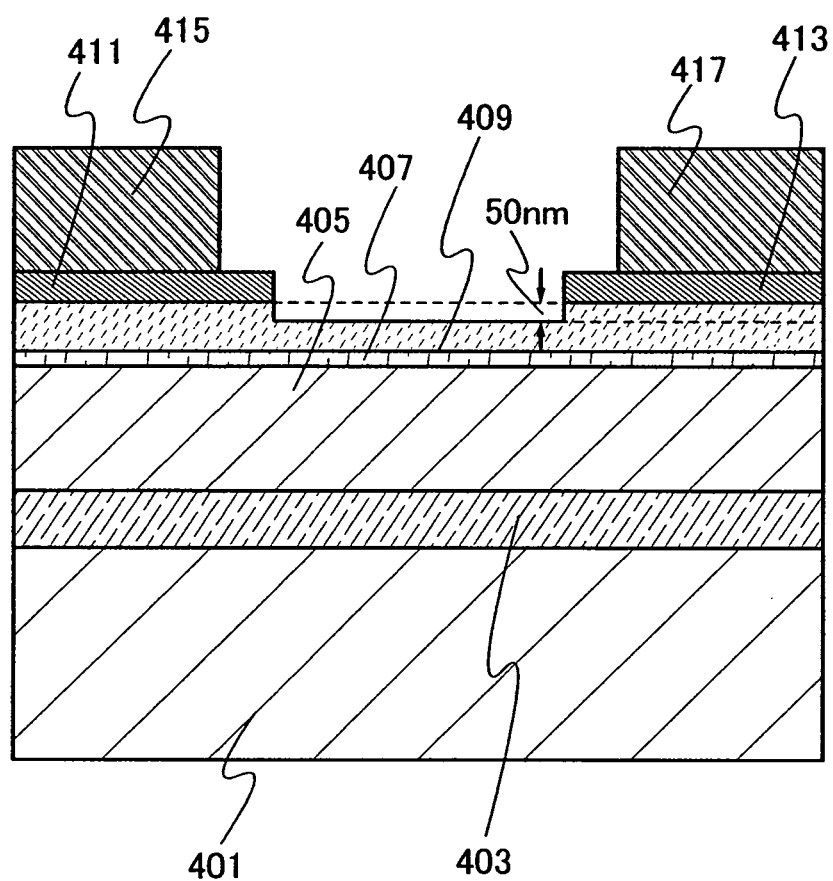
FIG. 23 is a model diagram showing a device structure.

FIG. 23 shows a device structure. An insulating substrate 401 is assumed to be a glass substrate (with a thickness of 0.5 µm) which contains silicon oxide (with a dielectric constant of 4.1) as its main component. Note that, although the thickness of the insulating substrate 401 is often 0.5 mm, 0.7 mm, or the like in a practical manufacturing process, the thickness is defined to be sufficient so that an electric field at the lower surface of the insulating substrate 401 does not affect thin film transistor characteristics.

Over the insulating substrate 401, a gate electrode 403 formed of molybdenum (with a thickness of 150 nm) is stacked. The work function of molybdenum is set to be 4.6 eV.

Over the gate electrode 403, a gate insulating film 405 having a stacked structure of a silicon nitride film (with a dielectric constant of 7.0 and a thickness of 110 nm) and a silicon oxynitride film (with a dielectric constant of 4.1 and a thickness of 110 nm) is stacked.

Over the gate insulating film 405, a µc-Si film 407 and an a-Si film 409 are stacked. Here, conditions are separately set for a stacked layer of the µc-Si film 407 with a thickness of 0 nm and the a-Si film 409 with a thickness of 100 nm, a stacked layer of the µc-Si film 407 with a thickness of 10 nm and the a-Si film 409 with a thickness of 90 nm, a stacked layer of the µc-Si film 407 with a thickness of 50 nm and the a-Si film 409 with a thickness of 50 nm, a stacked layer of the µc-Si film 407 with a thickness of 90 nm and the a-Si film 409 with a thickness of 10 nm, and a stacked layer of the µc-Si film 407 with a thickness of 100 nm and the a-Si film 409 with a thickness of 0 nm.

In addition, in regions of the a-Si film 409 overlapping with a first a-Si(n$^+$) film 411 and a second a-Si(n$^+$) film 413, other a-Si films each having a thickness of 50 nm are stacked over the a-Si film with the above-described thickness. That is, in a region where the first a-Si(n$^+$) film 411 and the second a-Si (n$^+$) film 413 are not formed, the a-Si film 409 is partly etched by 50 nm and has a depressed shape.

Over the a-Si film 409, the first a-Si(n$^+$) film 411 (with a thickness of 50 nm) and the second a-Si(n$^+$) film 413 (with a thickness of 50 nm) are stacked. In the thin film transistor shown in FIG. 23, the distance between the first a-Si(n$^+$) film 411 and the second a-Si(n$^+$) film 413 corresponds to a channel length L. Here, the channel length L is set to be 6 µm. The channel width W is set to be 15 µm.

Over the first a-Si(n$^+$) film 411 and the second a-Si(n$^+$) film 413, a source electrode 415 and a drain electrode 417, each of which is formed of molybdenum (Mo) (with a thickness of 300 nm), are formed, respectively. A contact between the source electrode 415 and the first a-Si(n$^+$) film 411 and that between the drain electrode 417 and the second a-Si(n$^+$) film 413 are defined as ohmic contacts.

Figure 24:
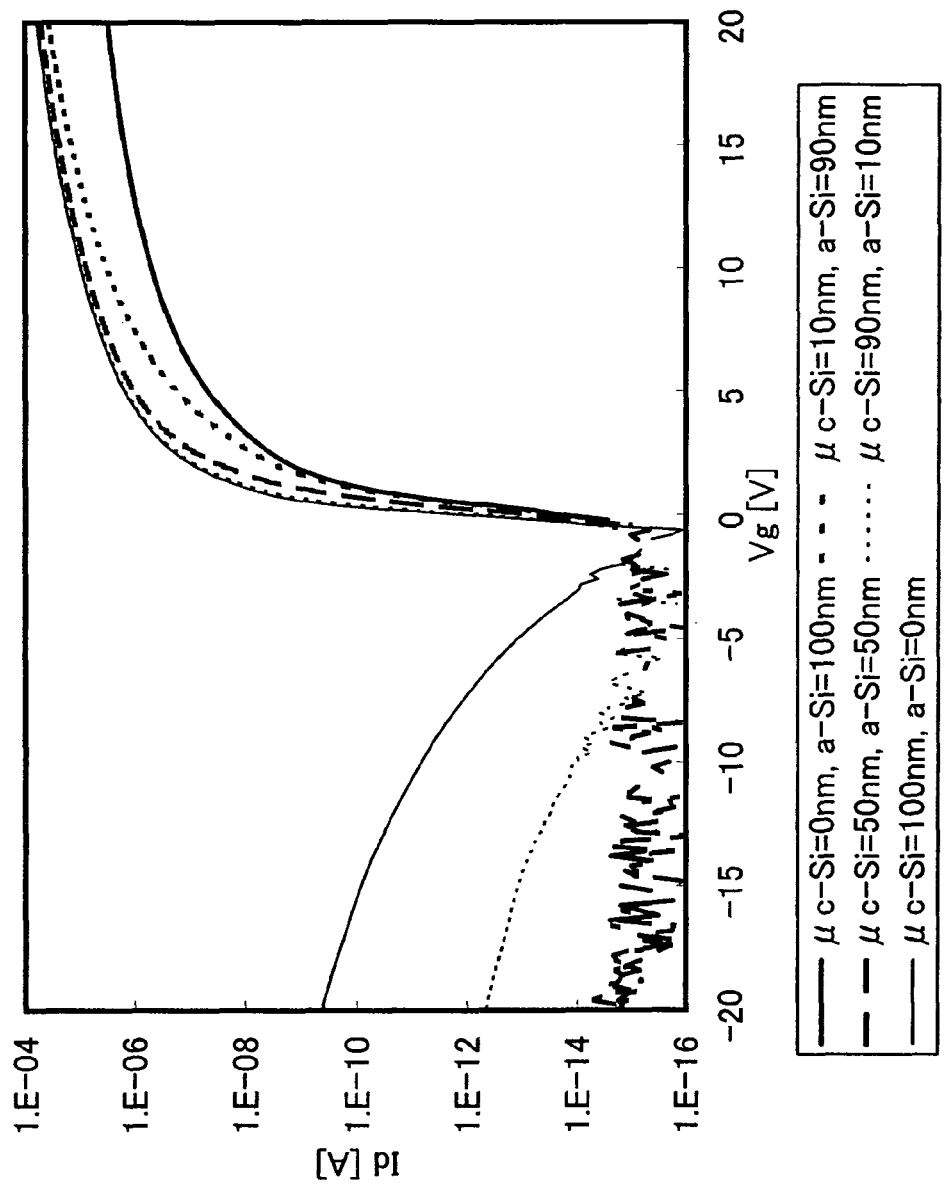
FIG. 24 is a diagram showing results of DC characteristics.
Figure 25A:
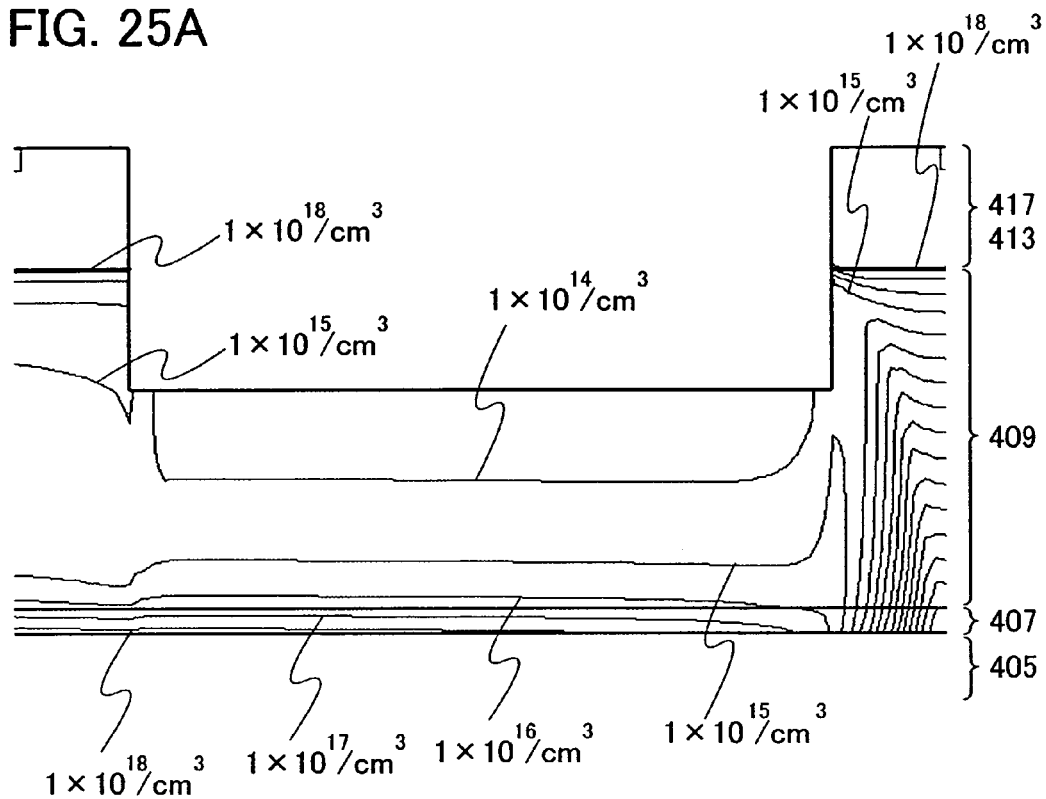
FIGS. 25A and 25B are diagrams each showing an electron concentration distribution of a thin film transistor.
Figure 25B:
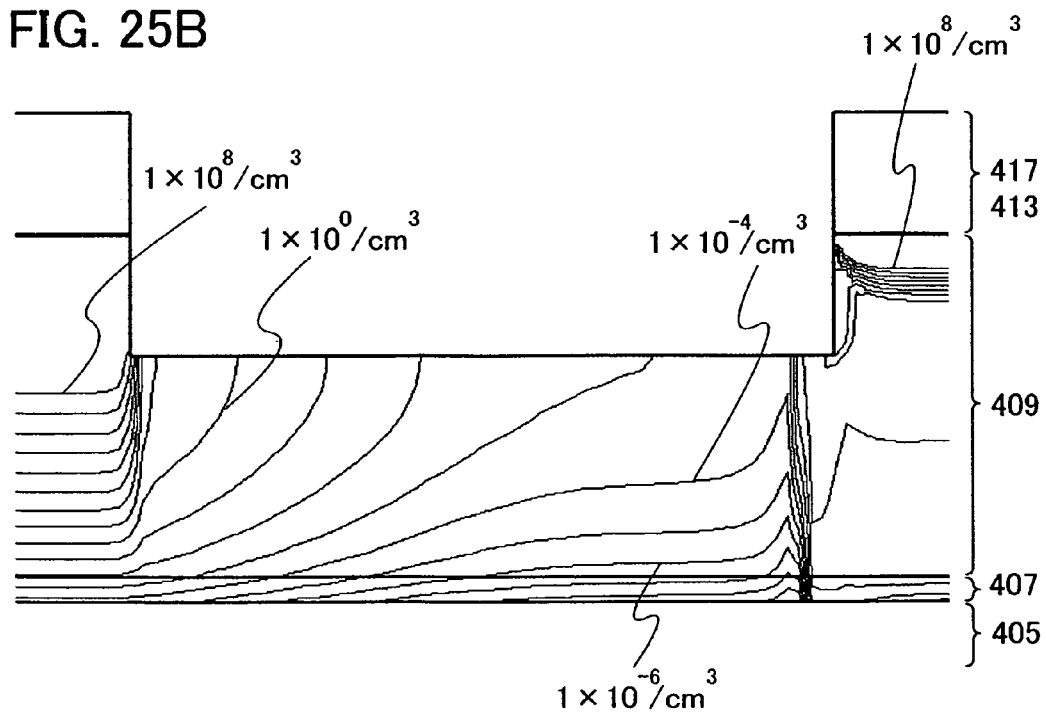

FIG. 24 shows results of DC characteristics ($V_g$-$I_d$ characteristics, $V_d$=14 V) when device simulation of the thin film transistor shown in FIG. 23 is performed with the thicknesses of the µc-Si film and the a-Si film being changed variously. FIGS. 25A and 25B each show electron concentration distribution in the thin film transistor when the µc-Si film 407 has a thickness of 10 nm and the a-Si film has a thickness of 90 nm. FIG. 25A shows results of electron concentration distribution when the thin film transistor is in an on state ($V_g$=+10 V, $V_d$=14 V), and FIG. 25B shows results of electron concentration distribution when the thin film transistor is in an off state ($V_g$=−10 V, $V_d$=14 V).

It can be seen from FIG. 24 that, as the thickness of the a-Si film is increased, the off current is decreased. In addition, when the thickness of the a-Si film is set to be 50 nm or more, the drain current when $V_g$ is −20 V can be made to be lower than $1\times10^{-13}$ A.

It can also be seen that, as the thickness of the μc-Si film is increased, the on current is increased. In addition, when the thickness of the μc-Si film is set to be 10 nm or more, the drain current when $V_g$ is 20 V can be made to be $1\times10^{-5}$ A or more.

It can be seen from FIG. 25A that, in the on state, the μc-Si film has a higher electron density than the a-Si film. That is, the μc-Si film with high electric conductivity has a high electron density; thus, it can be seen that, in the on state, electrons are likely to flow and the drain current is increased.

It can be seen from FIG. 25B that, in the off state, the a-Si film has a higher electron density than the μc-Si film. That is, the a-Si film with low electric conductivity has a high electron density; thus, it can be seen that, in the off state, electrons are unlikely to flow and the drain current is equivalent to that of a thin film transistor in which an a-Si film is used as a channel formation region.

It can be seen from the above description that a thin film transistor as shown in FIG. 23, in which a μc-Si film is formed over a gate insulating film, an a-Si film is formed over the μc-Si film, and source and drain regions are formed over the a-Si film, can be made to have a lower off current and a higher on current.

This application is based on Japanese Patent Applications serial nos. 2007-173539 and 2007-185057 filed with Japan Patent Office on Jun. 29, 2007 and Jul. 13, 2007, respectively, the entire contents of which are hereby incorporated by reference.

What is claimed is:

1. A light-emitting device comprising a thin film transistor comprising:
   a gate electrode;
   a gate insulating film over the gate electrode;
   a microcrystalline semiconductor film over the gate insulating film, the microcrystalline semiconductor film including a channel formation region;
   a buffer layer over and in direct contact with the microcrystalline semiconductor film, the buffer layer comprising an amorphous semiconductor;
   source and drain regions over the buffer layer;
   source and drain electrodes over the source and drain regions; and
   an insulating film over the source and drain electrodes, and the source and drain regions,
   wherein entirety of one of the source and drain electrodes is over and in direct contact with one of the source and drain regions,
   wherein a part of an upper surface of the source and drain regions is in direct contact with the source and drain electrodes,
   wherein the other part of the upper surface of the source and drain regions is not in direct contact with the source and drain electrodes,
   wherein the other part of the upper surface of the source and drain regions and a part of the buffer layer are in direct contact with the insulating film,
   wherein at least a part of an upper surface of the one of the source and drain electrodes is in direct contact with the insulating film,
   wherein the buffer layer includes:
      a concave portion overlapping at least a part of the channel formation region; and
      an end portion,
   wherein the source and drain electrodes do not overlap with a horizontal upper surface of the end portion of the buffer layer,
   wherein a side of the concave portion is aligned with edge portions of the source and drain regions, and
   wherein the buffer layer contains nitrogen.

2. The light-emitting device according to claim 1, further comprising:
   a pixel electrode over the insulating film,
   wherein the pixel electrode is electrically connected to the source and drain electrodes through a contact hole in the insulating film.

3. The light-emitting device according to claim 2, wherein a light-emitting layer comprising an organic compound is over and in direct contact with the pixel electrode.

4. The light-emitting device according to claim 1,
   wherein a part of the microcrystalline semiconductor film overlaps the source and drain regions with the buffer layer interposed therebetween,
   wherein the microcrystalline semiconductor film includes an impurity element which imparts p-type conductivity, and
   wherein the source and drain regions include an impurity element which imparts n-type conductivity.

5. The light-emitting device according to claim 1, wherein the amorphous semiconductor comprises at least any one of hydrogen, and halogen.

6. The light-emitting device according to claim 1, wherein a concentration of the nitrogen is $5\times10^{18}$ cm$^{-3}$ or less.

7. The light-emitting device according to claim 1, further comprising a wiring being over and electrically connected to the other of the source and drain electrodes.

8. The light-emitting device according to claim 1,
   wherein the microcrystalline semiconductor film contains silicon, and
   wherein the buffer layer contains silicon.

9. The light-emitting device according to claim 1,
   wherein the microcrystalline semiconductor film has crystal grains with a diameter of 0.5 nm to 20 nm inclusive in a non-single-crystal semiconductor,
   wherein a thickness of the microcrystalline semiconductor film is 1 nm to 100 nm inclusive, and
   wherein a thickness of the concave portion is 1 nm to 100 nm inclusive.

10. A light-emitting device comprising a thin film transistor comprising:
   a gate electrode;
   a gate insulating film over the gate electrode;
   a microcrystalline semiconductor film over the gate insulating film, the microcrystalline semiconductor film including a channel formation region;
   a buffer layer over and in direct contact with the microcrystalline semiconductor film, the buffer layer comprising an amorphous semiconductor;
   source and drain regions over the buffer layer;
   source and drain electrodes over the source and drain regions; and
   an insulating film over the source and drain electrodes, and the source and drain regions,
   wherein entirety of one of the source and drain electrodes is over and in direct contact with one of the source and drain regions,
   wherein a part of an upper surface of the source and drain regions and a part of the buffer layer are in direct contact with the insulating film, wherein at least a part of an upper surface of the one of the source and drain electrodes is in direct contact with the insulating film,
wherein the buffer layer includes:
   a concave portion overlapping at least a part of the channel formation region; and
   an end portion,
wherein the source and drain electrodes do not overlap with a horizontal upper surface of the end portion of the buffer layer,
wherein a side of the concave portion is aligned with edge portions of the source and drain regions, and
wherein the buffer layer contains nitrogen.

11. The light-emitting device according to claim 10, further comprising:
a pixel electrode over the insulating film,
wherein the pixel electrode is electrically connected to the source and drain electrodes through a contact hole in the insulating film.

12. The light-emitting device according to claim 11, wherein a light-emitting layer comprising an organic compound is over and in direct contact with the pixel electrode.

13. The light-emitting device according to claim 10,
wherein a part of the microcrystalline semiconductor film overlaps the source and drain regions with the buffer layer interposed therebetween,
wherein the microcrystalline semiconductor film includes an impurity element which imparts p-type conductivity, and
wherein the source and drain regions include an impurity element which imparts n-type conductivity.

14. The light-emitting device according to claim 10, wherein the amorphous semiconductor comprises at least any one of hydrogen, and halogen.

15. The light-emitting device according to claim 10, wherein a concentration of the nitrogen is $5 \times 10^{18}$ cm$^{-3}$ or less.

16. The light-emitting device according to claim 10, further comprising a wiring being over and electrically connected to the other of the source and drain electrodes.

17. The light-emitting device according to claim 10,
wherein the microcrystalline semiconductor film contains silicon, and
wherein the buffer layer contains silicon.

18. The light-emitting device according to claim 10,
wherein the microcrystalline semiconductor film has crystal grains with a diameter of 0.5 nm to 20 nm inclusive in a non-single-crystal semiconductor,
wherein a thickness of the microcrystalline semiconductor film is 1 nm to 100 nm inclusive, and
wherein a thickness of the concave portion is 1 nm to 100 nm inclusive.

19. A light-emitting device comprising a thin film transistor comprising:
a gate electrode;
a gate insulating film over the gate electrode;
a microcrystalline semiconductor film over the gate insulating film, the microcrystalline semiconductor film including a channel formation region;
a buffer layer over and in direct contact with the microcrystalline semiconductor film, the buffer layer comprising an amorphous semiconductor;
source and drain regions over the buffer layer;
source and drain electrodes over the source and drain regions; and
an insulating film over the source and drain electrodes, and the source and drain regions,
wherein entirety of one of the source and drain electrodes is over and in direct contact with one of the source and drain regions,
wherein a part of an upper surface of the source and drain regions and a part of the buffer layer are in direct contact with the insulating film,
wherein at least a part of an upper surface of the one of the source and drain electrodes is in direct contact with the insulating film,
wherein the source and drain regions extend beyond edges of the source and drain electrodes,
wherein a distance between edges of the source and drain regions facing each other is shorter than a distance between the edges of the source and drain electrodes facing each other,
wherein the buffer layer includes:
   a concave portion overlapping at least a part of the channel formation region; and
   an end portion,
wherein the source and drain electrodes do not overlap with a horizontal upper surface of the end portion of the buffer layer,
wherein a side of the concave portion is aligned with edge portions of the source and drain regions, and
wherein the buffer layer contains nitrogen.

20. The light-emitting device according to claim 19, further comprising:
a pixel electrode over the insulating film,
wherein the pixel electrode is electrically connected to the source and drain electrodes through a contact hole in the insulating film.

21. The light-emitting device according to claim 20, wherein a light-emitting layer comprising an organic compound is over and in direct contact with the pixel electrode.

22. The light-emitting device according to claim 19,
wherein a part of the microcrystalline semiconductor film overlaps the source and drain regions with the buffer layer interposed therebetween,
wherein the microcrystalline semiconductor film includes an impurity element which imparts p-type conductivity, and
wherein the source and drain regions include an impurity element which imparts n-type conductivity.

23. The light-emitting device according to claim 19, wherein the amorphous semiconductor comprises at least any one of hydrogen, and halogen.

24. The light-emitting device according to claim 19, wherein a concentration of the nitrogen is $5 \times 10^{18}$ cm$^{-3}$ or less.

25. The light-emitting device according to claim 19, further comprising a wiring being over and electrically connected to the other of the source and drain electrodes.

26. The light-emitting device according to claim 19,
wherein the microcrystalline semiconductor film contains silicon, and
wherein the buffer layer contains silicon.

27. The light-emitting device according to claim 19,
wherein the microcrystalline semiconductor film has crystal grains with a diameter of 0.5 nm to 20 nm inclusive in a non-single-crystal semiconductor,
wherein a thickness of the microcrystalline semiconductor film is 1 nm to 100 nm inclusive, and
wherein a thickness of the concave portion is 1 nm to 100 nm inclusive.

* * * * *